United States Patent
Watanabe et al.

(10) Patent No.: US 8,138,423 B2
(45) Date of Patent: Mar. 20, 2012

(54) PRINTED WIRING BOARD AND METHOD FOR MANUFACTURING PRINTED WIRING BOARD

(75) Inventors: Mitsuhiro Watanabe, Yokosuka (JP); Kinji Saijo, Kudamatsu (JP); Shinji Ohsawa, Kudamatsu (JP); Kazuo Yoshida, Kudamatsu (JP); Koji Nanbu, Kudamatsu (JP)

(73) Assignee: Toyo Kohan Co., Ltd., Tokyo (JP)

( * ) Notice: Subject to any disclaimer, the term of this patent is extended or adjusted under 35 U.S.C. 154(b) by 1115 days.

(21) Appl. No.: 11/719,803

(22) PCT Filed: Nov. 18, 2005

(86) PCT No.: PCT/JP2005/021218
§ 371 (c)(1),
(2), (4) Date: Jul. 21, 2007

(87) PCT Pub. No.: WO2006/054684
PCT Pub. Date: May 26, 2006

(65) Prior Publication Data
US 2009/0145630 A1    Jun. 11, 2009

(30) Foreign Application Priority Data
Nov. 19, 2004    (JP) ................... 2004-336480

(51) Int. Cl.
*H05K 1/03* (2006.01)
(52) U.S. Cl. .................. 174/255; 174/252; 174/262
(58) Field of Classification Search .............. 174/255, 174/252, 262–266; 361/792–795
See application file for complete search history.

(56) References Cited

U.S. PATENT DOCUMENTS

| | | | |
|---|---|---|---|
| 7,186,920 B2* | 3/2007 | Takeuchi | 174/254 |
| 7,726,016 B2* | 6/2010 | Ohsumi et al. | 29/852 |
| 2002/0053722 A1* | 5/2002 | Sakamoto et al. | 257/678 |

FOREIGN PATENT DOCUMENTS

| | | |
|---|---|---|
| JP | 119340/1983 | 2/1985 |
| JP | 62-185396 A | 8/1987 |
| JP | 05-299816 A | 11/1993 |
| JP | 7007272 | 1/1995 |
| JP | 7111386 | 4/1995 |
| JP | 09-199816 A | 7/1997 |
| JP | 2000286530 | 10/2000 |
| JP | 2003-46247 A | 2/2003 |
| WO | WO 02/05604 A1 | 1/2002 |

* cited by examiner

*Primary Examiner* — Jeremy Norris
(74) *Attorney, Agent, or Firm* — Rothwell, Figg, Ernst & Manbeck, P.C.

(57) ABSTRACT

A printed wiring board and a method for manufacturing the printed wiring board in which widths of a first and a second circuit are close to each other and substantial miniaturization can be achieved. In order to achieve this object, a first circuit and a second circuit having different thicknesses are formed in the same reference plane by etching a metal-clad laminate including a conductive layer and an insulating layer. The thicker of the circuits has a clad-like configuration in which three layers, a first copper layer/a different kind of metal layer/a second copper layer, are sequentially stacked. The manufacture of the printed wiring board includes a clad composite material in which three layers of a first copper layer/a different kind of metal layer/a second copper layer are sequentially stacked as a start material, and selective etching characteristics between the layers are utilized.

10 Claims, 28 Drawing Sheets

(a)

(b)

(c)

(d)

(e)

(f)

(g)

(h)

(a)

(b)

(c)

(d)

(e)

(f)

(g)

(h)

(a)

(b)

(c)

(d)

(a)

(b)

(c)

(d)

(e)

(a)

(b)

(c)

(d)

(e)

(f)

(g)

(h)

(a)

(b)

(c)

(d)

(e)

(f)

(g)

(h)

(i)

(a)

(b)

(c)

(d)

(e)

(f)

(g)

(h)

(a)

(b)

(c)

(d)

(e)

(i)

(a)

(b)

(c)

(d)

(e)

(f)

PRINTED WIRING BOARD AND METHOD FOR MANUFACTURING PRINTED WIRING BOARD

CROSS REFERENCE TO RELATED APPLICATION

This application is a 35 USC §371 National Phase Entry Application from PCT/JP2005/021218, filed Nov. 18, 2005, and designating the United States

TECHNICAL FIELD

The present invention relates to a printed wiring board and a method for manufacturing the printed wiring board. In particular, the present invention relates to a printed wiring board and a method for manufacturing the printed wiring board in which a first circuit and a second circuit having different thicknesses coexist in a same reference plane.

BACKGROUND ART

Conventionally, printed wiring boards have been used in consumer use electronic products such as home use electronic products, or industrial use electronic equipments such as computer or the like, by providing a conductor layer on a surface of an insulating base material, followed by forming the conductor layer into a circuit shape by etching or the like, and mounting devices such as IC chips or capacitors on the circuit.

In the printed wiring board, on a surface of an insulating base material, a copper foil is bonded as disclosed in Patent Document 1 (Japanese Patent Laid-Open No. 07-007272) or a copper layer is formed by additive method as disclosed in Patent Document 2 (Japanese Patent Laid-Open No. 07-111386) or by employing sputtering deposition as disclosed in Patent Document 3 (Japanese Patent Laid-Open No. 2000-286530). After manufacturing a copper-clad laminate, an etching resist layer is provided on the formed copper layer, then an etching pattern is exposed and developed, and then copper etching is performed to form the circuit shape.

For the circuits manufactured in these ways, fine pitch has been developed in accordance with requirement of miniaturization for the circuits. However, based on the purpose of using the circuits, the circuits can be broadly categorized as a signal transmission circuit having narrow width for controlling drive systems and a circuit for obtaining power supply or GND (hereinafter simply referred to as a "power supply circuit or the like", meaning that power supply circuit and GND circuit are included). The signal transmission circuit is a circuit for transmitting signal current for controlling ON/OFF operation, calculating speed, or the like, in which large current does not flow in general. On the other hand, the power supply circuit or the like serves to supply current for power supply to chip devices, capacitors, or the like mounted on the printed wiring board, or serves as GND. Therefore, the power supply circuit or the like is a circuit in which substantially large current flows, in comparison to the above described signal current.

In addition, electrical resistance $R(\Omega)$ of the circuit is calculated by a calculation formula of $R(\Omega)=\rho \times L/S$ where $\rho$ is specific resistance of the material ($\Omega \times cm$), L is length (cm), and S is cross-sectional area ($cm^2$). Further, power consumption amount W (Watt) is calculated by a calculation formula of $W(Watt)=I^2R$ where I(A) is current. As can be seen from these formulas, as the area reduces, resistance value of the circuit increases. Further, as resistance value increases, power consumption amount increases and consequently heat generation amount in operation increases. Therefore, a design is employed in which circuit width of the power supply circuit or the like is increased in comparison to circuit width of the signal transmission circuit, in order to reduce heat generation amount from the printed wiring board in operation.

On the other hand, in recent years, reduction of weight, size and thickness has been continuously required on the devices such as electronic equipments incorporating the printed wiring board. Accordingly, of course, reduction of size and the thickness of the printed wiring board has been also required, corresponding to the limited accommodating space of the devices.

[Patent Document 1] Japanese Patent Laid-Open No. H07-007272

[Patent Document 2] Japanese Patent Laid-Open No. H07-111386.

[Patent Document 3] Japanese Patent Laid-Open No. 2000-286530

However, in the conventional method for manufacturing the printed wiring board, the design concept for the signal transmission circuit and for the power supply circuit or the like can not be changed. Thus, if it is attempted that the signal transmission circuit and the power supply circuit or the like are together formed in a same reference plane, it is inevitable to form the power supply circuit or the like having larger width than that of the signal transmission circuit, which also inhibits miniaturization of the printed wiring board.

Further, for example, in the case of a substrate formed under assumption that large current flows therein, the power supply circuit or the like is formed by etching a layer formed from thick copper, while the signal transmission circuit is formed with copper thickness which matches circuit characteristics. Therefore, it is required to separately construct the layers, which also inhibits miniaturization of the printed wiring board.

Indeed, it is considerable to reduce supply voltage or use a material having superior electrical conductivity than copper which forms the circuit, when it is attempted that width of the power supply circuit or the like is reduced without increasing heat generation amount from the printed wiring board. However, these approaches are not practical.

In view of the above described problems, a printed wiring board and a method for manufacturing the printed wiring board are required in which circuit widths of the signal transmission circuit and the power supply circuit or the like, which conventionally require to have greatly different circuit widths, are close to each other as much as possible and substantial miniaturization can be achieved.

DISCLOSURE OF THE INVENTION

Thus, as a result of close study, the present inventors arrived at an idea that height of a circuit is increased, instead of increasing circuit widths, in order to assure cross-sectional area of a circuit used as a power supply circuit or the like of the printed wiring board. In the following description, the "printed wiring board" and the "method for manufacturing the printed wiring board" according to the present invention will be separately described.

<Printed Wiring Board According to the Present Invention>

A basic configuration of a printed wiring board according to the present invention can be represented as "a printed wiring board obtained by etching a metal-clad laminate including a conductive layer and an insulating layer, which is characterized in that a first circuit and a second circuit having different thicknesses formed in a same reference plane coexist". FIG. 1 exemplarily shows a part of the printed wiring board as a cross-sectional schematic view. By employing such a structure, circuit widths of the power supply circuit or the like and the signal transmission circuit are close to each other by adjusting height of the circuits, without increasing width of the power supply circuit or the like. As a result, miniaturization of the printed wiring board can be achieved.

Now, the "first circuit" and the "second circuit" will be described. The terms "first circuit" and "second circuit" referred to in this specification are used for the sake of convenience, in order to represent that thicknesses (cross-sectional areas) of the circuits are different. For example, the first circuit with larger cross-sectional area than the cross-sectional area of the second circuit can be used as the power supply circuit or the like, while the second circuit having smaller cross-sectional area can be used as the signal transmission circuit. The first circuit and the second circuit, which are distinguished in the present invention, simply mean a thicker circuit (circuit having large cross-sectional area) and a thinner circuit (circuit having small cross-sectional area) in respect of circuit thicknesses, and they do not mean extent of circuit widths. Also, they do not mean that all of the first circuits have the same circuit width and all of the second circuits have the same circuit width.

Further, the "same reference plane" means a planar surface or interface of an insulating layer which is formed by a base material such as glass-epoxy pre-preg or glass-polyimide pre-preg used in manufacturing the printed wiring board. Furthermore, "the first circuit and the second circuit formed in the same reference plane . . . " means that the first and second circuits are placed to contact to the same reference plane when observing the printed wiring board from its cross section.

Therefore, there are two cases: (I) both of the first circuit and the second circuit are disposed on one side of the same reference plane and (II) the first circuit is disposed on one side of the same reference plane and the second circuit is disposed on the opposite side. In the printed wiring board according to the present invention, in the latter case (II), one of the first circuit and the second circuit is disposed to project from the printed wiring board surface, and the other circuit is buried in the printed wiring board surface. If one circuit is disposed to project from the printed wiring board surface and the other circuit is buried in the insulating layer of the printed wiring board surface in this way, the projecting circuit is made to be thick as in FIG. 1 (1c) to use as the power supply circuit or the like, so that the circuit has a structure similar to a heat sink and thus heat spreading effect is enhanced. In addition, the signal transmission circuit, which is easily damaged by external force because the circuit is thin, is buried in the insulating layer, so that unexpected open circuit or the like can be prevented.

Further, it is preferable that assuming that the thickness of a thicker circuit of the first circuit and the second circuit is $T_1$ µm, thickness $T_2$ of the other circuit is $T_1/100$ to $T_1$ (µm). Specifically, if thickness of the thicker circuit is 500 µm, the thinner circuit has thickness in a range of 5 µm to 500 µm. The thicknesses of the first circuit and the second circuit are appropriately optimally designed depending on supply current amount and there is no particular limitation on them. Therefore, the thickness of one of the circuits has a certain range in this description. In the present invention, as long as thicknesses of the first circuit and the second circuit are different, it is not particularly significant how much difference the thicknesses have. However, as can be understood from the manufacturing method according to the present invention described below, in manufacturing the printed wiring board according to the present invention, it is planed to use a clad composite material having a three-layer structure of a first copper layer/a different kind of metal layer/a second copper layer. Therefore, difference of circuit thicknesses as described above is set in the consideration that the clad composite material can be industrially produced.

Further, the printed wiring board is which is characterized in that the thicker circuit of the first circuit or the second circuit has a clad-like configuration in which three layers of a first copper layer/a different kind of metal layer/a second copper layer are sequentially stacked and nickel, tin, aluminum, titanium, or their alloy is used for the different kind of metal layer. As apparent from the manufacturing method described below, the printed wiring board according to the present invention is a clad composite material in which three layers of a first copper layer/a different kind of metal layer/a second copper layer are sequentially stacked and nickel, tin, aluminum, titanium, or their alloy is used for the different kind of metal layer, so that efficient production can be achieved. Therefore, as long as the manufacturing method described below is employed, it can be said that one of the circuit cross sections is inevitably clad-like, and this can be a large characteristic of the printed wiring board according to the present invention. A metal component used for the different kind of metal layer can be selectively etched against to copper. In other words, without dissolving copper, only the different kind of metal (nickel, tin, aluminum, titanium, and their alloy) can be selectively dissolved away, and an etching solution used in this process is referred to as a "different kind of metal selective etching solution". In contrast, it is possible to dissolve only copper without dissolving the different kind of metal, and an etching solution in this process is referred to as a "copper selective etching solution". They will be described in examples described below.

Further, for the thicker circuit of the first circuit and the second circuit, it is preferable to use a clad composite material in which three layers of a first copper layer/a different kind of metal layer/a second copper layer are sequentially stacked and aluminum or aluminum alloy (hereinafter simply referred to as a "aluminum base component") having the thickness of 50% to 80% of the total thickness of the clad composite material is used for the different kind of metal layer. In this way, by increasing the thickness of the aluminum base component which is a metal lighter than copper as in FIG. 1 (1d), weight reduction of the printed wiring board can be achieved. Therefore, weight reduction may be accomplished only by replacing a part of the copper layer by the aluminum base component. However, in order to achieve substantial weight reduction of the printed wiring board, it is required to replace at least 50% or more of the total thickness of the clad composite material by the aluminum base component. On the other hand, if it is considered to replace at least 80% or more of the total thickness of the clad composite material by the aluminum base component, the thickness of the copper layer becomes insufficient due to the thickness in which the aluminum base component occupies, so that increase in resistance is extreme when the power supply circuit or the like is manufactured. As a result, the meaning of the product in which the power supply circuit or the like and the signal transmission circuit coexist in the same reference plane is lost.

<Method for Manufacturing Printed Wiring Board According to the Present Invention>

In methods for manufacturing a printed wiring board according to the present invention described below, when circuits having different thicknesses are formed in a same reference plane, conventional lamination technique of printed wiring boards, etching methods and apparatuses can be used and no special facility investment is required. Thus, efficient production of the printed wiring board according to the present invention can be achieved. Further, manufacturing methods which can be employed in the present invention can be divided into several methods, depending on which of so-called single-sided printed wiring board, double-sided printed wiring board, and multilayer printed wiring board having three layers or more is manufactured.

Method (1) for manufacturing single-sided or double-sided printed wiring board: a method for manufacturing a so-called single-sided printed wiring board and a method for manufacturing a so-called double-sided printed wiring board have no difference in the basic processes, only having a difference whether a metal-clad laminate having a two-layer structure of a metal layer/an insulating layer is used or a metal-clad laminate having a three-layer structure of a first metal layer/an insulating layer/a second metal layer is used (here, it is assumed that the same material is used for the first metal layer and the second metal layer. However, it is not necessary that thicknesses of the first metal layer and the second metal layer are same).

Therefore, a method employed in this specification is a method for manufacturing a single-sided or a double-sided printed wiring board in which a first circuit and a second circuit having different thicknesses coexist in a same reference plane, characterized by comprising the following step 1-a to step 1-e.

Step 1-a: a laminating step wherein a clad composite material in which three layers of a first copper layer/a different kind of metal layer/a second copper layer are sequentially stacked has the different kind of metal layer constituted from a metal component which can be selectively etched against to copper, and the clad composite material is bonded to a base material constituting an insulating layer to form a metal-clad laminate;

Step 1-b: a first copper etching step wherein an etching resist layer is formed on the first copper layer located on an outer layer of the metal-clad laminate, and a circuit pattern for etching is exposed and developed to etch the first copper layer located on the outer layer into a desired circuit pattern with a copper selective etching solution, and then etching resist releasing is performed to expose the different kind of metal layer in parts where unnecessary first copper layer is removed;

Step 1-c: a first different kind of metal etching step wherein after the first copper etching step is finished, the different kind of metal layer exposed between circuits temporarily formed on the outer layer is etched away with a different kind of metal selective etching solution to form a first circuit shape;

step 1-d: a second copper etching step wherein after the first different kind of metal etching step is finished, the etching resist layer is again formed only on area which is to be the first circuit, and etching is performed with the copper selective etching solution to etch away area of the first copper layer where no etching resist layer is present, so that shape of the first circuit is finished and the second circuit still having the different kind of metal layer is formed, and then etching resist releasing is performed to expose the different kind of metal layer of the second circuit; and further, step 1-e: a second different kind of metal layer etching step wherein only the different kind of metal layer located on a surface of the second circuit is removed with a different kind of metal selective etching solution to form final second circuit shape, so that the printed wiring board is obtained.

If it is intended to obtain a double-sided printed wiring board by adhering the clad composite materials to both surfaces of the insulating layer, it is possible that the forming step of a pass for interlayer connection is provided between the step 1-a and the step 1-b.

Further, it is also preferable that the clad composite material in which an bonding surface to the base material is subjected to bond enhancing treatment for improving adhesion to the base material is used.

Method (2) for manufacturing single-sided or double-sided printed wiring board: further, a method for manufacturing a single-sided or double-sided printed wiring board may be a method for manufacturing a single-sided or double-sided printed wiring board in which a first circuit and a second circuit having different thicknesses coexist in a same reference plane and one circuit is buried in an insulating layer, characterized by comprising the following step 2-a to step 2-d.

Step 2-a: a clad composite material etching step wherein a clad composite material in which three layers of a first copper layer/a different kind of metal layer/a second copper layer are sequentially stacked has the different kind of metal layer constituted from a metal component which can be selectively etched against to copper, and using the clad composite material, only the second copper layer is etched with a copper selective etching solution to form a circuit pattern for etching on one surface, so that a clad composite material with circuit pattern is obtained;

Step 2-b: a laminating step wherein an etched circuit pattern surface of the clad composite material with circuit pattern obtained in the clad composite material etching step is placed onto a base material surface and bonded to the base material surface to form a metal-clad laminate in which the etched pattern is buried in the insulating layer;

Step 2-c: a first copper etching step wherein an etching resist layer is formed on the first copper layer on an outer layer surface of the metal-clad laminate, and a circuit pattern for etching is exposed and developed to etch the first copper layer located on the outer layer into a desired circuit pattern with a copper selective etching solution, and then etching resist releasing is performed to remove unnecessary first copper layer and expose the different kind of metal layer; and Step 2-d: a different kind of metal etching step wherein after the first copper etching step is finished, the different kind of metal layer is etched away with a different kind of metal selective etching solution to form the first circuit and the second circuit, so that the printed wiring board is obtained.

If it is intended to obtain a double-sided printed wiring board by bonding the clad composite materials to both surfaces of the insulating layer, it is possible that the forming step of a pass for interlayer connection is provided between the step 2-b and the step 2-c.

Further, it is also possible to use the clad composite material with circuit pattern in which the different kind of metal layer exposed on the etched circuit pattern surface is removed.

Further, it is also preferable to use the clad composite material with circuit pattern in which the etched circuit pattern surface is subjected to bond enhancing treatment for improving adhesion to the base material.

Method (3) for manufacturing single-sided or double-sided printed wiring board: further, a method for manufacturing a single-sided or double-sided printed wiring board in which a first circuit or a second circuit having different thicknesses coexist in a same reference plane and one circuit is buried in an insulating layer, characterized by comprising the following step 3-a to step 3-c. In terms of the manufacturing steps, this is a manufacturing method which can be performed only when a clad composite material with circuit pattern is used in which a different kind of metal layer exposed on an etched circuit pattern surface is removed.

Step 3-a: a clad composite material etching step wherein a clad composite material in which three layers of a first copper layer/a different kind of metal layer/a second copper layer are sequentially stacked has the different kind of metal layer constituted from a metal component which can be selectively etched against to copper, and using the clad composite material, only the second copper layer is etched with a copper selective etching solution to form a circuit pattern for etching on one surface, so that a clad composite material with circuit pattern is obtained in which the different kind of metal layer exposed on the etched circuit pattern surface is removed;

Step 3-b: a laminating step wherein the etched circuit pattern surface of clad composite material with circuit pattern obtained in the clad composite material etching step is placed onto a base material surface and bonded to the base material surface to form a metal-clad laminate in which the etched pattern is buried in the insulating layer; and Step 3-c: a first copper etching step wherein an etching resist layer is formed on the first copper layer located on an outer layer surface of the metal-clad laminate, and a circuit pattern for etching is exposed and developed to etch the first copper layer located on the outer layer into a desired circuit pattern with a copper selective etching solution, and then etching resist releasing is performed to simultaneously form the first circuit and the second circuit, so that the printed wiring board is obtained.

If it is intended to obtain a double-sided printed wiring board by adhering the clad composite materials to both surfaces of the insulating layer, it is possible that the forming step of a pass for interlayer connection is provided between the step 3-b and the step 3-c.

Further, it is also preferable to use the clad composite material with circuit pattern in which the etched circuit pattern surface is subjected to bond enhansing treatment for improving adhesion to the base material.

Method (1) for manufacturing double-sided printed wiring board: a method for manufacturing a double-sided printed wiring board referred to here is a method for manufacturing a double-sided printed wiring board in which a first circuit and a second circuit having different thicknesses coexist in a same reference plane on one surface side, characterized by comprising the following step 4-a to step 4-e.

Step 4-a: a laminating step wherein a clad composite material in which three layers of a first copper layer/a different kind of metal layer/a second copper layer are sequentially stacked has the different kind of metal layer constituted from a metal component which can be selectively etched against to copper, and the clad composite material and a copper foil are used and bonded to respective one surface side of a base material constituting an insulating layer to form a metal-clad laminate;

Step 4-b: a first copper etching step wherein etching resist layers are formed on the first copper layer of the clad composite material located on one surface side of the insulating layer and on the copper foil layer on the other surface side, and circuit pattern for etching is exposed and developed to etch the first copper layer and the copper foil located on the outer layers into desired circuit patterns with a copper selective etching solution, and then etching resist releasing is performed to remove unnecessary first copper layer and expose the different kind of metal layer in the clad composite material, and form the copper foil into a desired circuit pattern;

Step 4-c: a first different kind of metal etching step wherein after the first copper etching step is finished, the different kind of metal layer exposed between circuits temporarily formed on the outer layer is etched away with a different kind of metal selective etching solution to form a first circuit shape;

Step 4-d: a second copper etching step wherein after the first different kind of metal etching step is finished, the etching resist layer is again formed only on area which is to be the first circuit, and etching is performed with the copper selective etching solution to etch away area of the first copper layer where no etching resist layer is present, so that the second circuit still having the different kind of metal layer is formed, and then etching resist releasing is performed to expose the different kind of metal layer of the second circuit; and further, Step 4-e: a different kind of metal layer removing step wherein only the different kind of metal layer on a surface of the second circuit is removed with the different kind of metal selective etching solution to form final second circuit shape, so that the printed wiring board is obtained.

If it is intended to obtain the double-sided printed wiring board, it is possible that the forming step of a pass for interlayer connection is provided between the step 4-a and the step 4-b.

Further, it is also preferable that an bonding surface of the clad composite material used here to the base material is subjected to bond enhansing treatment for improving adhesion to the base material.

Method (2) for manufacturing double-sided printed wiring board: a method for manufacturing a double-sided printed wiring board referred to here is also a method for manufacturing a double-sided printed wiring board in which a first circuit and a second circuit having different thicknesses coexist in a same reference plane on one surface side, characterized by comprising the following step 5-a to step 5-d.

Step 5-a: a clad composite material etching step wherein a clad composite material in which three layers of a first copper layer/a different kind of metal layer/a second copper layer are sequentially stacked has the different kind of metal layer constituted from a metal component which can be selectively etched against to copper, and using the clad composite material, only the second copper layer is etched to form a circuit pattern for etching on one surface, so that a clad composite material with circuit pattern is obtained;

step 5-b: a laminating step wherein the clad composite material with circuit pattern and a copper foil are used to bond onto respective one surface side of a base material constituting an insulating layer to form a metal-clad laminate;

Step 5-c: a first copper etching step wherein etching resist layers are formed on the first copper layer of the clad composite material located on one surface side of the insulating layer and on the copper foil layer on the other surface side, and circuit pattern for etching is exposed and developed to etch the first copper layer and the copper foil located on the outer layers into desired circuit patterns with a copper selective etching solution, and then etching resist releasing is performed to remove unnecessary first copper layer and expose the different kind of metal layer in the clad composite material, and form the copper foil into a desired circuit pattern; and Step 5-d: a first different kind of metal etching step wherein after the first copper etching step is finished, the different kind of metal layer exposed between circuits temporarily formed on the outer layer is etched away with a different kind of metal selective etching solution to form the first circuit, the second circuit, and a copper foil circuit, so that the printed wiring board is obtained.

If it is intended to obtain the double-sided printed wiring board, it is possible that the forming step of a pass for interlayer connection is provided between the step 5-b and the step 5-c.

Further, it is also possible to use the clad composite material with circuit pattern in which the different kind of metal layer exposed on the etched circuit pattern surface is removed.

Further, it is also preferable to use the clad composite material with circuit pattern in which the etched circuit pattern surface is subjected to bond enhansing treatment for improving adhesion to the base material.

Method (1) for manufacturing multilayer printed wiring board: in a method for manufacturing a so-called multilayer printed wiring board, an inner layer core material is included in an insulating layer in the case of manufacturing a double-sided printed wiring board. Therefore, this method is a method for manufacturing a printed wiring board comprising a circuit layer in which a first circuit and a second circuit having different thicknesses coexist in a same reference plane of an insulating layer located on a surface of an inner layer core material comprising an inner layer circuit, characterized by comprising the following step 6-a to step 6-e.

step 6-a: laminating step wherein a clad composite material in which three layers of a first copper layer/a different kind of metal layer/a second copper layer are sequentially stacked has the different kind of metal layer constituted from a metal component which can be selectively etched against to copper, and the clad composite material is bonded to a surface of the inner layer core material via the insulating layer to form a multilayer metal-clad laminate;

Step 6-b: a first copper etching step wherein etching resist layers are formed on the first copper layers located on outer layers of the multilayer metal-clad laminate, and circuit pattern for etching is exposed and developed to etch the first copper layers located on the outer layers into desired circuit patterns with a copper selective etching solution, and then etching resist releasing is performed to expose the different kind of metal layer in parts where unnecessary first copper layers are removed;

Step 6-c: a first different kind of metal etching step wherein after the first copper etching step is finished, the different kind of metal layers exposed between circuits temporarily formed on the outer layers are etched away with a different kind of metal selective etching solution to form a first circuit shape;

Step 6-d: a second copper etching step wherein after the first different kind of metal etching step is finished, the etching resist layers are again formed only on area which is to be the first circuit, and etching is performed with the copper selective etching solution to etch away area of the first copper layers where no etching resist layer is present, so that the second circuit still having the different kind of metal layer is formed, and then the etching resist releasing is performed to expose the different kind of metal layer of the second circuit; and further, Step 6-e: a different kind of metal layer removing step wherein only the different kind of metal layer on a surface of the second circuit is removed with the different kind of metal selective etching solution to form final second circuit shape, so that the printed wiring board is obtained.

In addition, it is possible that the forming step of a pass for interlayer connection is provided between the step 6-a and the step 6-b in which through holes, via holes, or the like are formed for assuring electrical connection between the clad composite material and the inner layer circuit located on both surfaces of the insulating layer of the metal-clad laminate.

Further, it is also preferable that an bonding surface of the clad composite material used here to the base material is subjected to bond enhansing treatment for improving adhesion to the base material.

Method (2) for manufacturing a multilayer printed wiring board: another method for manufacturing a multilayer printed wiring board is a method for manufacturing a printed wiring board comprising a circuit layer in which a first circuit and a second circuit having different thicknesses coexist in a same reference plane of an insulating layer located on a surface of an inner layer core material comprising an inner layer circuit, characterized by comprising the following step 7-a to step 7-d.

Step 7-a: a clad composite material etching step wherein a clad composite material in which three layers of a first copper layer/a different kind of metal layer/a second copper layer are sequentially stacked has the different kind of metal layer constituted from a metal component which can be selectively etched against to copper, and using the clad composite material, only the second copper layer is etched with a copper selective etching solution to form a circuit pattern for etching on one surface, so that a clad composite material with circuit pattern is obtained;

Step 7-b: a laminating step wherein insulating layers are provided on both surfaces of the inner layer core material, and the etched circuit pattern surfaces of the clad composite material with circuit patterns obtained in the clad composite material etching step are placed onto and bonded to the base material surfaces on the both surfaces of the insulating layers, to form a multilayer metal-clad laminate in which the etched patterns are buried in the insulating layer;

Step 7-c: a first copper etching step wherein etching resist layers are formed on the first copper layers on the outer layer surfaces of the multilayer metal-clad laminate, and circuit pattern for etching is exposed and developed to etch the first copper layers located on the outer layers into desired circuit patterns with a copper selective etching solution, and then etching resist releasing is performed to remove unnecessary first copper layers; and Step 7-d: a first different kind of metal etching step wherein after first copper etching step is finished, the different kind of metal layers exposed between circuits temporarily formed on the outer layers are etched away with a different kind of metal selective etching solution to simultaneously finish the first circuit 8 and the second circuit 9, so that the multilayer printed wiring board is obtained.

In addition, it is possible that the forming step of a pass for interlayer connection is provided between the step 7-b and the step 7-c in which through holes, via holes, or the like are formed for assuring electrical connection between the clad composite material with circuit pattern and the inner layer circuit located on both surfaces of the insulating layer of the metal-clad laminate.

Further, it is also possible to use the clad composite material with circuit pattern in which the different kind of metal layer exposed on the etched circuit pattern surface is removed.

Further, it is also preferable to use the clad composite material with circuit pattern in which the etched circuit pattern surface is subjected to bond enhansing treatment for improving adhesion to the base material.

Further, it is preferable to use any one of nickel, tin, aluminum, titanium, and their alloy which can be selectively etched against to copper, for the different kind of metal layer in the clad composite material used in the manufacturing method.

Further, it is preferable to use the clad composite material having a configuration of the first copper layer/the different kind of metal layer/the second copper layer in which total thickness is 10 μm to 2000 μm and the thickness of the different kind of metal layer is 0.01 μm to 5 μm.

Further, it is also preferable to use the clad composite material having a configuration of the first copper layer/the different kind of metal layer/the second copper layer in which the total thickness of the three layers is 10 μm to 2000 μm, sum of the thickness of the first copper layer and the second copper layer is 1 μm to 1600 μm, and the different kind of metal layer has the thickness of 50% to 80% of the total thickness of the clad composite material and is constituted from a metal material which can be selectively etched against to copper. Further, by using aluminum base component lighter than copper for the different kind of metal layer, a lightweight printed wiring board can be manufactured. In particular, in the case of manufacturing a lightweight printed wiring board, it is preferable to use aluminum base component having the thickness of 50% to 80% of the total thickness of the clad composite material. Thus, if the total thickness of the clad composite material is 10 μm to 2000 μm, it is more preferable that sum of the thickness of the first copper layer and the second copper layer is 5 μm to 1600 μm.

ADVANTAGES OF THE INVENTION

In a printed wiring board according to the present invention, in the parts where sufficient circuit cross-sectional area must be assured, the thickness of the conductor can be increased for this purpose, so that substantial reduction in area of the substrate can be achieved. In addition, by forming circuits having different circuit thicknesses in a same reference plane, a printed wiring board is obtained in which the circuits having different electrical characteristics and usages are formed on a same reference plane. Further, the projecting circuit parts of the printed wiring board can perform function in the same manner as heat sinks, so as to utilize them as circuits for heat spreader or heat spreading plates.

Further, in a method for manufacturing a printed wiring board according to the present invention, a clad composite material which comprises a different kind of metal layer which can be selectively etched against to copper between two copper layers is used, so that efficient production of the printed wiring board according to the present invention can be achieved by using conventional lamination techniques of printed wiring boards, etching methods and apparatuses.

DESCRIPTION OF SYMBOLS

Figure 1:
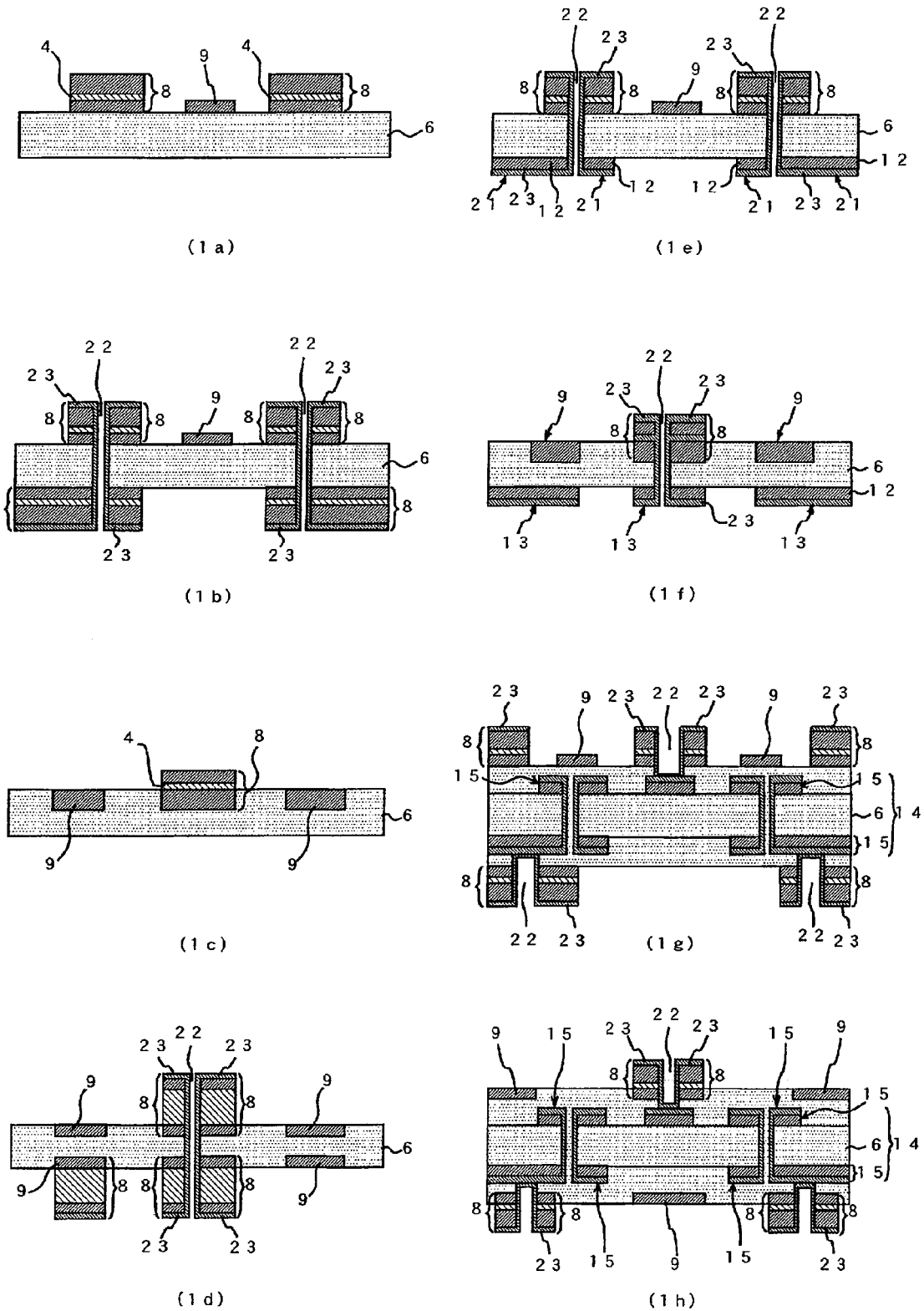
FIG. 1 is a schematic cross-sectional view showing a typical variation of a cross-sectional layer configuration of a printed wiring board according to the present invention.

1*a* to 1*h* printed wiring board
2 clad composite material 3 first copper layer
4 different kind of metal layer
5 second copper layer
6 insulating layer (base material)
7 metal-clad laminate
7' double-sided metal-clad laminate
7" multilayer metal-clad laminate
8 first circuit
9 second circuit
10 etching resist (layer)
11 clad composite material with circuit pattern
12 copper foil
13 copper foil circuit
14 inner layer core material
15 inner layer circuit
21 temporary circuit
22 through hole (or via hole)
23 plating layer

BEST MODE FOR CARRYING OUT THE INVENTION

Now, manufacturing process steps of a printed wiring board according to the present invention will be described. In these manufacturings, it is common that a clad composite material having a layer configuration of a first copper layer/a different kind of metal layer/a second copper layer is used.
<Manufacturing Process Step (1) of Single-Sided or Double-Sided Printed Wiring Board>

Figure 2:
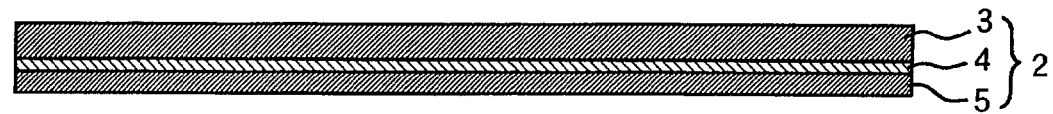
FIG. 2 is a flow diagram showing process steps for manufacturing the printed wiring board according to the present invention.
Figure 2:
Figure 2:
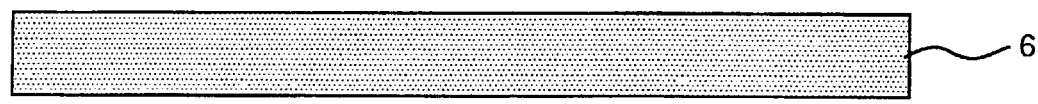
Figure 2:
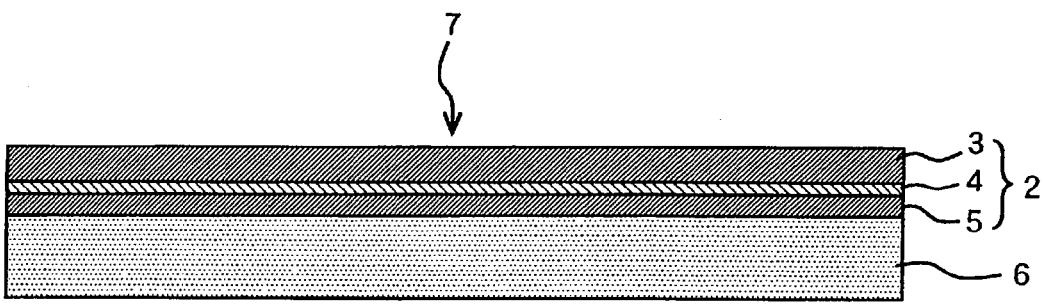
Figure 2:
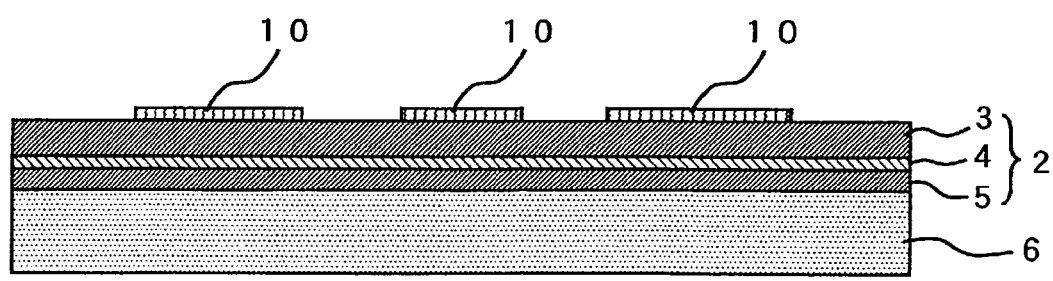
Figure 3:
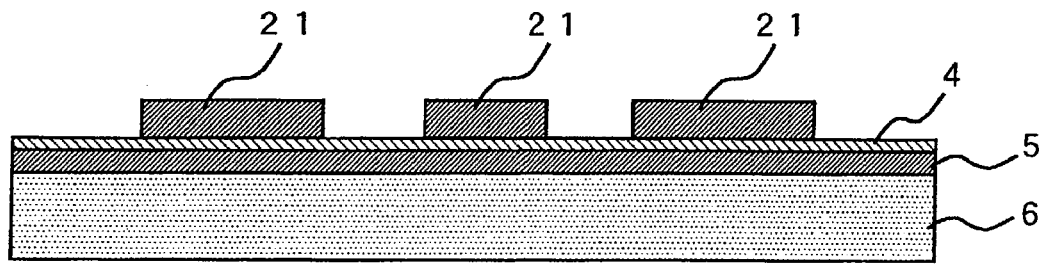
FIG. 3 is a flow diagram showing process steps for manufacturing the printed wiring board according to the present invention.
Figure 3:
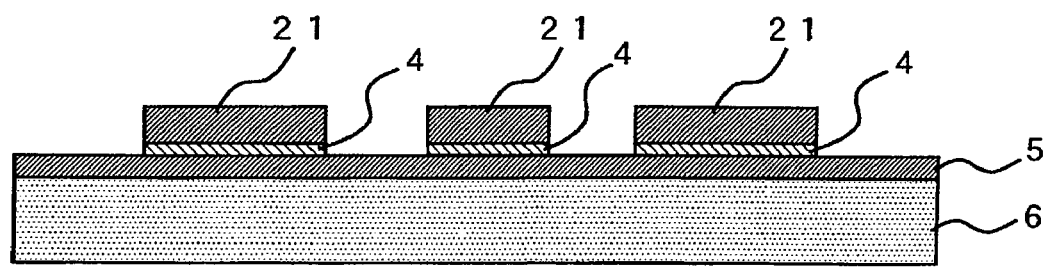
Figure 3:
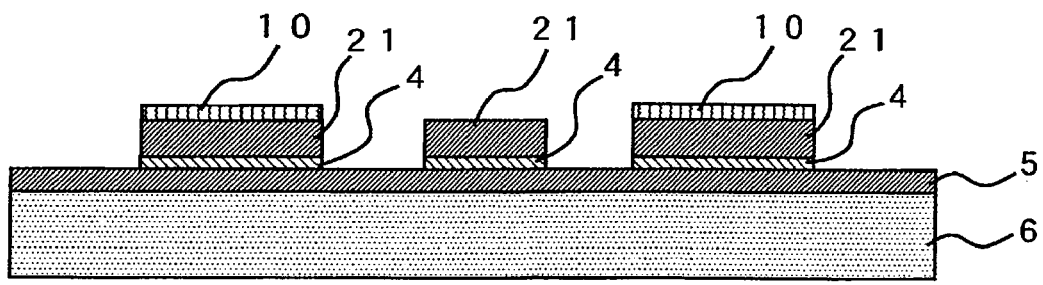
Figure 4:
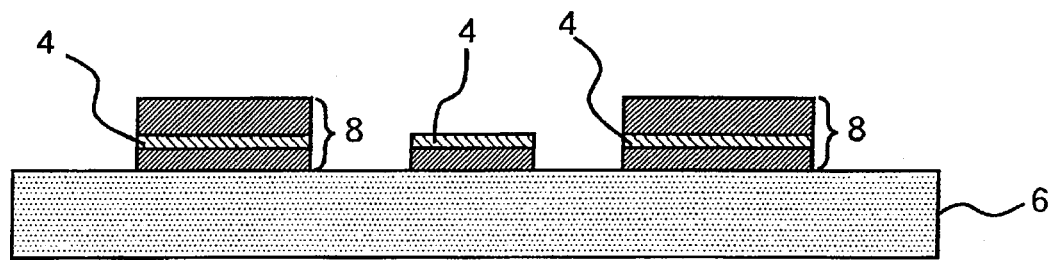
FIG. 4 is a flow diagram showing process steps for manufacturing the printed wiring board according to the present invention.
Figure 4:
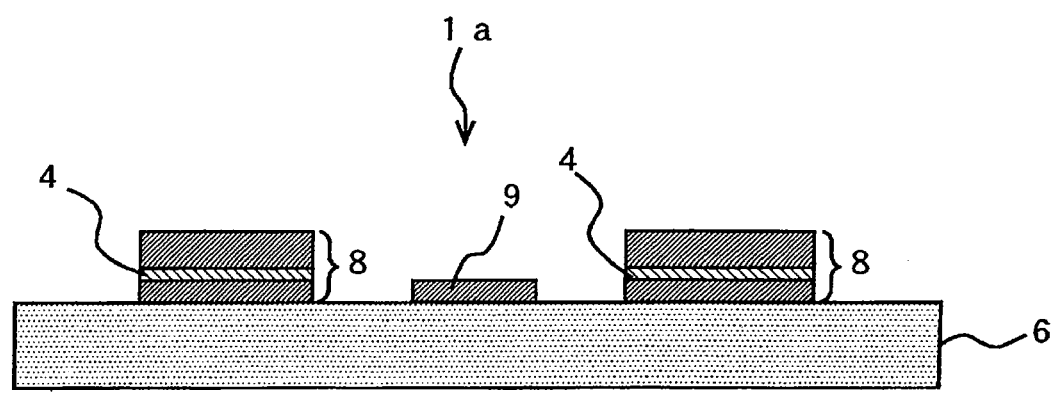
Figure 5:
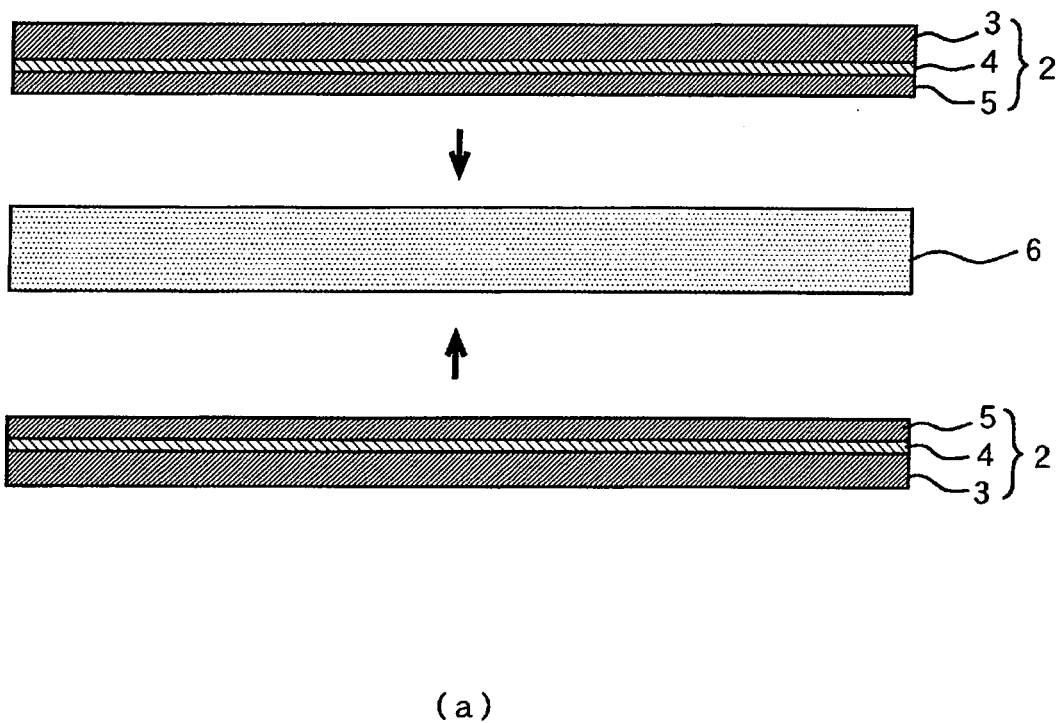
FIG. 5 is a flow diagram showing process steps for manufacturing the printed wiring board according to the present invention.
Figure 5:
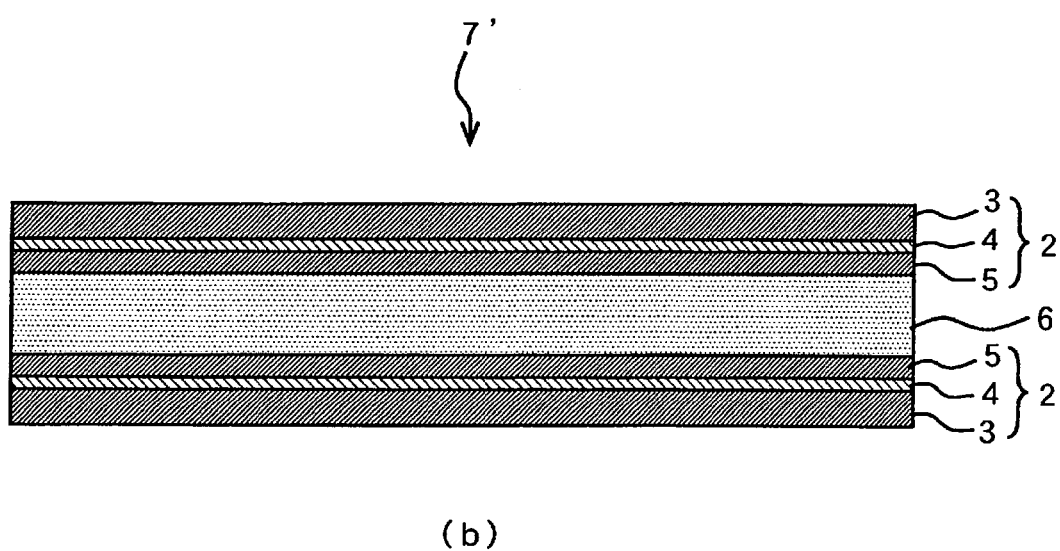
Figure 6:
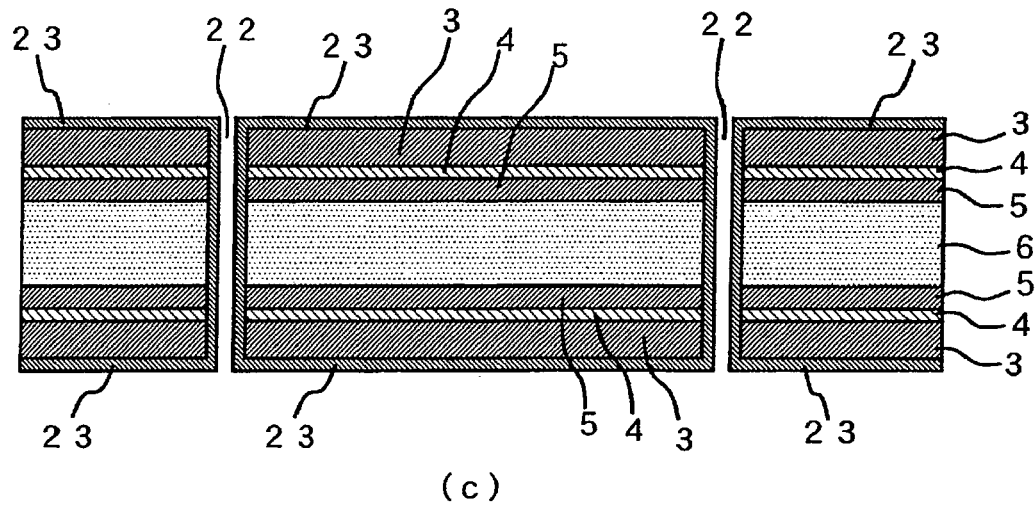
FIG. 6 is a flow diagram showing process steps for manufacturing the printed wiring board according to the present invention.
Figure 6:
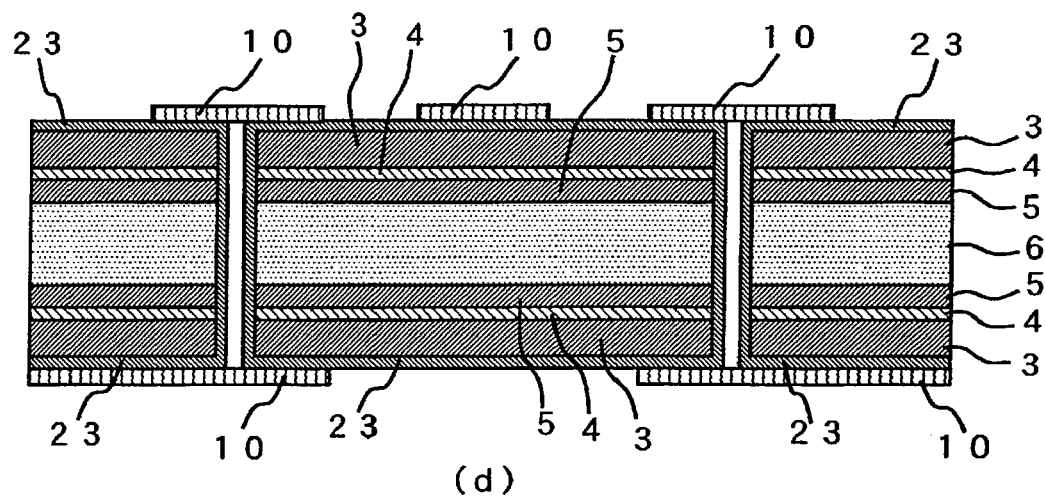
Figure 6:
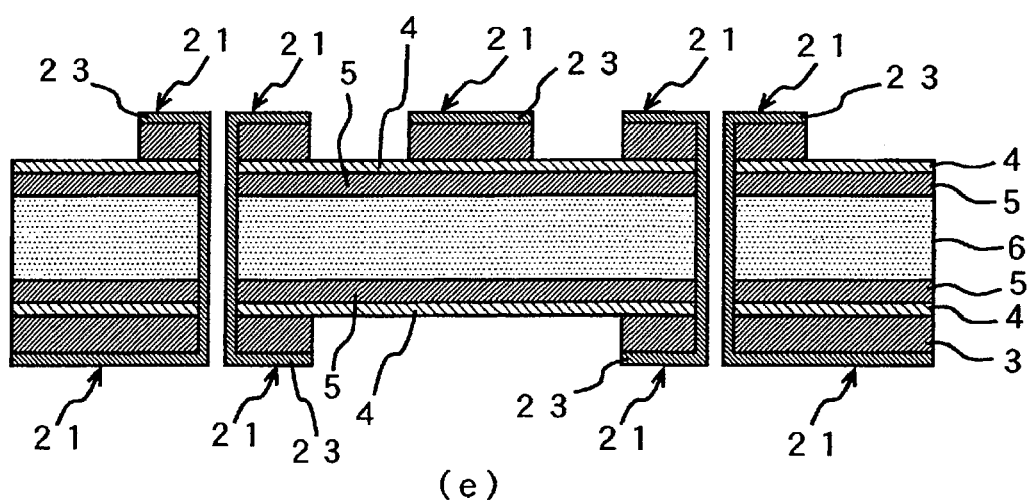
Figure 7:
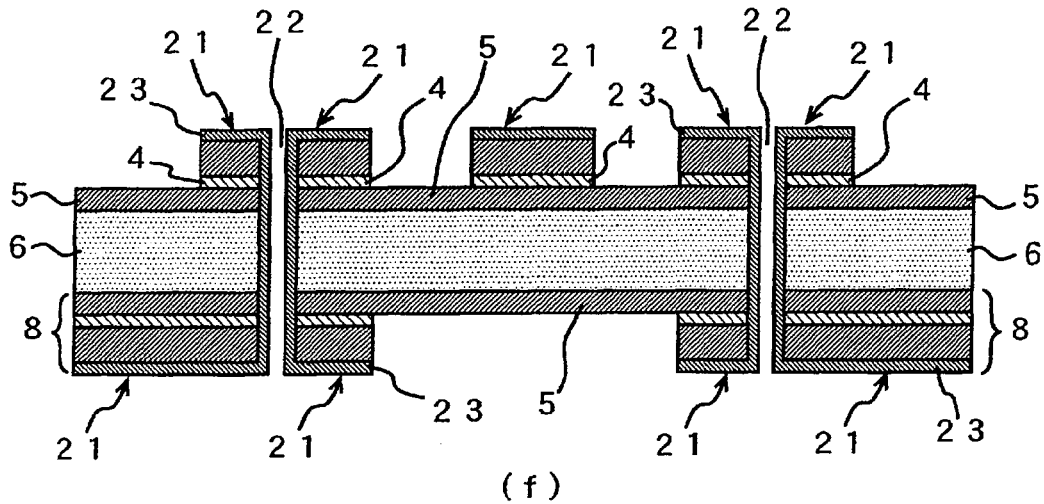
FIG. 7 is a flow diagram showing process steps for manufacturing the printed wiring board according to the present invention.
Figure 7:
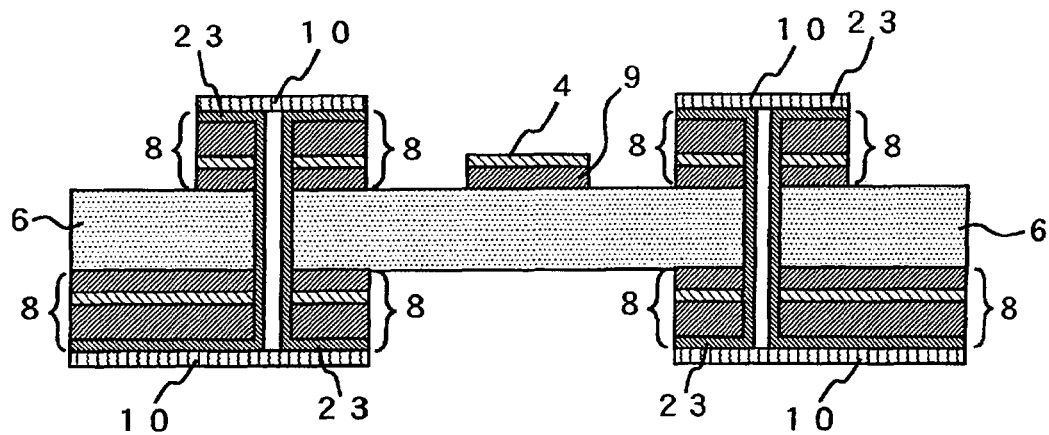
Figure 7:
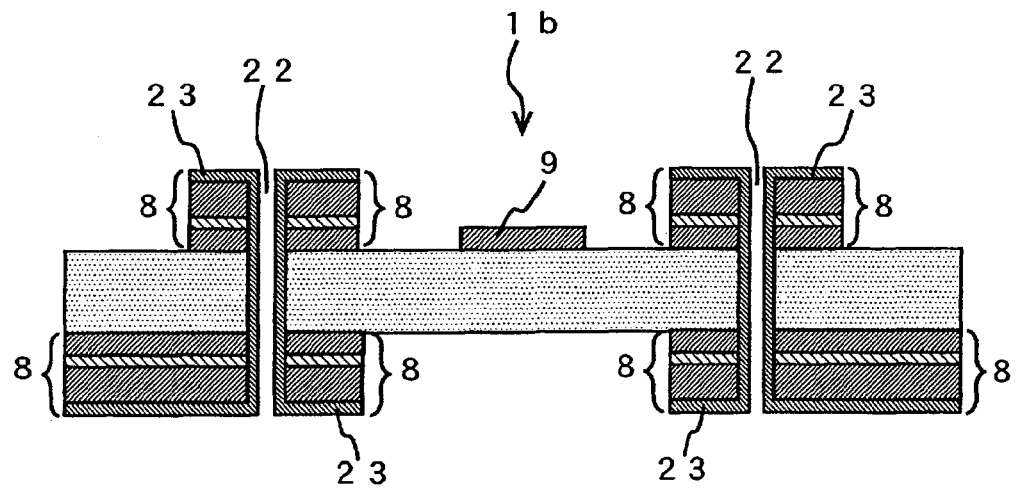

In this manufacturing process step, a clad composite material is a start material and a so-called single-sided printed wiring board or so-called double-sided printed wiring board is manufactured. A method employed in this specification is a method for manufacturing a single-sided or double-sided printed wiring board comprising a circuit layer in which a first circuit and a second circuit having different thicknesses coexist in a same reference plane, characterized by comprising the following step 1-a to step 1-e. Each step will be separately described below. In the following description, FIG. 2 to FIG. 4 are referred to for the single-sided printed wiring board and FIG. 5 to FIG. 7 are referred to for the double-sided printed wiring board.

Step 1-a: in this step, a clad composite material in which three layers of a first copper layer/a different kind of metal layer/a second copper layer are sequentially stacked is used. The different kind of metal layer is constituted from a metal component which can be selectively etched against to copper. This step is a laminating step in which, as shown in FIG. 2(a), the clad composite material 2 (the first copper layer 3, the different kind of metal layer 4, the second copper layer 5) is bonded to a base material 6 constituting an insulating layer (such as a pre-preg formed by impregnating and drying epoxy resin or the like in a skeletal material such as glass fabric or aramid fabric, or a polyimide resin film) to form a metal-clad laminate 7 in FIG. 2(b). In the laminate condition in this case, hot pressing is employed and it is sufficient if the pressing condition is appropriately varied depending on the type of the base material to be used. In order to avoid misunderstanding, it is here explicitly stated that the first copper layer and the second copper layer are distinguished for convenience of explanation, but there is no limitation on which copper layer is a thicker copper layer. The same applies in the following description.

Further, an bonding surface of the clad composite material 2 to the base material 6 is previously subjected to bond enhancing treatment in order to improve adhesion to the base material, so that generation of faults such as delamination and measling due to heat shock after forming the printed wiring board can be efficiently prevented. The bond enhancing treatment referred to here is typified by so-called black oxide treatment (including reduction black oxide treatment which is made in consideration of pink-ring resistivity). However, instead of the black oxide treatment, a method of roughening the copper surface with a sulfuric acid-hydrogen peroxide base microetching agent (for example, MEC Etch Bond manufactured by MEC Co., Ltd.) or depositing fine copper particles by burning plating of copper can be employed, for example. In the above and following description, the "bond enhancing treatment" means these treatments.

If the double-sided printed wiring board is manufactured, in this laminating step, as shown in FIG. 5(a), the clad composite materials 2 (the first copper layers 3, the different kind of metal layers 4, the second copper layers 5) are bonded to both surfaces of the base material 6 constituting the insulating layer to form a double-sided metal-clad laminate 7' in FIG. 5(b). Also in the case of manufacturing the double-sided printed wiring board, the contact surface of the clad composite material 2 to the base material 6 can be previously subjected to the bond enhancing treatment.

It is preferable to use, as the clad composite material, (i) a material made by sequentially laminated to unite a copper foil, a different kind of metal foil, and a copper foil or (ii) a material made by providing a different kind of metal layer on one surface of one sheet of copper layer, laying another copper foil over the different kind of metal layer, and then unite them by rolling. However, it is most preferable to use a clad composite material made by activating bond surfaces of both layers to be clad and bonding them by rolling with a low reducing rate, in a vacuum atmosphere, in order to keep good interlayer adhesion in cladding. Although such a clad composite material can be also manufactured by electrolysis, it is impossible to directly electrodeposit copper to a surface of aluminum or aluminum alloy if aluminum or aluminum alloy is used as the different kind of metal layer. Therefore, by using rolling, the layers can be united more easily and thickness control of the different kind of metal layer is also easier, if rolling is used. Further, while deposition defect or the like may be generated if the different kind of metal layer is formed on the copper layer by electrolysis, defect extinction and uniformity of film thickness in the different kind of metal layer are dramatically enhanced by once rolling.

In the case of the double-sided metal-clad laminate 7' shown in FIG. 5(b), in order to assure electrical connection between the clad composite materials which are conductor layers on both surfaces, through holes or via holes 22 are formed and plating treatment is performed in the holes to assure electrical connection between the layers, as shown in FIG. 6(c). In this specification, this is referred to as interlayer connection pass forming. If plating is employed here, plating layers 23 are formed by catalyzing, electroless copper plating, and electroplating. Thus, generally, the plating layers 23 are formed also on the surfaces of the first copper layers on the outer layers. However, this interlayer connection pass forming is not an indispensable step and may be unnecessary depending on board designs. The same applies in the following description. Further, for example, even if etching resists 10 are provided on surfaces of the plating layers 23 in the strict sense, the expression "etching resists 10 are provided on the first copper layers 3" or the like may be used for convenience of explanation, as long as those skilled in the art can understand.

Step 1-b: in this first copper etching step, as shown in FIG. 2(c), the etching resist layer 10 is formed on the first copper layer 3 located on the outer layer of the metal-clad laminate, and a circuit pattern for etching is exposed and developed to etch the first copper layer 3 located on the outer layer into a desired circuit pattern (temporary circuits 21) with a copper selective etching solution, and then etching resist releasing is performed to remove unnecessary first copper layer, form the temporary circuits 21, and expose the different kind of metal layer 4, as in FIG. 3(*d*). Additionally, for example, if the circuit design is changed and only circuits having the same thickness are formed, copper is selectively etched without remaining the etching resist layer in the center of FIG. 2(*c*), so that the temporary circuit 21 shown in the center of FIG. 3(*d*) desappear and also the printed wiring board can be efficiently manufactured. The copper selective etching solution referred to here is a solution which is used to dissolve only copper without dissolving the different kind of metal, and it is most convenient and preferable to use ammonia base alkaline etching solution. The same applies in the following description, for the copper selective etching solution. In this specification, all intermediate circuit shapes before the final circuit shape are referred to as the "temporary circuits 21" for explanation.

In the case of manufacturing the double-sided printed wiring board, as shown in FIG. 6(*d*), the etching resist layers 10 are formed on the first copper layers 3 after the interlayer connection pass forming, and circuit patterns for etching are exposed and developed to etch the first copper layers 3 located on the outer layers into desired circuit patterns with the copper selective etching solution, and then etching resist releasing is performed to remove unnecessary first copper layers, form the temporary circuits 21, and expose the different kind of metal layers 4, as in FIG. 6(*e*). Also in the case of the double-sided printed wiring board, for example, if the circuit design is changed and only circuits having the same thickness are formed, copper is selectively etched without remaining the etching resist layer in the center of FIG. 6(*d*), so that the temporary circuit 21 shown in the center of FIG. 6(*e*) desappear and also the printed wiring board can be efficiently manufactured.

Step 1-c: in this first different kind of metal etching step, after the first copper etching step is finished, the different kind of metal layer exposed between the temporary circuits 21 formed on the outer layer is etched away with a different kind of metal selective etching solution, as shown in FIG. 3(*e*). This step is the same also in the case of manufacturing the double-sided printed wiring board. The different kind of metal layers exposed between the circuits temporarily formed on the outer layers as shown in FIG. 6(*e*) are etched away with the different kind of metal selective etching solution, as shown in FIG. 7(*f*).

There is no particular limitation on the different kind of metal selective etching solution used here, as long as it is a solution which is used to dissolve only the different kind of metal without dissolving copper. However, it is preferable to use etching solutions which are appropriately prepared depending on the type of the different kind of metal. For example, a chlorine base or sulfuric acid base acid etching solution is used for the different kind of metal of nickel base metal component, an acid etching solution is used for the different kind of metal of tin base metal component, and an alkaline base etching solution is used for the different kind of metal of aluminum base metal component. The same applies in the following description, for the different kind of metal selective etching solution.

Step 1-d: in this second copper etching step, after the first different kind of metal etching step is finished, as shown in FIG. 3(*f*), the etching resist layer 10 is again formed only on area which is to be the first circuit, and etching is performed with the copper selective etching solution to etch away area of the first copper layer where no etching resist layer 10 is present, so that the shapes of the first circuits 8 are finished and the second circuit 9 still having the different kind of metal layer is formed, and then etching resist releasing is performed to expose the different kind of metal layer 4 of the second circuit 9. This step is the same also in the case of the double-sided printed wiring board. After the first different kind of metal etching step is finished, as shown in FIG. 7(*g*), the etching resist layers 10 are again formed only on area which is to be the first circuit, and etching is performed with the copper selective etching solution to etch away area of the first copper layers where no etching resist layer 10 is present, so that the shape of the first circuit 8 is finished and the second circuit 9 still having the different kind of metal layer 4 is formed, and then etching resist releasing is performed to expose the different kind of metal layer 4 of the second circuit 9.

Step 1-e: further, in the second different kind of metal etching step, only the different kind of metal layer on the surface of the second circuit is removed with the different kind of metal selective etching solution to form the final shape of the second circuit 9, so that a printed wiring board 1*a* as shown in FIG. 4(*h*) is obtained. This step is the same also in the case of manufacturing the double-sided printed wiring board. Only the different kind of metal layer on the surface of the second circuit is removed with the different kind of metal selective etching solution to form the final shape of the second circuit 9, so that a printed wiring board 1*b* as shown in FIG. 7(*h*) is obtained.

<Manufacturing Process Step (2) of Single-Sided or Double-Sided Printed Wiring Board>

Figure 8:
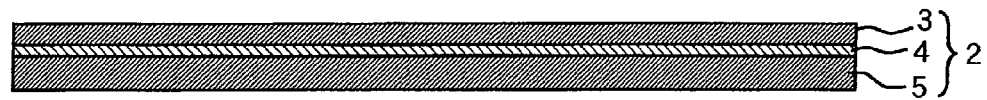
FIG. 8 is a flow diagram showing process steps for manufacturing the printed wiring board according to the present invention.
Figure 8:
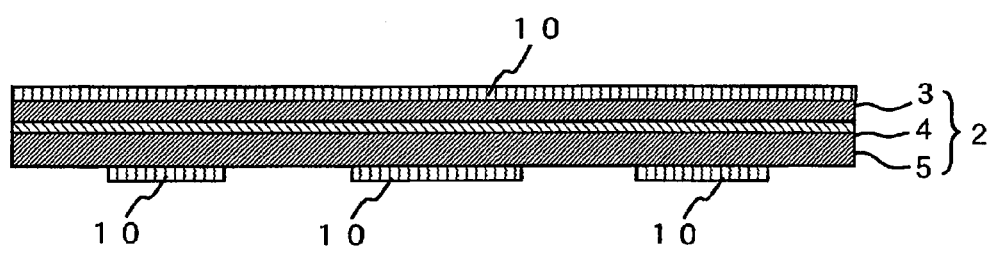
Figure 8:
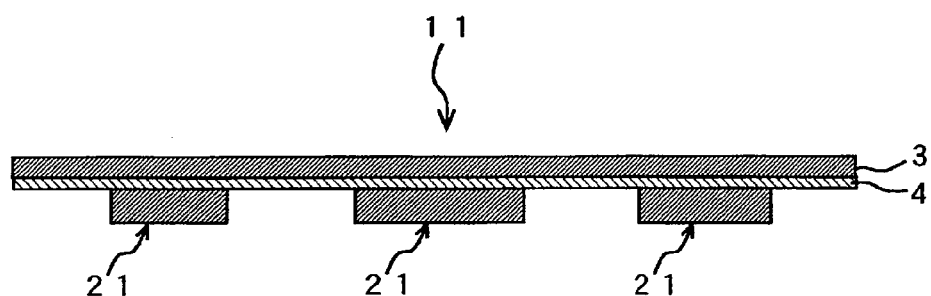
Figure 8:
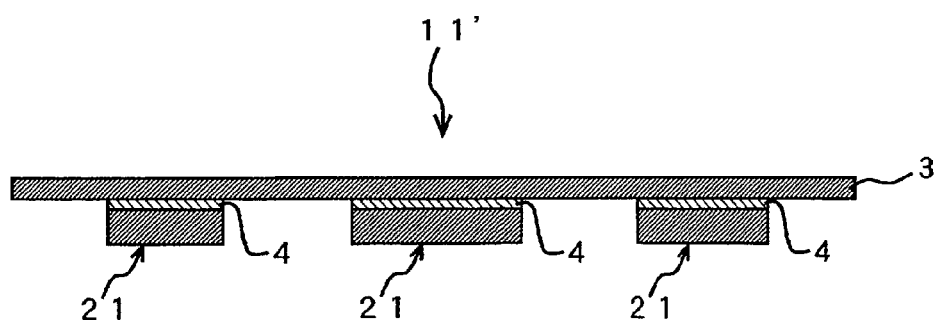
Figure 9:
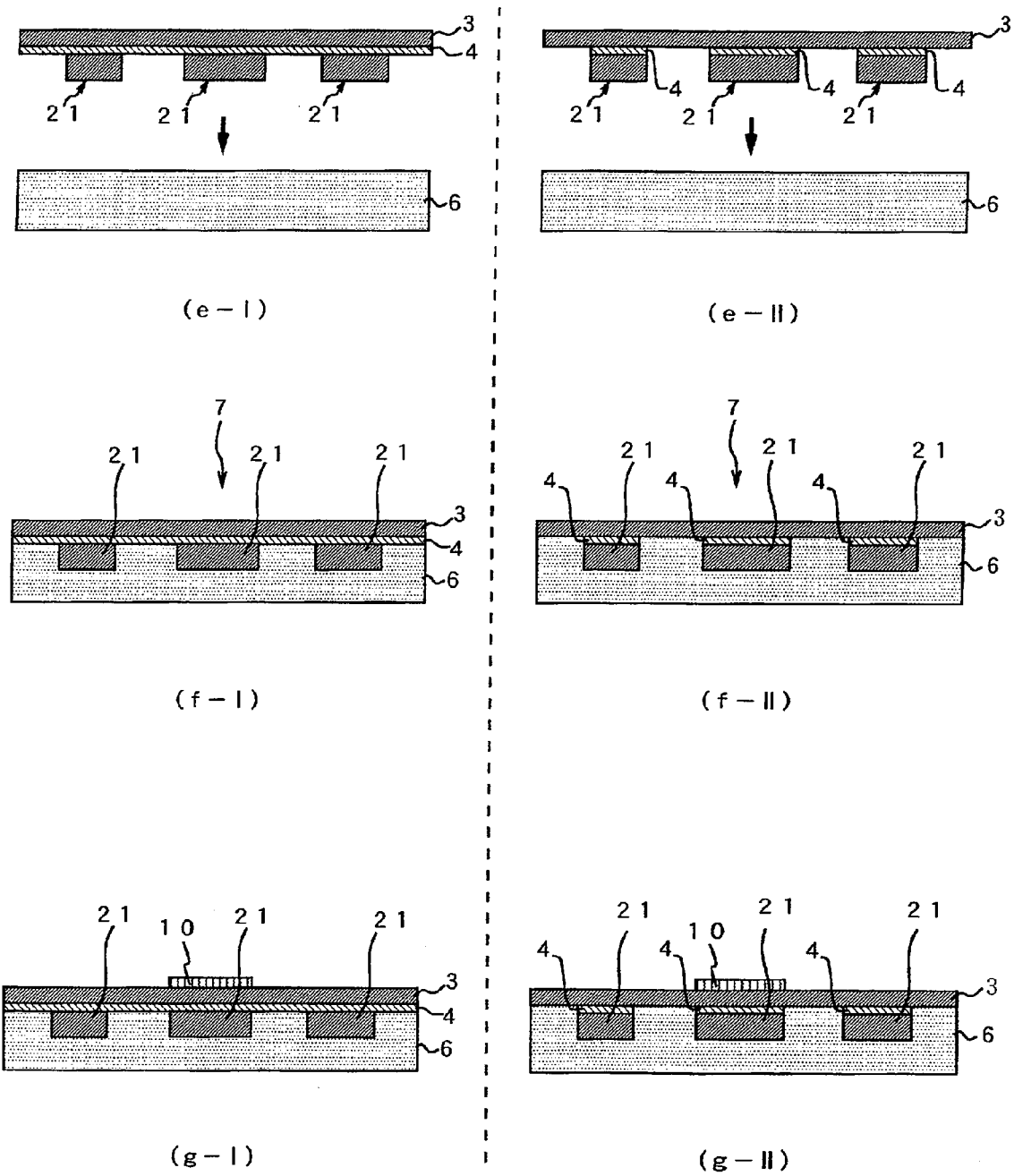
FIG. 9 is a flow diagram showing process steps for manufacturing the printed wiring board according to the present invention.
Figure 10:
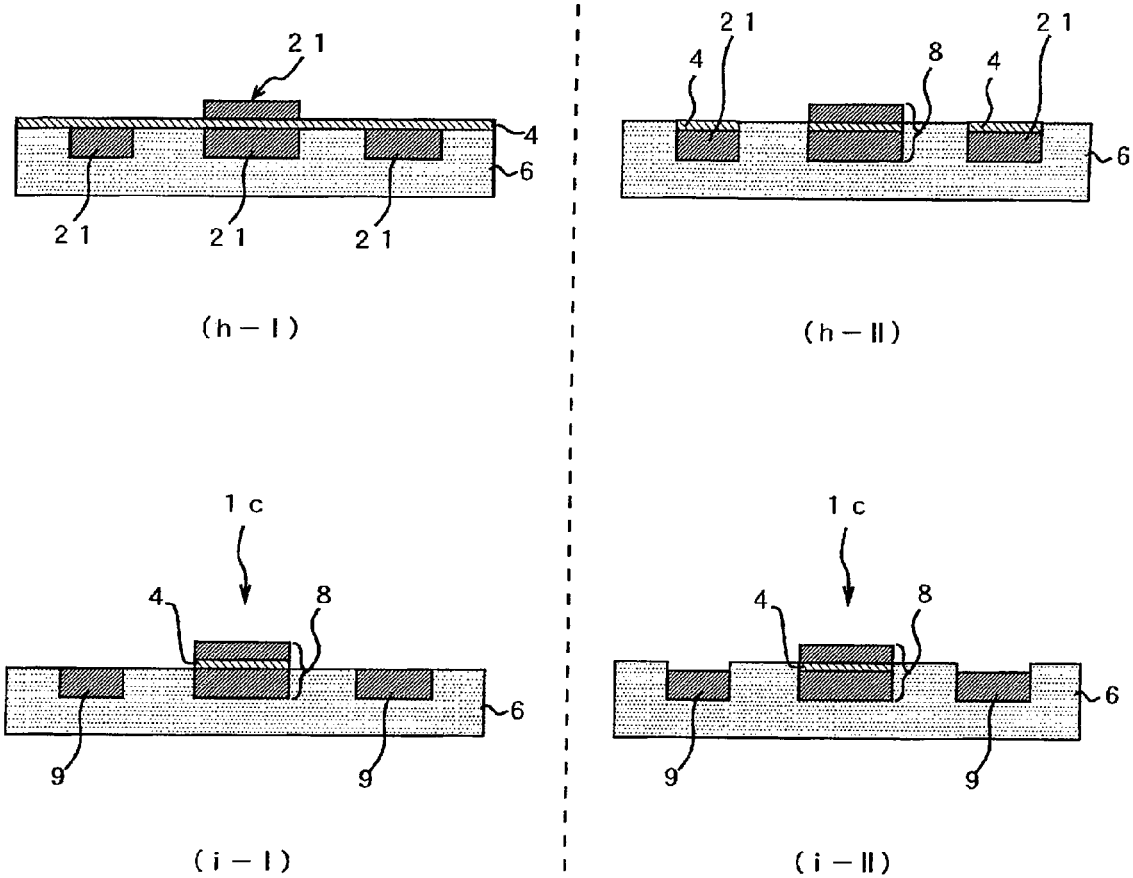
FIG. 10 is a flow diagram showing process steps for manufacturing the printed wiring board according to the present invention.
Figure 13:
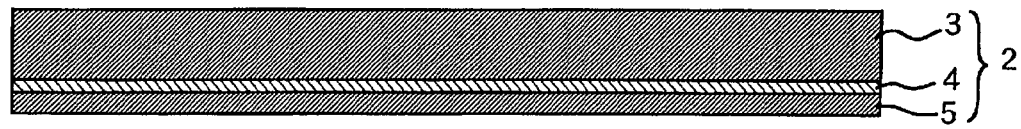
FIG. 13 is a flow diagram showing process steps for manufacturing the printed wiring board according to the present invention.
Figure 13:
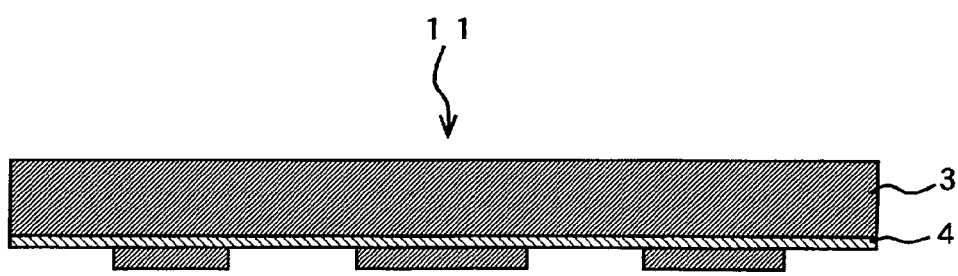
Figure 13:
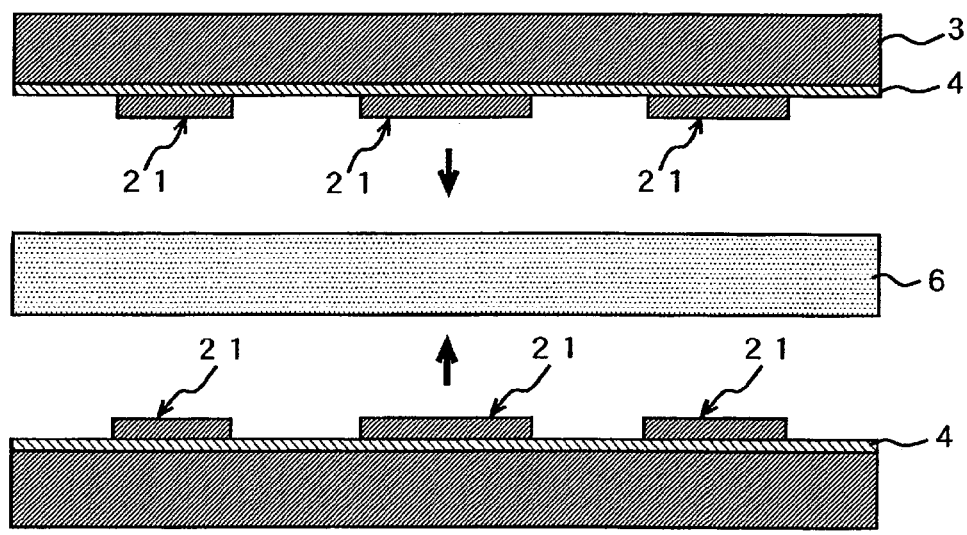
Figure 14:
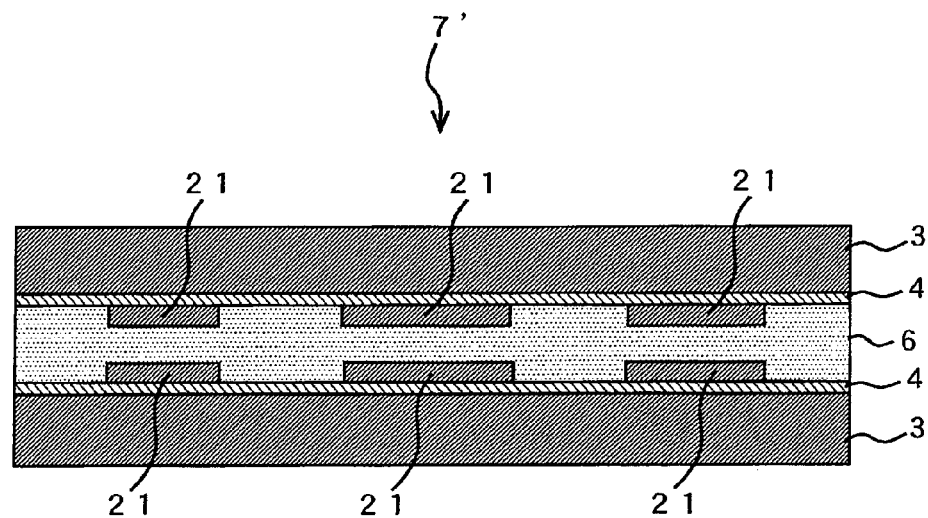
FIG. 14 is a flow diagram showing process steps for manufacturing the printed wiring board according to the present invention.
Figure 14:
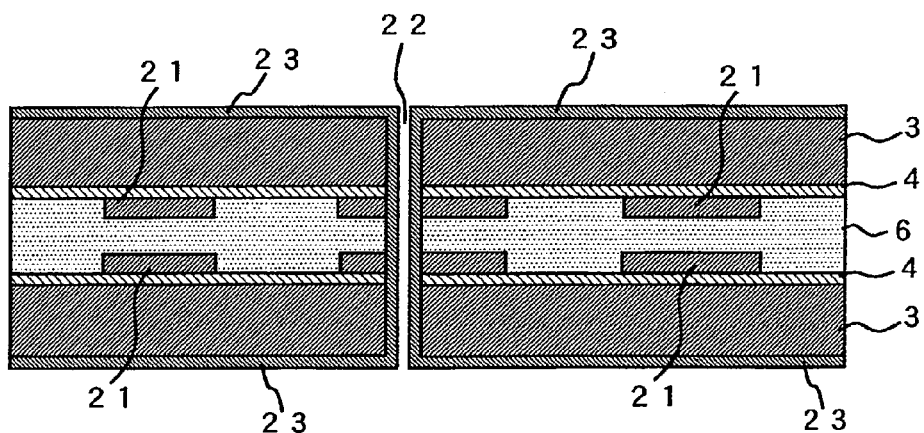
Figure 14:
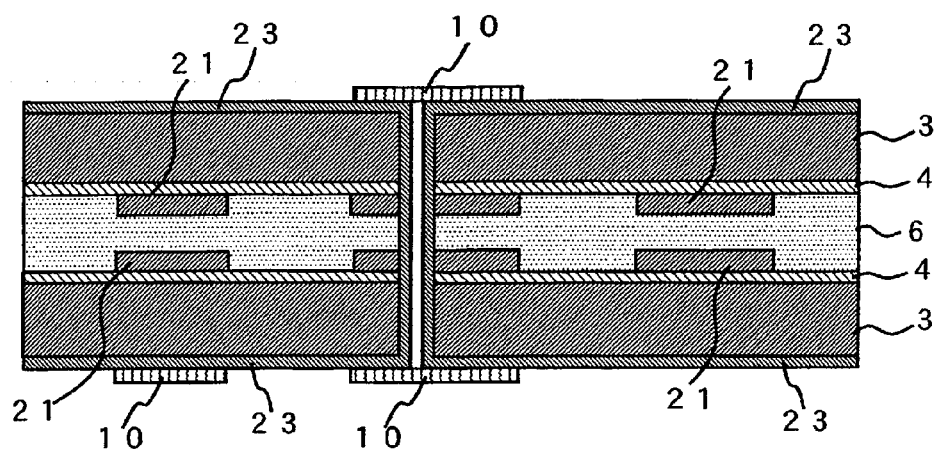
Figure 15:
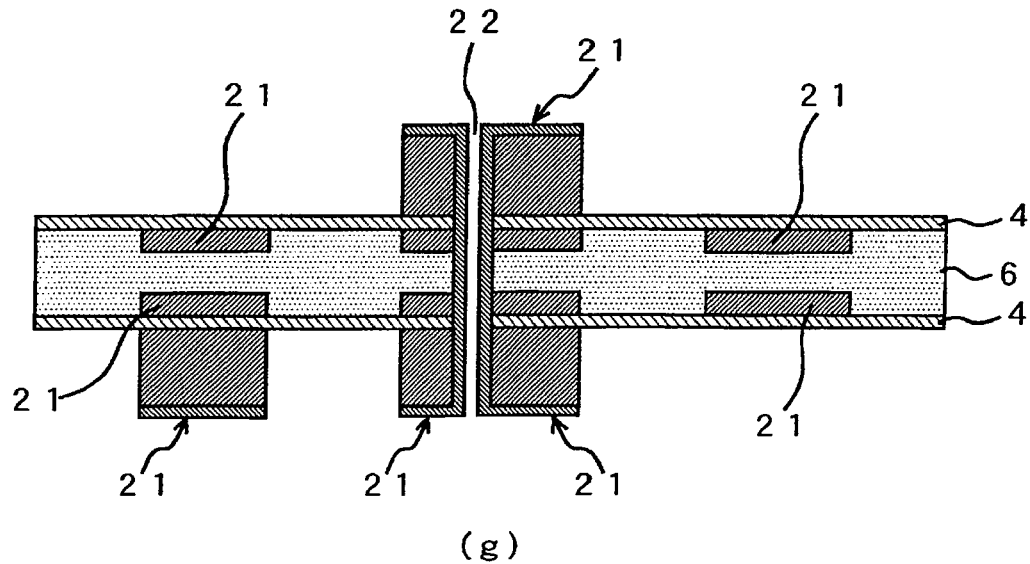
FIG. 15 is a flow diagram showing process steps for manufacturing the printed wiring board according to the present invention.
Figure 15:
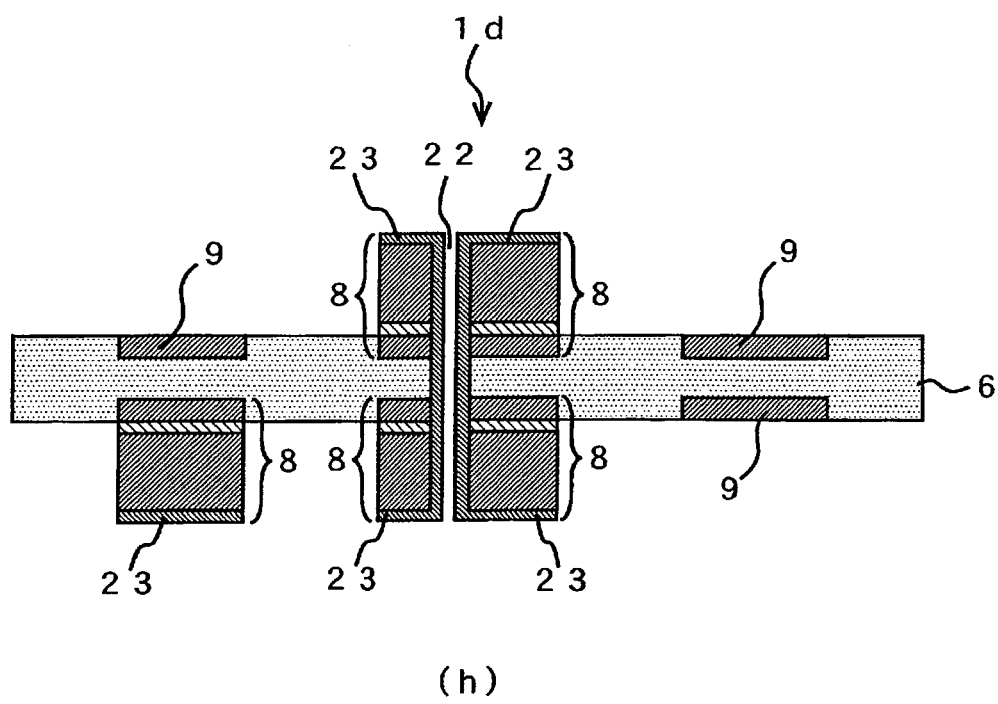

In this manufacturing process step, a clad composite material is a start material and single-sided printed wiring board or a so-called double-sided printed wiring board is manufactured. A method employed in this specification is a method for manufacturing a single-sided or double-sided printed wiring board comprising a circuit layer in which a first circuit and a second circuit having different thicknesses coexist in a same reference plane, and one circuit is buried in an insulating layer, the method characterized by comprising the following step 1-a to step 1-d. Each step will be separately described below. In the following description, FIG. 8 to FIG. 10 are referred to for the single-sided printed wiring board and FIG. 13 to FIG. 15 are referred to for the double-sided printed wiring board.

Step 2-a: in this manufacturing process step, at first, in a clad composite material etching step, a clad composite material in which three layers of a first copper layer/a different kind of metal layer/a second copper layer are sequentially stacked has the different kind of metal layer constituted from a metal component which can be selectively etched against to copper. Using this clad composite material 2, only the second copper layer is etched with a copper selective etching solution to form a circuit pattern for etching on one surface, so that a first clad composite material with circuit pattern 11 shown in FIG. 8(*c*) is obtained. The first clad composite material with circuit pattern 11 is obtained by forming etching resist layers 10 on both surfaces of the clad composite material 2, exposing and developing a circuit pattern for etching for forming temporary circuits 21 only on the etching resist layer of the second copper layer as shown FIG. 8(*b*), etching the second copper layer 5 located on the outer layer into a desired circuit pattern with the copper selective etching solution, and then performing etching resist releasing.

Further, it is also possible that the different kind of metal layer exposed between the temporary circuits 21 of the clad composite material with a first circuit pattern 11 shown in FIG. 8(c) is removed with a different kind of metal selective etching solution to use as the clad composite material with a second circuit pattern 11' shown in FIG. 8(d).

Further, it is preferable that the etched circuit pattern surfaces of the clad composite material with a first circuit pattern 11 and the clad composite material with a second circuit pattern 11' are previously subjected to bond enhansing treatment in order to improve adhesion to the base material, so as to efficiently prevent generation of faults such as delamination and measling due to heat shock after forming the printed wiring board.

Therefore, in the following description of the steps, the case where the clad composite material with a first circuit pattern 11 shown in FIG. 8(c) is used and the case where the clad composite material with a second circuit pattern 11' shown in FIG. 8(d) is used are separately described only when it is necessary to describe them separately.

Step 2-b: a laminating step will be described. If the clad composite material with a first circuit pattern 11 is used, as shown in FIG. 9(e-I), the etched circuit pattern surface of the clad composite material with a first circuit pattern 11 obtained in the clad composite material etching step, on which the temporary circuits 21 are formed, is placed onto a surface of the base material 6 and bonded to the base material surface to form a metal-clad laminate 7 in which the etched pattern is buried in the insulating layer, as shown in FIG. 9(f-I).

If the clad composite material with a second circuit pattern 11' is used, as shown in FIG. 9(e-II), the etched circuit pattern surface of the clad composite material with a second circuit pattern 11' obtained in the clad composite material etching step, on which the temporary circuits 21 are formed, is placed onto a surface of the base material 6 and bonded to the base material surface to form a metal-clad laminate 7 in which the etched pattern is buried in the insulating layer, as shown in FIG. 9(f-II). A difference from the case of using the clad composite material with a first circuit pattern 11 is that the different kind of metal layer 4 between the temporary circuits 21 and the first copper layer is also buried in the base material 6.

If the double-sided printed wiring board is manufactured, in this laminating step, the clad composite material 2 shown in FIG. 13(a) is a start material, and two first clad composite material with circuit patterns 11 shown in FIG. 13(b) are used and their etched circuit pattern surfaces on which the temporary circuits 21 are formed are bonded to both surfaces of the base material 6 constituting the insulating layer as shown in FIG. 13(c), to form a double-sided metal-clad laminate 7' in which temporary circuits 21 are buried in the insulating layer 6 as in FIG. 14(d). The manufacturing process of the double-sided printed wiring board will be exemplarily described for the case where the clad composite material with a first circuit pattern 11 is used. Also in the case of manufacturing the double-sided printed wiring board, instead of the clad composite material with a first circuit pattern 11, the clad composite material with a second circuit pattern 11' may be used, and the etched circuit pattern surfaces of the clad composite material with a first circuit pattern 11 and the clad composite material with a second circuit pattern 11' can be previously subjected to the bond enhansing treatment, as required.

The clad composite material referred to here is the same as described above. In the case of the double-sided metal-clad laminate 7' shown in FIG. 14(d), in order to assure electrical connection between the clad composite material with circuit patterns 11, 11' which are conductor layers on both surfaces, a through holes or via hole 22 is formed and plating treatment is performed in the hole to assure electrical connection between the layers, as shown in FIG. 14(e). The description of this interlayer connection pass forming will be omitted because it is the same as described above, in order to avoid repetition.

Step 2-c: in this first copper etching step, as shown in FIG. 9(g-I) for the case of using the clad composite material with a first circuit pattern 11, and as shown in FIG. 9(g-II) for the case of using the clad composite material with a second circuit pattern 11', the etching resist layer 10 is formed on the first copper layer 3 on the outer layer surface of the metal-clad laminate 7, and a circuit pattern for etching is exposed and developed to etch the first copper layer 3 located on the outer layer into a desired circuit pattern with a copper selective etching solution, and then etching resist releasing is performed. As a result, in the case of using the clad composite material with a first circuit pattern 11, unnecessary first copper layer 3 is removed, the temporary circuits 21 are formed, and a part of the different kind of metal layer 4 is exposed, as shown in FIG. 10(h-I). On the other hand, in the case of using the clad composite material with a second circuit pattern 11', the first circuit 8 is finished and the different kind of metal layer 4 remains on the surface of the second circuit, as shown in FIG. 10(h-II).

Also in the case of manufacturing the double-sided printed wiring board, as shown in FIG. 14(f), the etching resist layers 10 are formed on the first copper layers 3 on the outer layer surfaces of the metal-clad laminate 7, and circuit pattern for etching is exposed and developed to etch the first copper layers 3 located on the outer layers into desired circuit patterns with the copper selective etching solution, and then etching resist releasing is performed to remove unnecessary first copper layers 3, form the temporary circuits 21, and expose parts of the different kind of metal layers 4, as in FIG. 15(g).

Step 2-d: in this different kind of metal etching step, after the first copper etching step is finished, the different kind of metal layer is etched away with a different kind of metal selective etching solution to form the first circuit and the second circuit. Therefore, in the case of using the clad composite material with a first circuit pattern 11, a printed wiring board 1c as shown in FIG. 10(i-I) is obtained. On the other hand, in the case of using the clad composite material with a second circuit pattern 11', a printed wiring board 1c as shown in FIG. 10(i-II) is obtained.

Also in the case of manufacturing the double-sided printed wiring board, after the first copper etching step is finished, the different kind of metal layers are etched away with the different kind of metal selective etching solution to form the first circuits and the second circuits, so that a printed wiring board 1d as shown in FIG. 15(h) is obtained.

<Manufacturing Process Step (3) of Single-Sided or Double-Sided Printed Wiring Board>

Figure 11:
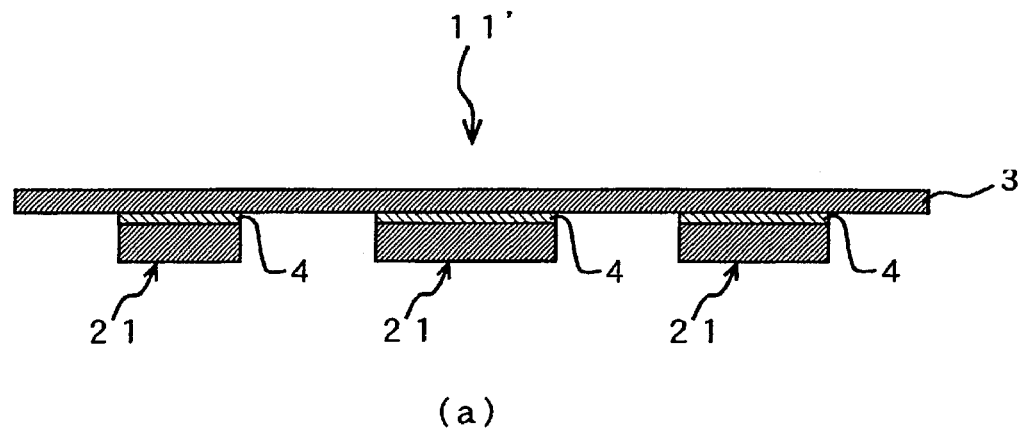
FIG. 11 is a flow diagram showing process steps for manufacturing the printed wiring board according to the present invention.
Figure 11:
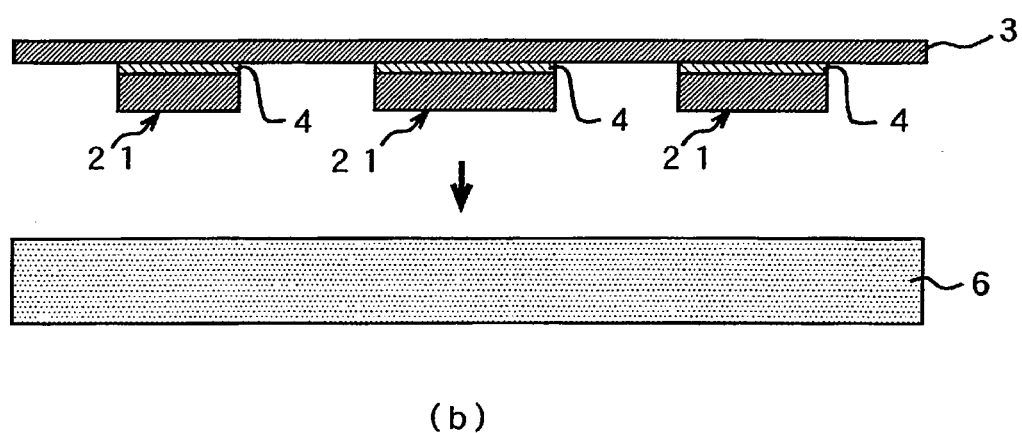
Figure 11:
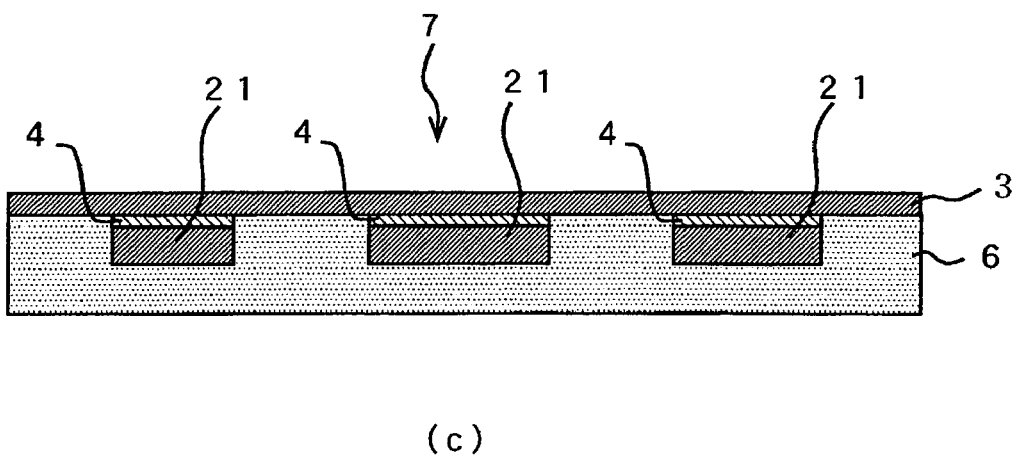
Figure 12:
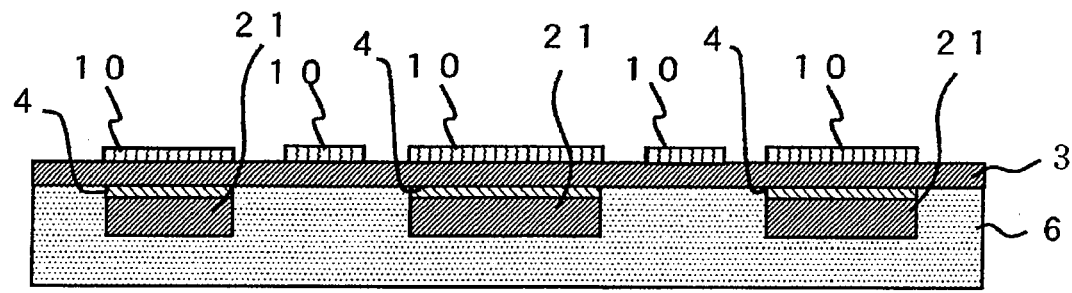
FIG. 12 is a flow diagram showing process steps for manufacturing the printed wiring board according to the present invention.
Figure 12:
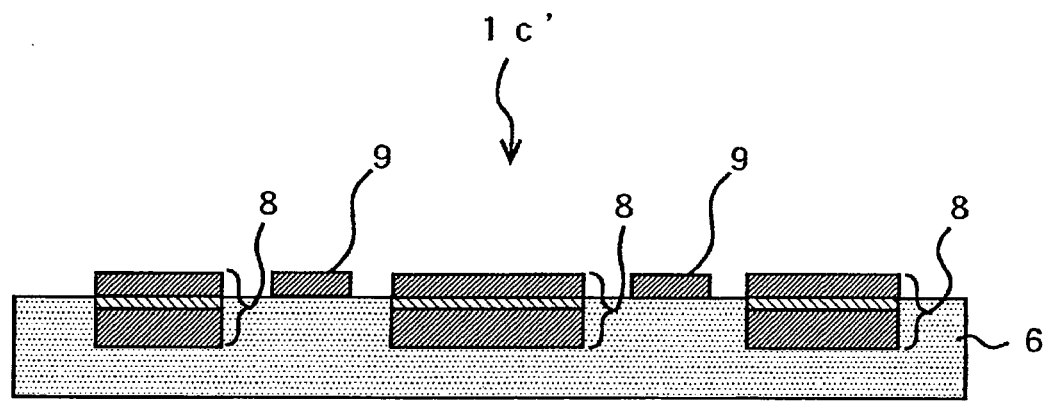

In this manufacturing process step, a clad composite material is a start material and a so-called single-sided printed wiring board or a so-called double-sided printed wiring board is manufactured. A method employed in this specification is a method for manufacturing a single-sided or double-sided printed wiring board comprising a circuit layer in which a first circuit and a second circuit having different thicknesses coexist in a same reference plane, and one circuit is buried in the insulating layer, the method characterized by comprising the following step 3-a to step 3-c. Each step will be separately described below. In the following description, FIG. 11 to FIG. 12 are referred to for the single-sided printed wiring board, and illustration of the double-sided printed wiring board will be omitted.

Step 3-a: in this manufacturing process step, at first, in a clad composite material etching step, a clad composite material in which three layers of a first copper layer/a different kind of metal layer/a second copper layer are sequentially stacked has the different kind of metal layer constituted from a metal component which can be selectively etched against to copper. Using this clad composite material 2, only the second copper layer is etched with a copper selective etching solution to form a circuit pattern for etching on one surface, so that the clad composite material with a first circuit pattern 11 shown in FIG. 8(c) is obtained. Further, it is assumed that the different kind of metal layer exposed between the temporary circuits 21 of the clad composite material with a first circuit pattern 11 shown in FIG. 8(c) is removed with a different kind of metal selective etching solution to use the clad composite material with a second circuit pattern 11' shown in FIG. 8(d) (=FIG. 11(a)). The etching of the second copper layer in this step is mainly performed as an etching which matches to the circuit forming pattern for the thicker circuit (corresponding to the first circuit in the description).

Further, it is preferable that the etched circuit pattern surface of the clad composite material with a second circuit pattern 11' is previously subjected to bond enhancing treatment in order to improve adhesion to the base material, so as to efficiently prevent generation of faults such as delamination and measling due to heat shock after forming the printed wiring board.

Step 3-b: a laminating step will be described. the clad composite material with a second circuit pattern 11' shown in FIG. 11(a) is used and the etched circuit pattern surface of the clad composite material with a second circuit pattern 11' obtained in the clad composite material etching step, on which the temporary circuits 21 are formed, is placed onto a surface of the base material 6 and bonded to the base material surface as shown in FIG. 11(b), to form a metal-clad laminate 7 in which the etched pattern is buried in the insulating layer, as shown in FIG. 11(c).

If the double-sided printed wiring board is manufactured, in this laminating step, two second clad composite material with circuit pattern 11' shown in FIG. 11(a) are used and their etched circuit pattern surfaces on which the temporary circuits 21 are formed are bonded to both surfaces of the base material 6 constituting the insulating layer as shown in FIG. 11(b), to form a double-sided metal-clad laminate. Illustration of the manufacturing process of the double-sided printed wiring board will be omitted. In the case of the double-sided metal-clad laminate, in order to assure electrical connection between the clad composite material with circuit patterns 11' on both surfaces in this stage, interlayer connection pass for assuring electrical connection between the layers can be formed, such as through holes or via holes. The description for them will be omitted because it is the same as described above, in order to avoid repetition.

Step 3-c: in this first copper etching step, as shown in FIG. 12(d), the etching resist layer 10 is formed on the first copper layer 3 on the outer layer surface of the metal-clad laminate 7, and a circuit pattern for etching is exposed and developed to etch the first copper layer 3 located on the outer layer into a desired circuit pattern with a copper selective etching solution, and then etching resist releasing is performed. As a result, as shown in FIG. 12(e), in the clad composite material with a second circuit pattern 11', remaining parts of the second copper layer which have been previously etched form the first circuit 8, and area having only the first copper layer is etched to form the thin second circuit 9, so that a printed wiring board 1c' is obtained. The subsequent different kind of metal etching of the different kind of metal layer is eliminated.

<Manufacturing Process Step (1) of Double-Sided Printed Wiring Board>

Figure 16:
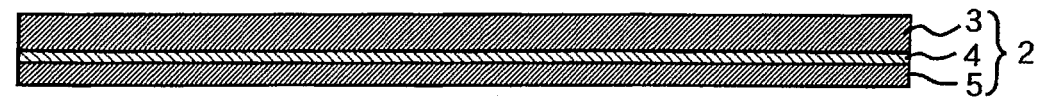
FIG. 16 is a flow diagram showing process steps for manufacturing the printed wiring board according to the present invention.
Figure 16:
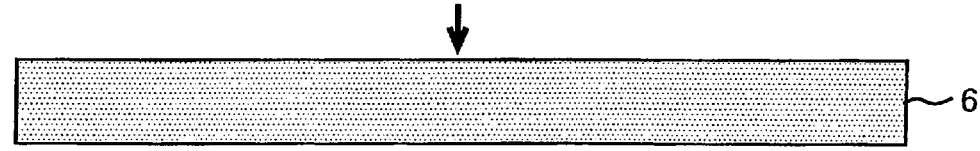
Figure 16:
Figure 16:
Figure 16:
Figure 16:
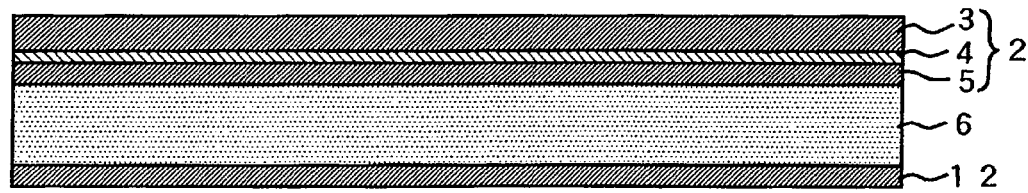
Figure 16:
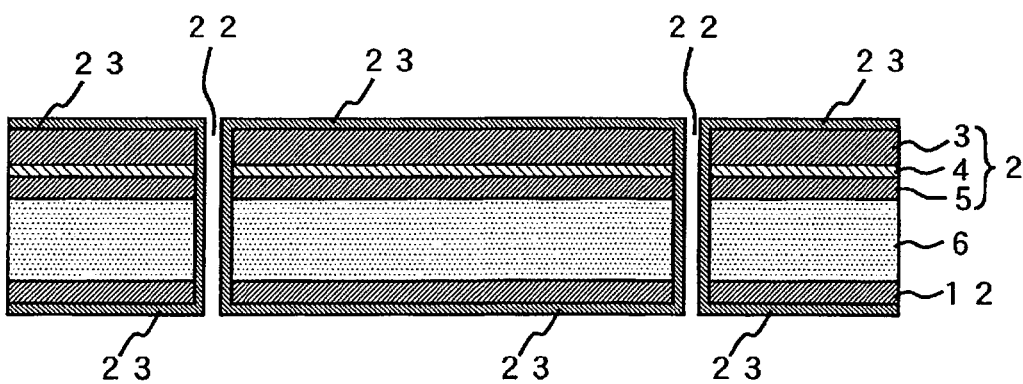
Figure 17:
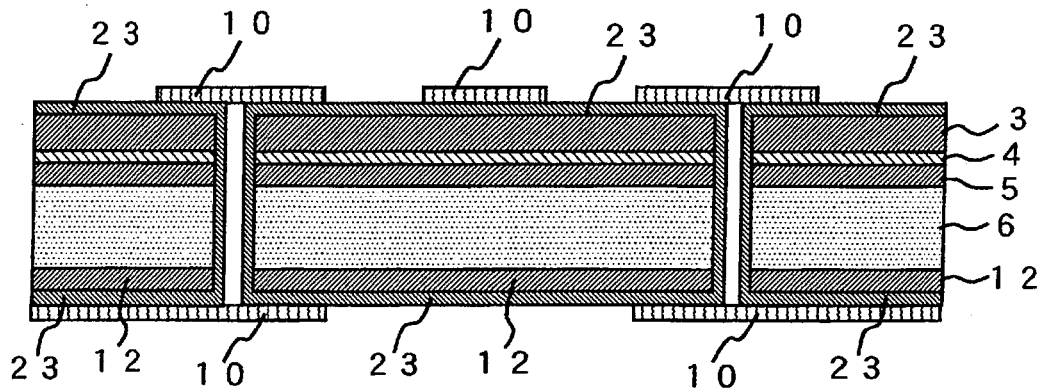
FIG. 17 is a flow diagram showing process steps for manufacturing the printed wiring board according to the present invention.
Figure 17:
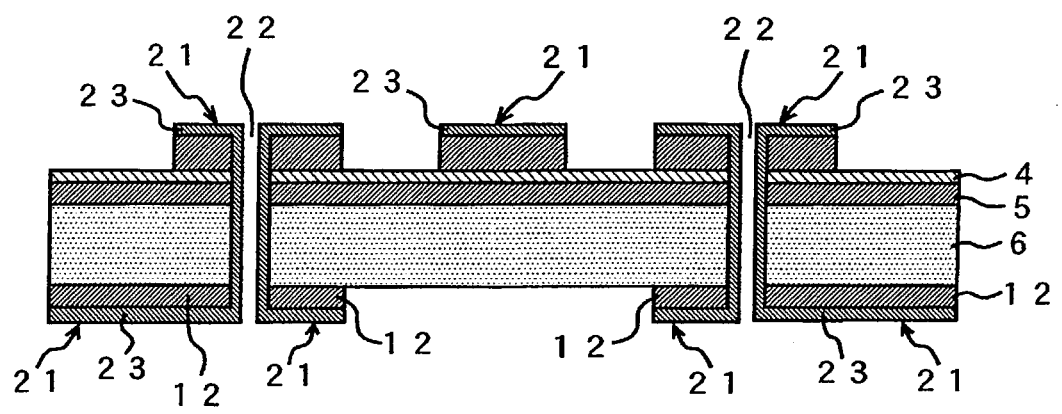
Figure 17:
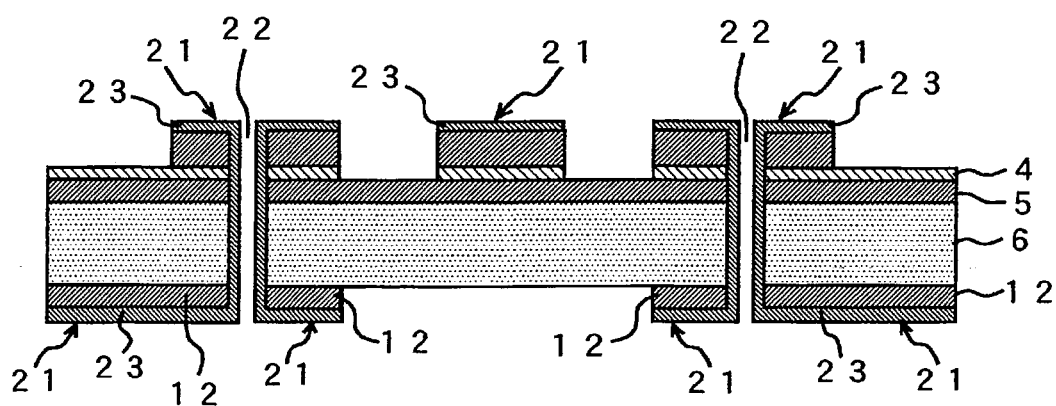
Figure 18:
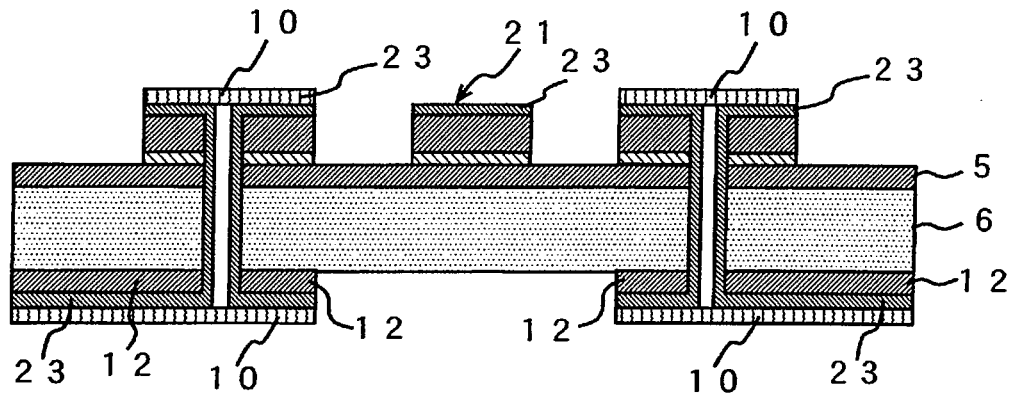
FIG. 18 is a flow diagram showing process steps for manufacturing the printed wiring board according to the present invention.
Figure 18:
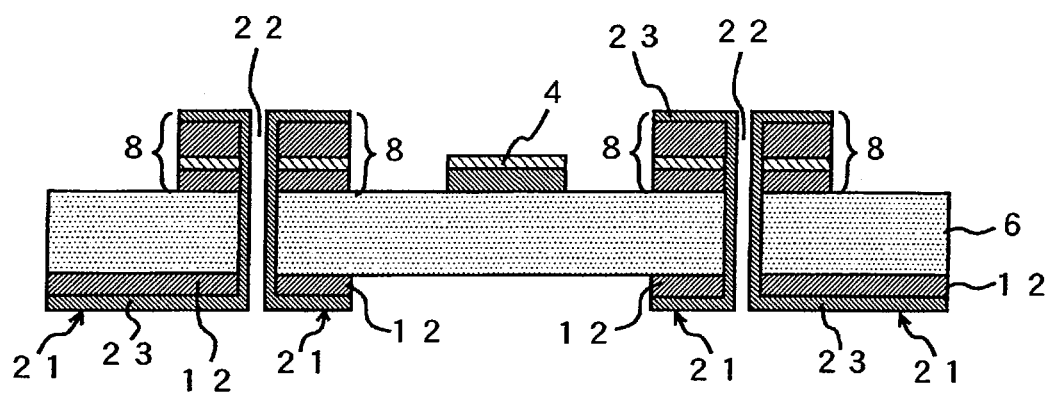
Figure 18:
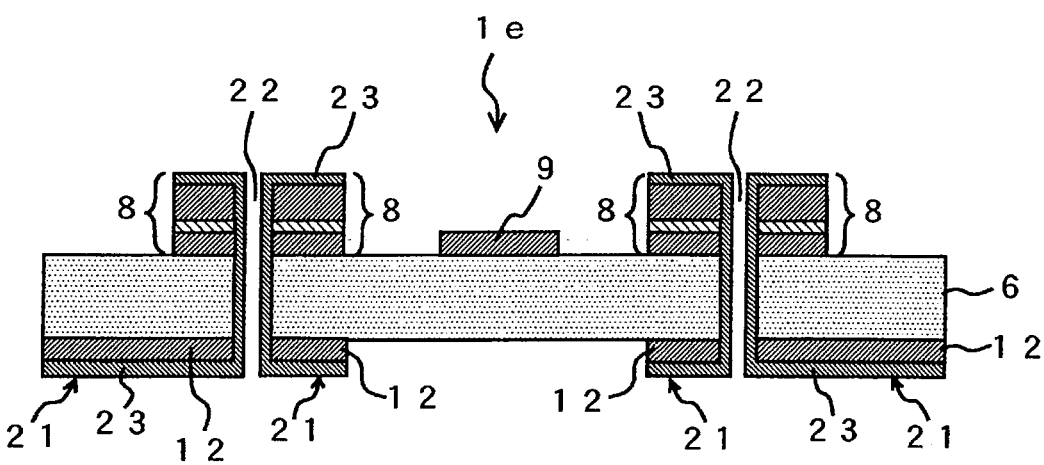

In this manufacturing process step, a case will be described in which a clad composite material is a start material and a so-called double-sided printed wiring board is manufactured. In particular, a first circuit and a second circuit having different thicknesses coexist only in a same reference plane on one surface side of the double-sided printed wiring board, and the process step is characterized by comprising the following step 4-a to step 4-e. FIG. 16 to FIG. 18 are referred to in the following description.

Step 4-a: in this laminating step, as shown in FIG. 16(a), the above described clad composite material 2 and a conventional copper foil 12 are laminated and bonded to respective one surface side of a base material constituting an insulating layer to form a double-sided metal-clad laminate 7' shown in FIG. 16(b).

If the forming step of a pass for interlayer connection is provided, through holes or via holes 22 are formed for assuring electrical connection between the clad composite material 2 and the copper foil 12 located on both surfaces of the insulating layer of the double-sided metal-clad laminate 7'. This forming method is the same as described above and the description is not repeated here.

The bonding surface of the clad composite material 2 to the base material 6 is previously subjected to bond enhancing treatment in order to improve adhesion to the base material, so that generation of faults such as delamination and measling due to heat shock after forming the printed wiring board can be efficiently prevented. The bond enhancing treatment referred to here is the same as described above.

Step 4-b: in this first copper etching step, as shown in FIG. 17(d), etching resist layers 10 are formed on the first copper layer 3 of the clad composite material 2 located on one surface side of the insulating layer and on the copper foil layer 12 on the other surface side, and circuit pattern for etching is exposed and developed to etch the first copper layer 3 and the copper foil 12 located on the outer layers into desired circuit patterns with a copper selective etching solution, and then etching resist releasing is performed to remove unnecessary first copper layer 3, form the temporary circuits 21, and expose the different kind of metal layer 4 between the temporary circuits 21, and form the copper foil 12 into a desired circuit pattern, as shown in FIG. 17(e).

Step 4-c: in this first different kind of metal etching step, after the first copper etching step is finished, the different kind of metal layer 4 exposed between the temporary circuits 21 formed on the outer layer is etched away with a different kind of metal selective etching solution, as shown in FIG. 17(f).

Step 4-d: in this second copper etching step, after the first different kind of metal etching step is finished, as shown in FIG. 18(g), the etching resist layers 10 are again formed only on area which is to be the first circuit and on the circuit formed by etching the copper foil layer, and etching is performed with the copper selective etching solution to etch away area of the first copper layer where no etching resist layer is present, and then etching resist releasing is performed to form the first circuit and the second circuit still having the different kind of metal layer, as shown in FIG. 18(h).

Step 4-e: in this second different kind of metal etching step, only the different kind of metal layer on the surface of the second circuit is removed with the different kind of metal selective etching solution to form the second circuit shape, so that a printed wiring board 1e is obtained as shown in FIG. 18(i).

<Manufacturing Process Step (2) of Double-Sided Printed Wiring Board>

Figure 19:
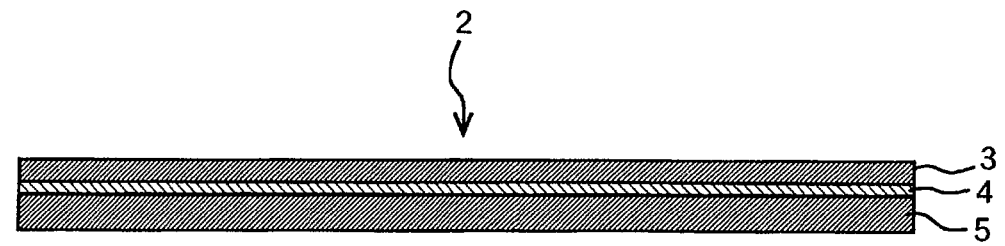
FIG. 19 is a flow diagram showing process steps for manufacturing the printed wiring board according to the present invention.
Figure 19:
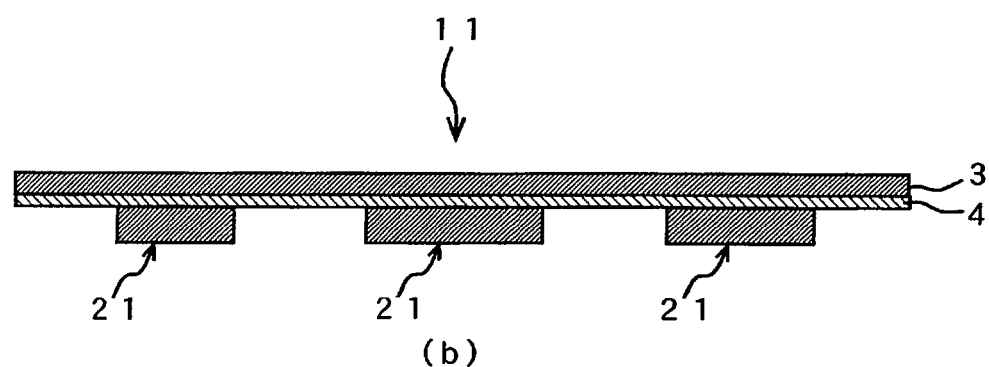
Figure 19:
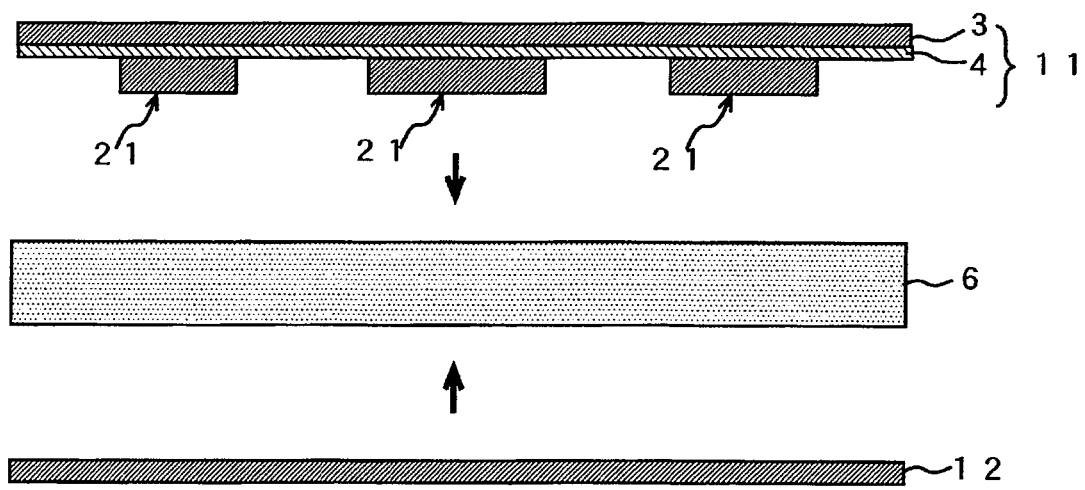
Figure 20:
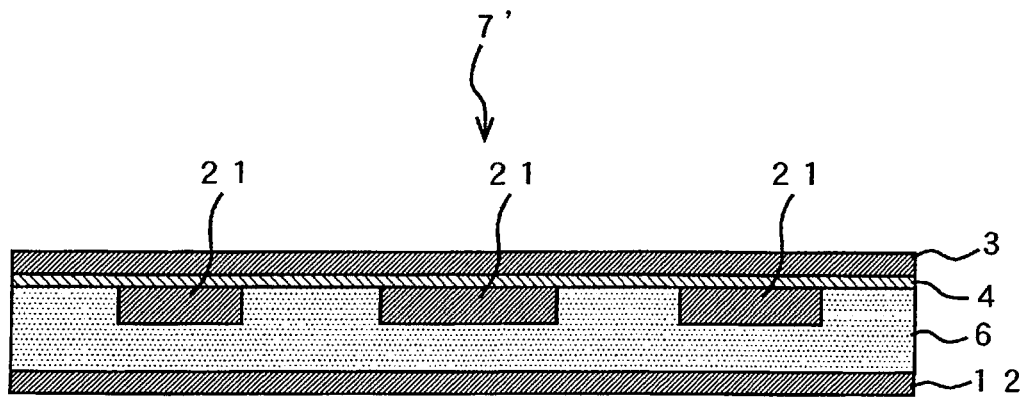
FIG. 20 is a flow diagram showing process steps for manufacturing the printed wiring board according to the present invention.
Figure 20:
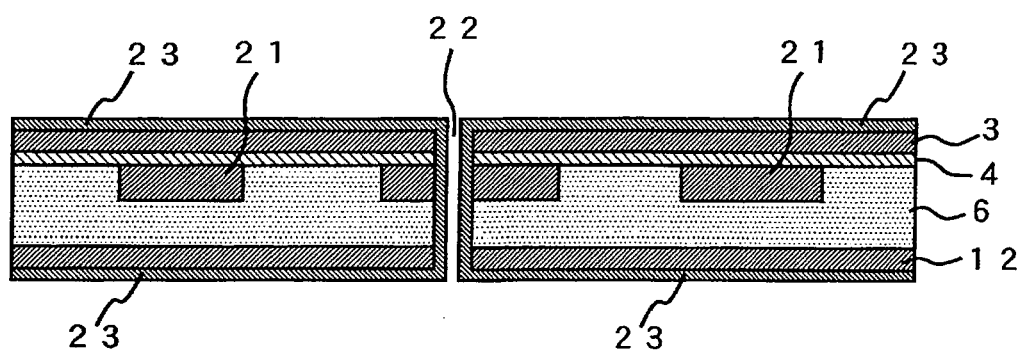
Figure 20:
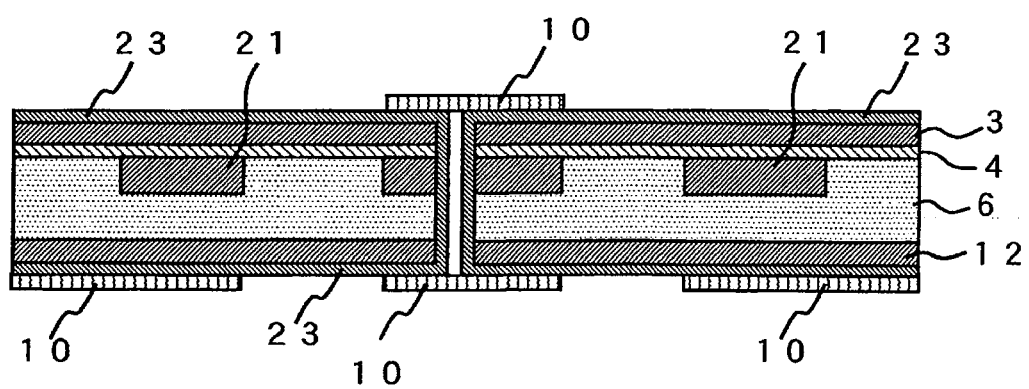
Figure 21:
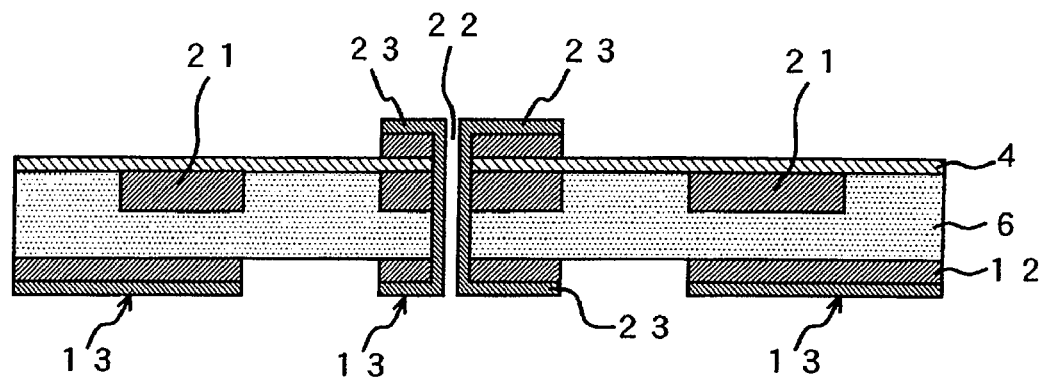
FIG. 21 is a flow diagram showing process steps for manufacturing the printed wiring board according to the present invention.
Figure 21:
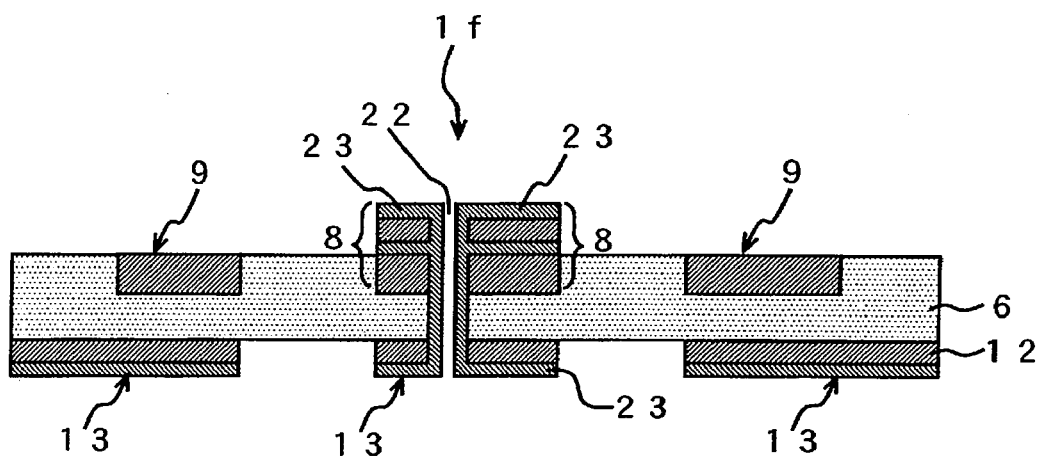
Figure 22:
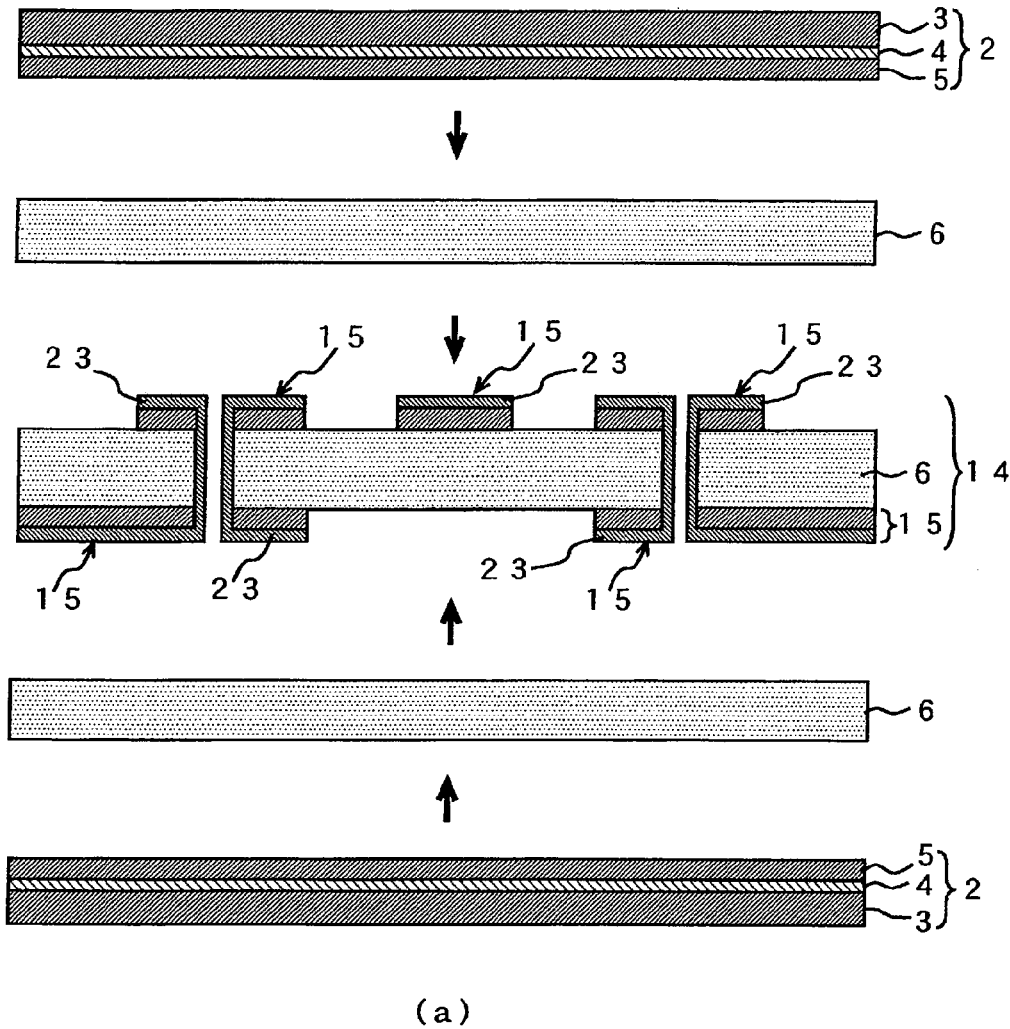
FIG. 22 is a flow diagram showing process steps for manufacturing the printed wiring board according to the present invention.
Figure 22:
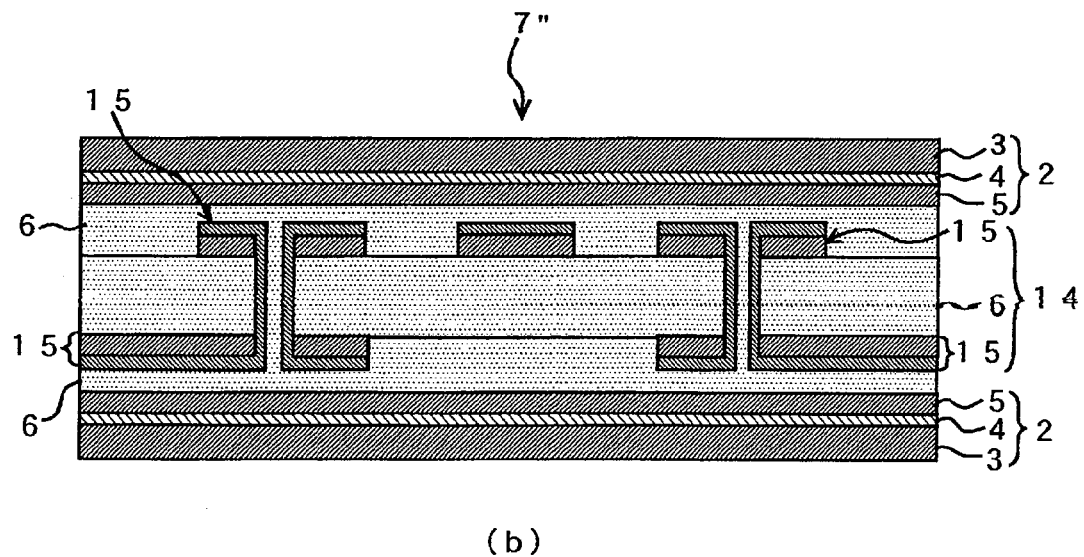

In this manufacturing process step, a case will be described in which a clad composite material is a start material and a so-called double-sided printed wiring board is manufactured. In particular, a first circuit and a second circuit having different thicknesses coexist only in a same reference plane on one surface side of the double-sided printed wiring board, and one of the first circuit and the second circuit is buried in an insulating layer, and the process step is characterized by comprising the following step 5-a to step 5-d. FIG. 19 to FIG. 21 are referred to in the following description.

Step 5-a: this clad composite material etching step is the same as described above, in which the clad composite material 2 shown in FIG. 19(a) is a start material and the clad composite material with a first circuit pattern 11 shown in FIG. 19(b) is manufactured by the process shown in FIG. 8. Also in this manufacturing process step, the clad composite material with a second circuit pattern 11' shown in FIG. 8(d) may be used. However, the difference for the following steps between the case of using the clad composite material with a first circuit pattern 11 and the case of using the clad composite material with a second circuit pattern 11' is the difference shown in FIG. 9 and FIG. 10 in a comparative manner, which can be easily understood by those skilled in the art. Thus, the following steps will be described only with the clad composite material with a first circuit pattern 11. Therefore, the clad composite material is simply referred to as a "clad composite material with circuit pattern 11".

The bonding surface of the clad composite material with circuit pattern 11, 11' to the base material 6 is previously subjected to bond enhansing treatment in order to improve adhesion to the base material, so that generation of faults such as delamination and measling due to heat shock after forming the printed wiring board can be efficiently prevented. The bond enhansing treatment referred to here is the same as described above.

Step 5-b: in this laminating step, the clad composite material with circuit pattern 11 and the copper foil 12 are used and laminated as shown in FIG. 19(c) and bonded to respective surfaces of the base material constituting the insulating layer to form a double-sided metal-clad laminate 7' as shown in FIG. 20(d).

If the forming step of a pass for interlayer connection is provided, as shown in FIG. 20(e), a through hole or via hole 22 is formed for assuring electrical connection between the clad composite material with circuit pattern 11 and the copper foil 12 located on both surfaces of the insulating layer 6 of the double-sided metal-clad laminate 7'. This forming method is the same as described above and the description is not repeated here.

Step 5-c: in the first copper etching step, etching resist layers 10 are formed on the first copper layer of the clad composite material located on one surface side of the insulating layer and on the copper foil layer on the other surface side, and circuit pattern for etching is exposed and developed as shown in FIG. 20(f) to etch the first copper layer and the copper foil located on the outer layers into desired circuit patterns with a copper selective etching solution, and then etching resist releasing is performed to expose the different kind of metal layer 4 as shown in FIG. 21(g).

Step 5-d: in this first different kind of metal etching step, after the first copper etching step is finished, the different kind of metal layer 4 exposed between the circuits temporarily formed on the outer layer is etched away with a different kind of metal selective etching solution to form the first circuit 8, the second circuit 9, and a copper foil circuit 13, so that a printed wiring board 1f is obtained as shown in FIG. 21(h).

Now, manufacturing process steps of a multilayer printed wiring board will be described. The manufacturing flow of the multilayer printed wiring board is basically the same as the manufacturing flow of the double-sided printed wiring board and therefore it is considered that explicit description is less necessary. This is because it is only required to replace the base material 6 used in manufacturing the double-sided metal-clad laminate described above by an "inner layer core material" and "base materials disposed on both surfaces of the inner layer core material". However, in order to make it clear that the multilayer printed wiring board is included in the scope of the present invention, the manufacturing process steps of the multilayer printed wiring board will be described below.

<Manufacturing Process Step (1) of Multilayer Printed Wiring Board>

In this manufacturing process step, a manufacturing process step of a multilayer printed wiring board will be described which comprises a circuit layer in which a first circuit and a second circuit having different thicknesses coexist in a same reference plane of an insulating layer located on a surface of an inner layer core material comprising an inner layer circuit. The method for manufacturing the multilayer printed wiring board referred to here is characterized by comprising the following step 6-a to step 6-e. FIG. 22 to FIG. 25 are referred to in the following description.

Step 6-a: in this laminating step, the clad composite material is laminated on one surface or both surfaces of the inner layer core material via an insulating layer constituting material such as a pre-preg to form a multilayer metal-clad laminate. FIG. 22(a) shows a laminating image in the case where clad composite materials 2 are bonded to an inner layer core material 14 on both surfaces via base materials constituting insulating layers 6. Then, hot pressing is performed to form a multilayer metal-clad laminate 7" shown in FIG. 22(b). Although the inner layer core material 14 comprises inner layer circuits 15 and has via holes in this illustration, there is no particular limitation on the type of the inner layer core material and a various materials can be used such as a so-called rigid substrate or flexible substrate.

Then, in order to assure electrical connection between the clad composite materials 2 and the inner layer circuits 15 which are conductor layers on both surfaces of the multilayer metal-clad laminate, through holes or via holes 22 are formed and plating treatment is performed in the holes to assure electrical connection between the layers, as shown in FIG. 23(c). In this interlayer connection pass forming, plating is employed as described above and plating layers 23 are formed by catalyzing, electroless copper plating, and electroplating. Thus, generally, the plating layers 23 are formed also on the surfaces of the first copper layers on the outer layers. However, this interlayer connection pass forming is not an indispensable step and may be unnecessary depending on board designs.

Step 6-b: in this first copper etching step, as shown in FIG. 23(d), the etching resist layers 10 are formed on the first copper layers 3 located on the outer layers of the multilayer metal-clad laminate 7", and circuit pattern for etching is exposed and developed to etch the first copper layers located on the outer layers into desired circuit patterns with a copper selective etching solution, and then etching resist releasing is performed to form the temporary circuits 21 and expose the different kind of metal layers 4, in area where unnecessary first copper layers is removed, as shown in FIG. 23(e).

Figure 23:
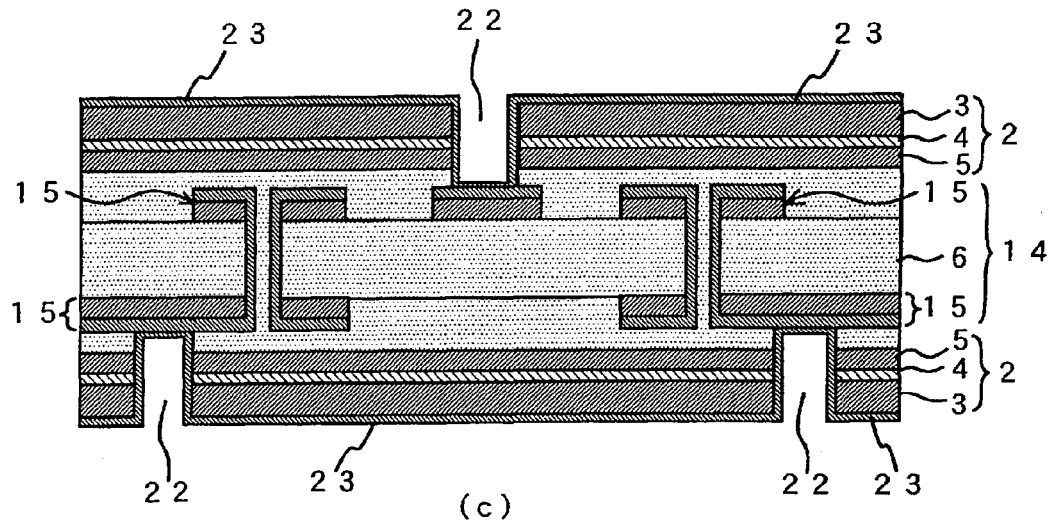
FIG. 23 is a flow diagram showing process steps for manufacturing the printed wiring board according to the present invention.
Figure 23:
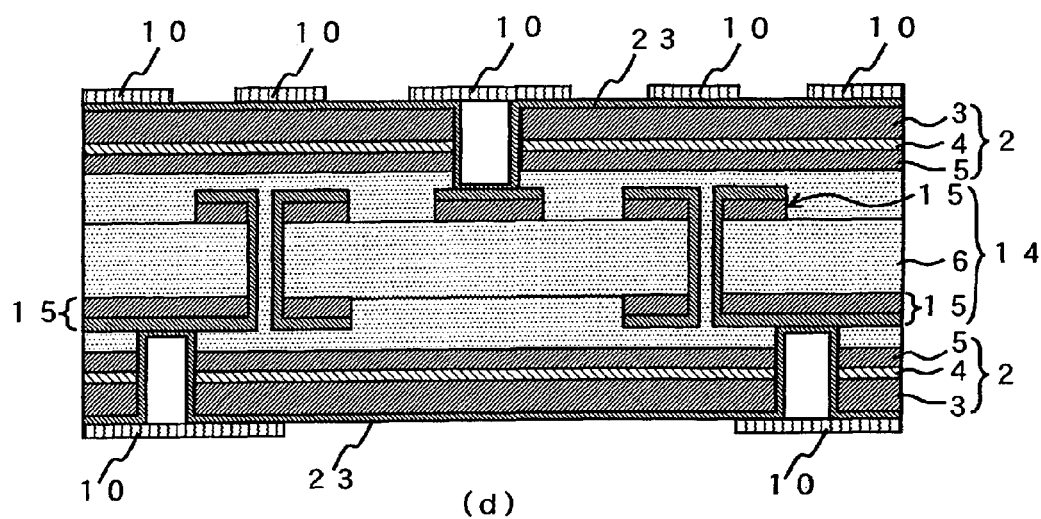
Figure 23:
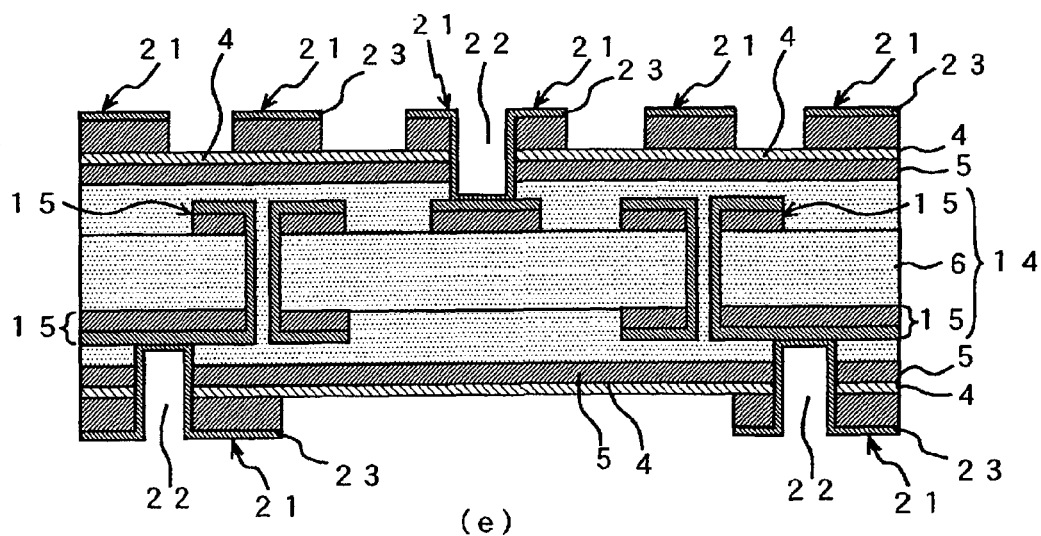

Step 6-c: in this first different kind of metal etching step, after the first copper etching step is finished, the different kind of metal layers 4 exposed between the temporary circuits 21 formed on the outer layers are etched away with a different kind of metal selective etching solution, as shown in FIG. 23(*f*).

Figure 24:
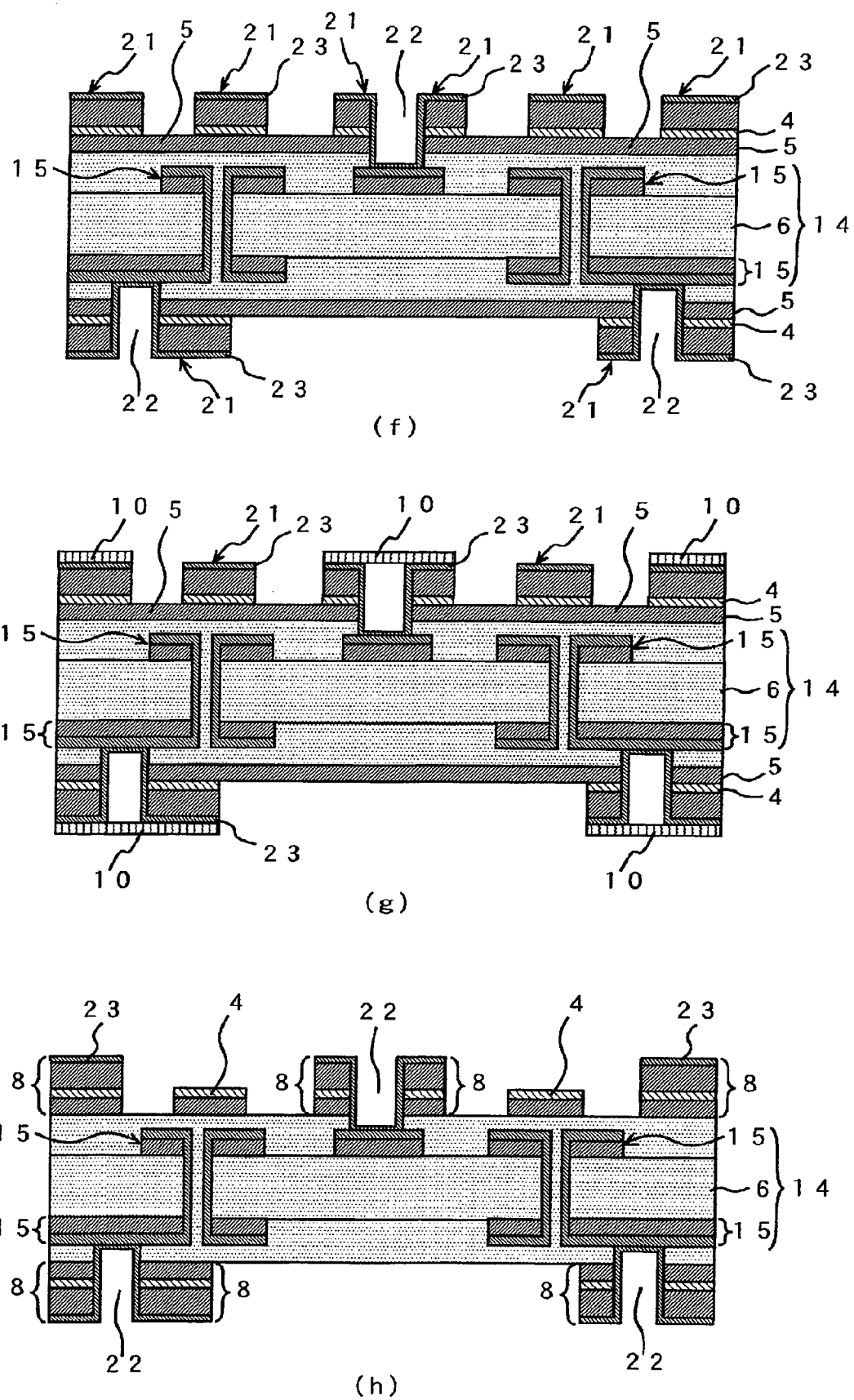
FIG. 24 is a flow diagram showing process steps for manufacturing the printed wiring board according to the present invention.

Step 6-d: in this second copper etching step, after the first different kind of metal etching step is finished, as shown in FIG. 24(*g*), the etching resist layers 10 are again formed only on area which is to be the first circuit, and etching is performed with the copper selective etching solution to etch away area of the first copper layer where no etching resist layer 10 is present, and then etching resist releasing is performed to form the first circuits 8 and the second circuit still having the different kind of metal layer 4, as shown in FIG. 24(*h*).

Figure 25:
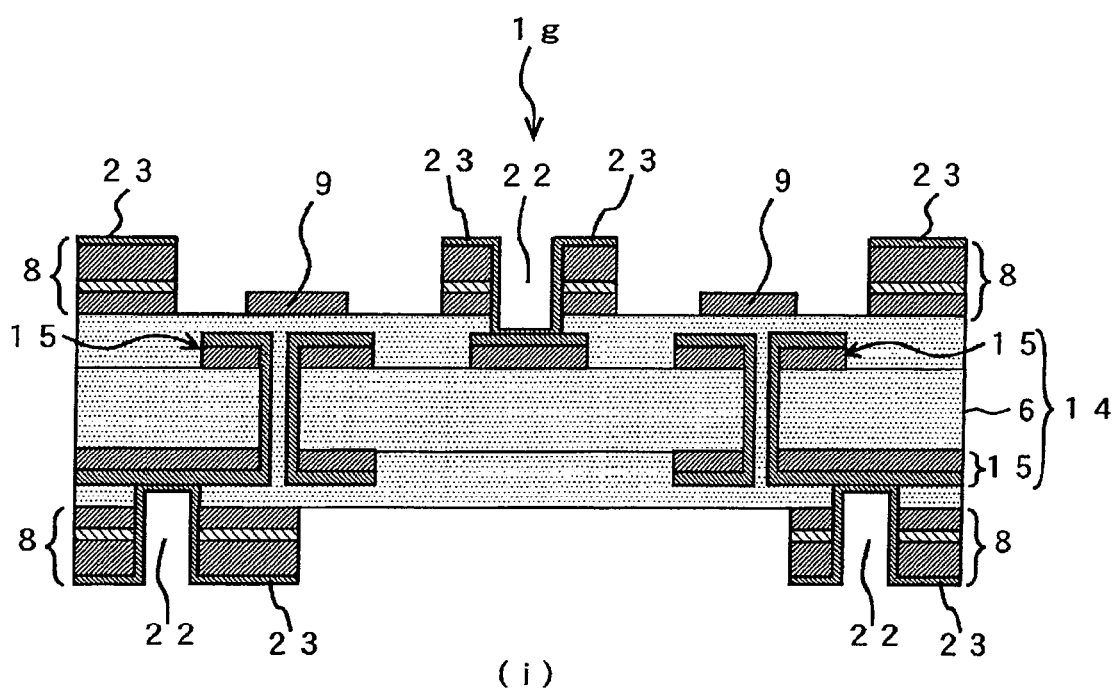
FIG. 25 is a flow diagram showing process steps for manufacturing the printed wiring board according to the present invention.

Step 6-e: in this second different kind of metal etching step, only the different kind of metal layer 4 on the surface of the second circuit is removed with the different kind of metal selective etching solution to form the shape of the second circuit 9, so that a multilayer printed wiring board 1*g* is obtained as shown in FIG. 25(*i*).

<Manufacturing Process Step (2) of Multilayer Printed Wiring Board>

Figure 26:
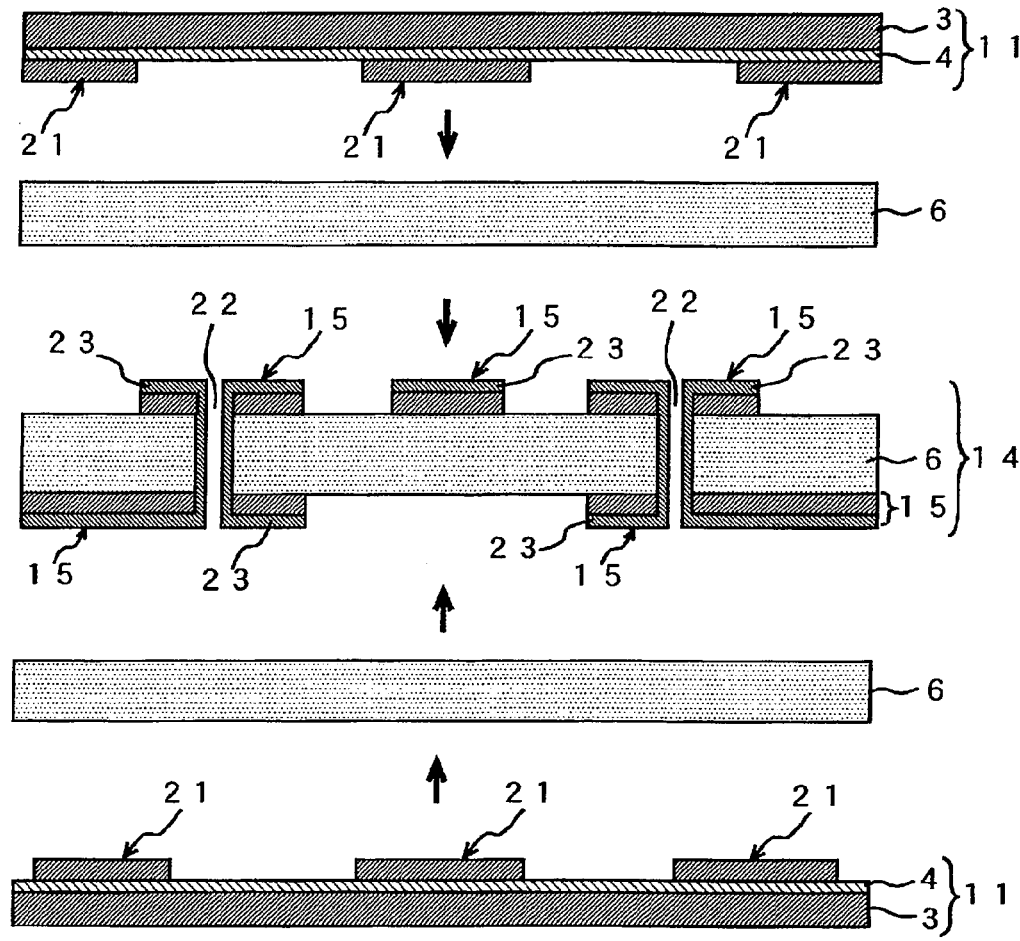
FIG. 26 is a flow diagram showing process steps for manufacturing the printed wiring board according to the present invention.
Figure 26:
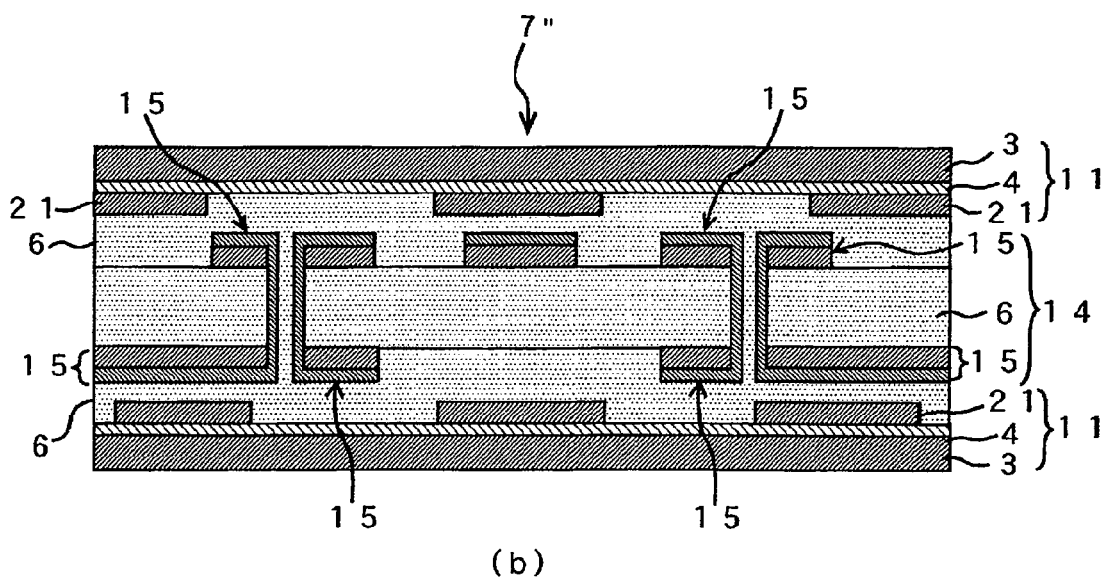
Figure 27:
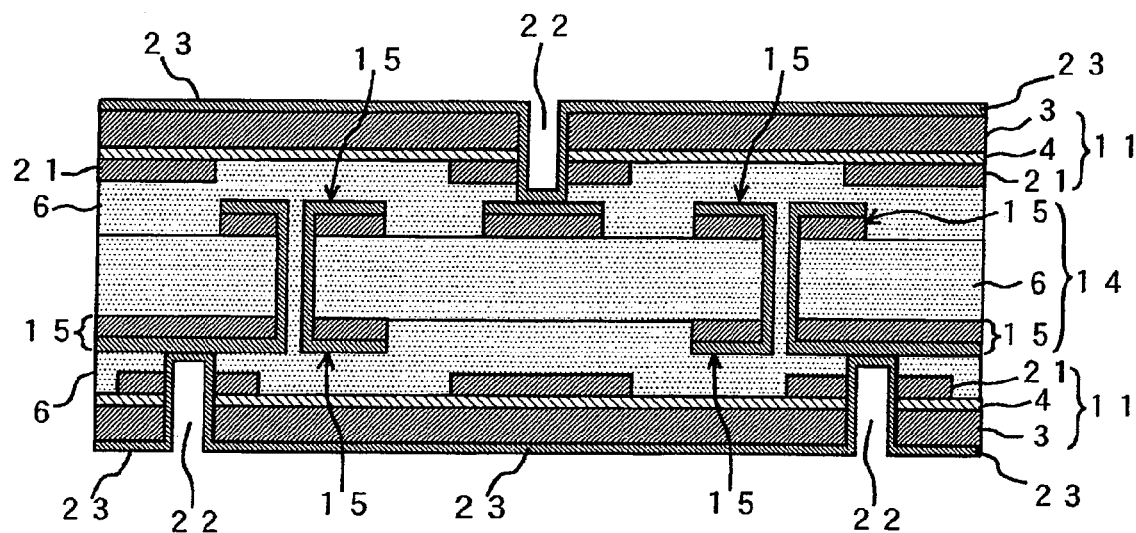
FIG. 27 is a flow diagram showing process steps for manufacturing the printed wiring board according to the present invention.
Figure 27:
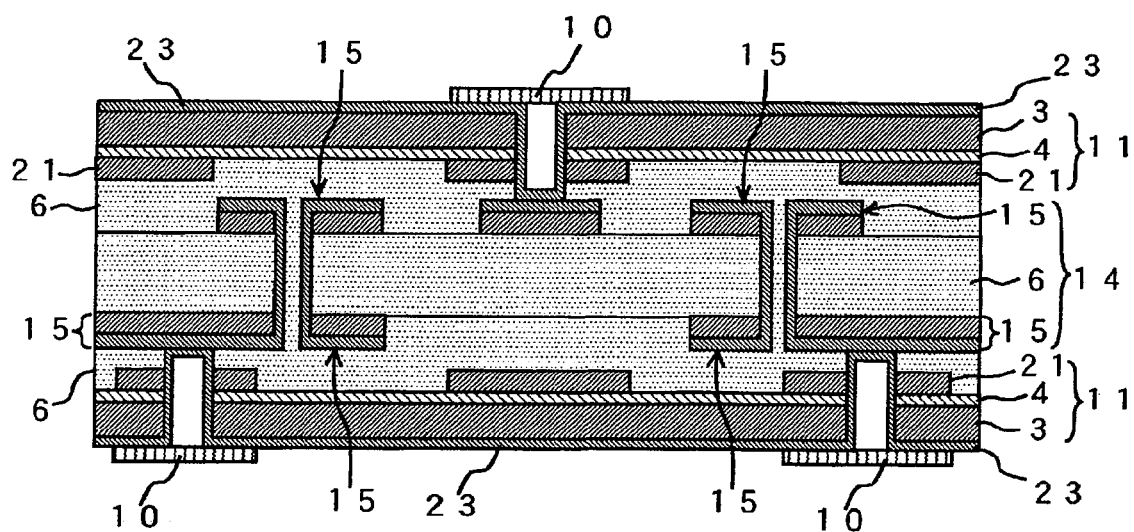
Figure 28:
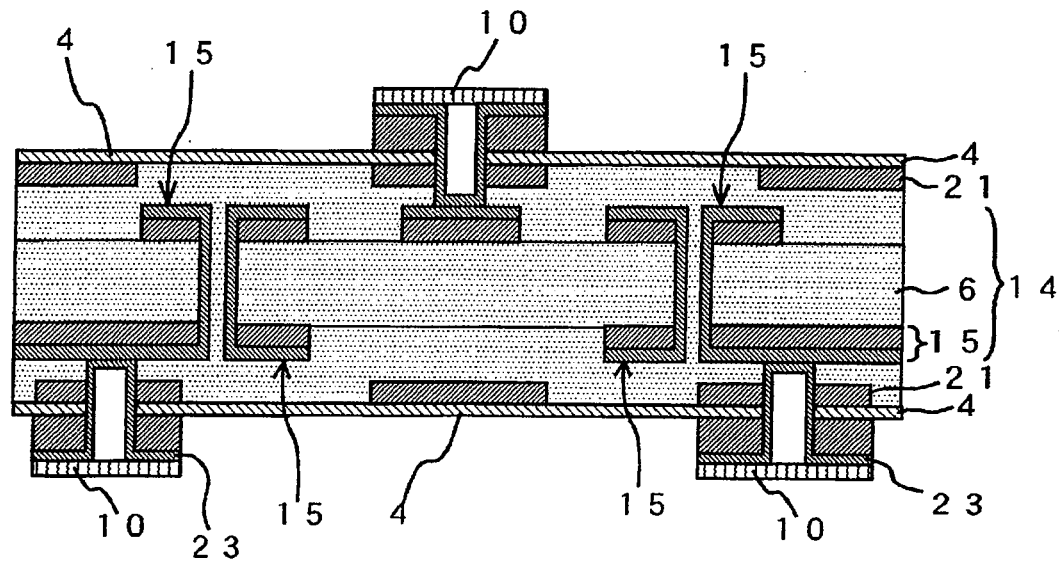
FIG. 28 is a flow diagram showing process steps for manufacturing the printed wiring board according to the present invention.
Figure 28:
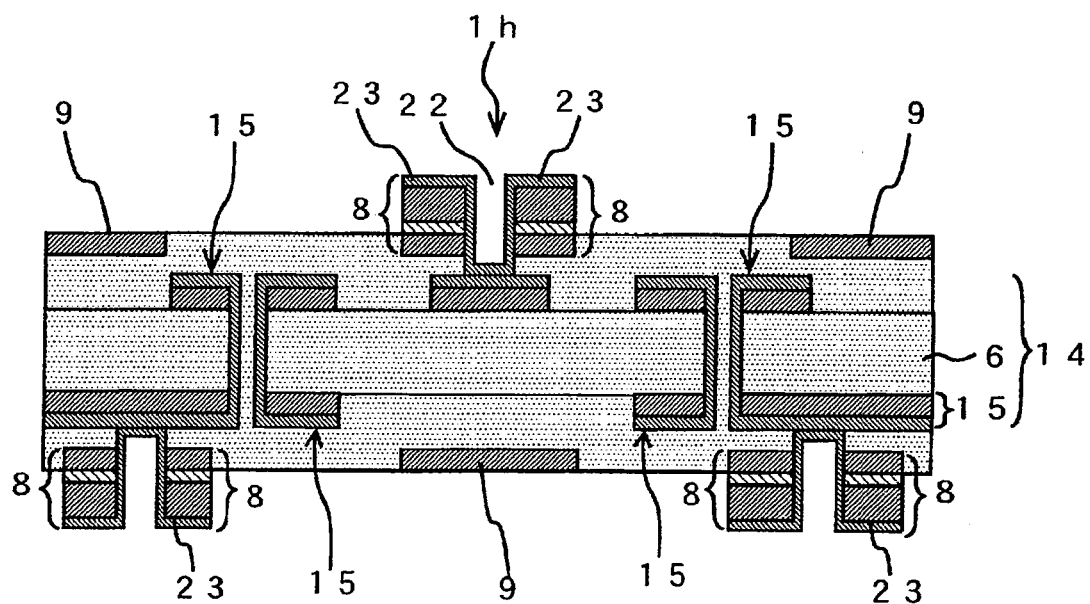

In this manufacturing process step, a manufacturing process step of a multilayer printed wiring board will be described in which a first circuit and a second circuit having different thicknesses coexist in a same reference plane of an insulating layer located on a surface of an inner layer core material comprising an inner layer circuit and one of the circuits is buried in the insulating layer. The method for manufacturing the multilayer printed wiring board referred to here is characterized by comprising the following step 7-a to step 7-d. FIG. 26 to FIG. 28 are referred to in the following description.

Step 7-a: this clad composite material etching step is the same as described above and it is a step of manufacturing a clad composite material with circuit pattern 11 in which clad composite materials 2 shown in FIG. 26(*a*) comprise the temporary circuits 21 by the process shown in FIG. 8. Therefore, the description will be omitted here.

Also in this manufacturing process step, the clad composite material with a second circuit pattern 11' shown in FIG. 8(*d*) may be used. However, the difference for the following steps between the case of using the clad composite material with a first circuit pattern 11 and the case of using the clad composite material with a second circuit pattern 11' is the difference shown in FIG. 9 and FIG. 10 in a comparative manner, which can be easily understood by those skilled in the art. Thus, the following steps will be described only with the clad composite material with a first circuit pattern 11. Therefore, the clad composite material is simply referred to as a "clad composite material with circuit pattern 11".

The bonding surface of the clad composite material with circuit pattern 11, 11' to the base material 6 is previously subjected to bond enhansing treatment in order to improve adhesion to the base material, so that generation of faults such as delamination and measling due to heat shock after forming the printed wiring board can be efficiently prevented. The bond enhansing treatment referred to here is the same as described above.

Step 7-b: in this laminating step, the etched circuit pattern surface of the clad composite material with circuit pattern 11 is placed onto a base material surface and laminated on one surface or both surfaces of the inner layer core material via an insulating layer constituting material such as pre-preg, to form a multilayer metal-clad laminate. FIG. 26(*a*) shows a laminating image in the case where the clad composite material with circuit patterns 11 are bonded to an inner layer core material 14 on both surfaces via base materials constituting insulating layers 6. Then, hot pressing is performed to form a multilayer metal-clad laminate 7″ in which the temporary circuits 21 on the etched circuit pattern surfaces of the clad composite material with circuit patterns 11 are buried in the insulating layers 6, as shown in FIG. 26(*b*). Although the inner layer core material 14 referred to here also comprises inner layer circuits 15 and has via holes in this illustration, there is no particular limitation on the type of the inner layer core material and a various materials can be used such as a so-called rigid substrate or flexible substrate.

As can seen from FIG. 26(*b*), in order to assure electrical connection between the clad composite materials 2 and the inner layer circuits 15 which are conductor layers on both surfaces, through holes or via holes 22 are formed and plating treatment is performed in the holes to assure electrical connection between the layers as shown in FIG. 27(*c*). In this interlayer connection pass forming, plating is employed as described above and plating layers 23 are formed by catalyzing, electroless copper plating, and electroplating. Thus, generally, the plating layers 23 are formed also on the surfaces of the first copper layers on the outer layers. However, this interlayer connection pass forming is not an indispensable step and may be unnecessary depending on board designs.

Step 7-c: in this first copper etching step, as shown in FIG. 27(*d*), the etching resist layers 10 are formed on the first copper layers 3 located on the outer layers of the multilayer metal-clad laminate 7″, and circuit pattern for etching is exposed and developed to etch the first copper layers located on the outer layers into desired circuit patterns with a copper selective etching solution, and then etching resist releasing is performed to form the temporary circuits 21 and expose the different kind of metal layers 4, in area where unnecessary first copper layers is removed, as shown in FIG. 28(*e*).

Step 7-d: in this first different kind of metal etching step, after the first copper etching step is finished, the different kind of metal layers 4 exposed between the temporary circuits 21 formed on the outer layers are etched away with a different kind of metal selective etching solution to simultaneously finish the first circuits 8 and the second circuits 9, so that a multilayer printed wiring board 1*h* is obtained as shown in FIG. 28(*f*).

<Other Aspects in Manufacturing>

In the clad composite material used in the above described manufacturing method, in order to manufacture the printed wiring board according to the present invention, it is preferable to use one of nickel, tin, aluminum, titanium, and their alloy which can be selectively etched against to copper, for the different kind of metal layer. This has been already described above.

Further, for the clad composite material, it is preferable to use a configuration of a first copper layer/a different kind of metal layer/a second copper layer in which total thickness is 10 μm to 2000 μm and the thickness of the different kind of metal layer is 0.01 μm to 5 μm. If the thickness of the different kind of metal layer in this case is below 0.01 μm, the layer can not perform function as a barrier against a copper etching solution. On the other hand, if the thickness of the different kind of metal layer is above 5 μm, the layer can not be easily removed by etching.

Further, for the clad composite material, it is also preferable to use a configuration of a first copper layer/a different kind of metal layer/a second copper layer in which the total thickness of the three layers is 10 μm to 2000 μm, sum of the thickness of the first copper layer and the second copper layer is 1 μm to 1600 μm, and the different kind of metal layer has the thickness of 50% to 80% of the total thickness of the clad composite material and is constituted from a metal material which can be selectively etched against to copper. In particular, in the case of manufacturing a lightweight printed wiring board, it is preferable to use aluminum base component having the thickness of 50% to 80% of the total thickness of the clad composite material. Thus, if the total thickness of the clad composite material is 10 μm to 2000 μm, it is more preferable that sum of the thickness of the first copper layer and the second copper layer is 5 μm to 1600 μm. In this way, a large amount of the component which is lighter than copper is used as the metal component constituting the conductor layer, so that total weight of the printed wiring board is reduced. For the different kind of metal layer in this case, it is conceivable to employ aluminum or aluminum base alloy such as duralumin. However, molybdenum base alloy is also preferable as the alloy which is lighter than copper. Further, the lower limit value of the thickness of the different kind of metal layer in this case is 50% of the total thickness of the clad composite material. This is determined considering that this thickness is the minimal thickness for achieving weight reduction effect which can be clearly recognized, because the weight of the base material is present in the case of the printed wiring board. On the other hand, if the thickness of the different kind of metal layer is above 80% of the total thickness of the clad composite material, the thickness of the conductor through which current flows actually is reduced, which can cause unexpected resistive heat generation.

Example 1

In this example, a single-sided printed wiring board 1a shown in FIG. 4(h) was manufactured. Each step will be separately described below and FIG. 2 to FIG. 4 are referred to in the description.

Step 1-a: in this laminating step, a clad composite material 2 was used in which three layers of a first copper layer (80 μm)/a different kind of metal layer (1 μm nickel layer)/a second copper layer (80 μm) were sequentially stacked. The bonding surface of this clad composite material 2 to a base material was subjected to black oxide treatment as bond enhansing treatment, by means of a known approach. As shown in FIG. 2(a), this clad composite material 2 (the first copper layer the different kind of metal layer 4, the second copper layer 5) was bonded to a base material 6 (a FR-4 grade glass-epoxy pre-preg having the thickness of 210 μm) constituting an insulating layer by hot pressing with the order of 180□C □60 minutes, to form a metal-clad laminate 7 in FIG. 2(b). The clad composite material used here was made by forming a nickel layer on one surface of one sheet of copper foil by plating, laying another copper foil over the nickel layer, and cladded them by rolling.

Step 1-b: in this first copper etching step, as shown in FIG. 2(c), an etching resist layer 10 was formed with a dry film on the first copper layer 3 located on the outer layer of the metal-clad laminate 7, and a circuit pattern for etching was exposed and developed to etch the first copper layer 3 located on the outer layer into a desired circuit pattern (temporary circuits 21) with a copper selective etching solution (ammonia base alkaline copper etching solution: A-Process manufactured by Meltex Inc. The same applies in the following description). Thereafter, etching resist releasing by swelling with an alkaline solution was performed after removing unnecessary first copper layer, form the temporary circuits 21, and expose the different kind of metal layer 4, as in FIG. 3(d).

Step 1-c: in this first different kind of metal etching step, after the first copper etching step was finished, the different kind of metal layer 4 exposed between the temporary circuits 21 formed on the outer layer was etched away with a different kind of metal selective etching solution (nickel remover manufactured by MEC Co., Ltd.), as shown in FIG. 3(e).

Step 1-d: in this second copper etching step, after the first different kind of metal etching step was finished, as shown in FIG. 3(f), the etching resist layer 10 was again formed with a liquid resist only on area which is to be the first circuit, and etching was performed with the copper selective etching solution (ammonia base alkaline copper etching solution) to etch away area where no etching resist layer 10 is present, so that the shape of the first circuit 8 was finished and a second circuit 9 still having the different kind of metal layer was formed, and then etching resist releasing was performed to expose the different kind of metal layer 4 of the second circuit 9.

Step 1-e: further, in the second different kind of metal etching step, only the different kind of metal layer 4 on the surface of the second circuit was removed with the different kind of metal selective etching solution (nickel remover manufactured by MEC Co., Ltd.) to form the final shape of the second circuit 9, so that the printed wiring board 1a shown in FIG. 4(h) was obtained. Both the first circuit 8 and the second circuit 9 in this case project from the insulating layer surface, and the thickness of the first circuit is 161 μm and the thickness of the second circuit is 80 μm. In the printed wiring board in which the circuits project with these thicknesses from the substrate surface, the first circuit can be used as a power supply circuit or the like, so that heat accumulation in the insulating layer of the substrate can be prevented and heat can be efficiently spreaded to the surrounding atmosphere, even if heat generation is great.

Example 2

In this example, a double-sided printed wiring board 1b shown in FIG. 7(h) was manufactured. Each step will be separately described below and FIG. 5 to FIG. 7 are referred to in the description.

Step 1-a: in this laminating step, a clad composite material 2 was used in which three layers of a first copper layer (80 μm)/a different kind of metal layer (1 μm nickel layer)/a second copper layer (80 μm) were sequentially stacked. The bonding surface of this clad composite material 2 to a base material was subjected to black oxide treatment as bond enhansing treatment, by means of a known approach. As shown in FIG. 5(a), the clad composite materials 2 (the first copper layers 3, the different kind of metal layers 4, the second copper layers 5) were bonded to both surfaces of a base material 6 (a FR-4 grade glass-epoxy pre-preg having the thickness of 210 μm) constituting an insulating layer by hot pressing with the order of 180° C.' 60 minutes, to form a metal-clad laminate 7' in FIG. 5(b). The clad composite material used here was also made by providing a nickel layer on one surface of one sheet of copper foil by plating, laying another copper foil over the nickel layer, and cladded them by rolling, as in example 1.

In the case of the double-sided metal-clad laminate 7' shown in FIG. 5(b), in order to assure electrical connection between the clad composite materials 2 which are conductor layers on both surfaces, a pierced holes having diameter of 200 μm were formed, and then desmear treatment, catalyzing with palladium catalyst, electroless copper plating, and electro-copper plating were sequentially performed to form plating layers 23 so that through holes 22 were formed to assure electrical connection between the layers as shown in FIG. 6(c).

Step 1-b: in this first copper etching step, as shown in FIG. 6(d), etching resist layers 10 were formed with dry films on the first copper layers 3 after the interlayer connection pass forming, and circuit pattern for etching was exposed and developed to etch the first copper layers 3 located on the outer layers into desired circuit patterns with a copper selective etching solution (ammonia base alkaline etching solution). Thereafter, etching resist releasing by swelling with an alkaline solution was performed after removing unnecessary first copper layers, form the temporary circuits 21, and expose the different kind of metal layers 4, as in FIG. 6(e). The copper selective etching solution described here was also used in the following steps.

Step 1-c: in this first different kind of metal etching step, after the first copper etching step was finished, the different kind of metal layers 4 exposed between the temporary circuits 21 formed on the outer layers were etched away with a different kind of metal selective etching solution (nickel remover manufactured by MEC Co., Ltd.), as shown in FIG. 7(f). The nickel base different kind of metal selective etching solution described here was also used in the following steps.

Step 1-d: in the second copper etching step, after the first different kind of metal etching step was finished, as shown in FIG. 7(g), the etching resist layers 10 were again formed with a liquid resist only on area which is to be the first circuit, and etching was performed with the copper selective etching solution to etch away area of first copper layers where no etching resist layer 10 is present, so that the shapes of the first circuits 8 were finished and the second circuit 9 still having the different kind of metal layer 4 was formed, and then etching resist releasing was performed to expose the different kind of metal layer 4 of the second circuit 9.

Step 1-e: further, in the second different kind of metal etching step, only different kind of metal layer 4 on the surface of the second circuit was removed with the different kind of metal selective etching solution to form the final shape of the second circuit 9, so that the double-sided printed wiring board 1b as shown in FIG. 7(h) was obtained. Both the first circuits 8 and the second circuit 9 project from the insulating layer surface, and the thickness of the first circuit is 161 μm and the thickness of the second circuit is 80 μm. In the printed wiring board in which the circuits project with these thicknesses from the substrate surface, the first circuits can be used as circuits for power supply or the like, so that heat accumulation in the insulating layer of the substrate can be prevented and heat can be efficiently spreaded to the surrounding atmosphere, even if heat generation is great.

Example 3

In this example, a single-sided printed wiring board 1c shown in FIG. 10(i-I) was manufactured. The single-sided printed wiring board comprises a circuit layer in which a first circuit and a second circuit having different thicknesses coexist in a same reference plane, and one circuit is buried in an insulating layer. Each step will be separately described below and FIG. 8 to FIG. 10 are referred to in the description.

Step 2-a: in this clad composite material etching step, a clad composite material 2 shown in FIG. 8(a) was used in which three layers of a first copper layer (300 μm)/a different kind of metal layer (1 μm nickel layer)/a second copper layer (80 μm) were sequentially stacked. In this case, etching resist layers 10 were formed on both surfaces of the clad composite material 2 by laminating dry films, and a circuit pattern for etching for forming temporary circuits 21 was exposed and developed only on the etching resist layer of the second copper layer as shown in FIG. 8(b) to etch the second copper layer 5 located on the outer layer into a desired circuit pattern with a copper selective etching solution (ammonia base alkaline copper etching solution), and then etching resist releasing was performed to obtain a first clad composite material with circuit pattern 11 shown in FIG. 8(c). The bonding surface of the clad composite material with a first circuit pattern 11 to a base material was subjected to black oxide treatment as bond enhansing treatment, by means of a known approach.

Step 2-b: in this laminating step, as shown in FIG. 9(e-I), the etched circuit pattern surface of the clad composite material with circuit pattern 11 obtained in the clad composite material etching step, on which the temporary circuits 21 were formed, was placed onto a surface of a base material 6 (a FR-4 grade glass-epoxy pre-preg having the thickness of 210 μm) and bonded to one surface of the base material by hot pressing with the order of 180° C.' 60 minutes, to form a metal-clad laminate 7 in which the etched pattern of the temporary circuits 21 was buried in the insulating layer 6, as shown in the FIG. 9(f-I).

Step 2-c: in this first copper etching step, as shown in FIG. 9(g-I), an etching resist layer 10 was formed with a dry film on the first copper layer 3 on the outer layer surface of the metal-clad laminate 7, and a circuit pattern for etching was exposed and developed to etch the first copper layer 3 located on the outer layer into a desired circuit pattern (temporary circuits 21) with a copper selective etching solution (ammonia base alkaline copper etching solution), and then etching resist releasing by swelling with an alkaline solution was performed after removing unnecessary first copper layer 3, form the temporary circuits 21, and expose a part of the different kind of metal layer 4, as shown in FIG. 10(h-I).

Step 2-d: in this different kind of metal etching step, after the first copper etching step was finished, the different kind of metal layer was etched away with a different kind of metal selective etching solution (nickel remover manufactured by MEC Co., Ltd.) to form the first circuit 8 and the second circuit 9, so that the printed wiring board 1c as shown in FIG. 10(i-I) was obtained. In this case, the second circuit 9 is buried in the insulating layer and a part of the first circuit 8 projects from the insulating layer surface, and the thickness of the first circuit is 381 μm and the thickness of the second circuit is 80 μm. In the printed wiring board in which the circuits project with these thicknesses from the substrate surface, the first circuit can be used as a power supply circuit or the like, so that heat accumulation in the insulating layer of the substrate can be prevented and heat can be efficiently spreaded to the surrounding atmosphere, even if heat generation is great.

Example 4

In this example, a single-sided printed wiring board 1c shown in FIG. 10(i-II) was manufactured. This single-sided printed wiring board comprises a circuit layer in which a first circuit and a second circuit having different thicknesses coexist in a same reference plane, and one circuit is buried in an insulating layer. Each step will be separately described below and FIG. 8 to FIG. 10 are referred to in the description.

Step 2-a: in this clad composite material etching step, a clad composite material 2 shown in FIG. 8(a) was used in which three layers of a first copper layer (300 μm)/a different kind of metal layer (1 μm nickel layer)/a second copper layer (80 μm) were sequentially stacked. In this case, etching resist layers 11 were formed on both surfaces of the clad composite material 2 by laminating dry films, and a circuit pattern for etching for forming temporary circuits 21 was exposed and developed only on the etching resist layer of the second copper layer as shown in FIG. 8(b) to etch the second copper layer 5 located on the outer layer into a desired circuit pattern with a copper selective etching solution, and then etching resist releasing was performed to obtain a first clad composite material with circuit pattern 11 shown in FIG. 8(c). Further, the different kind of metal layer exposed between the temporary circuits 21 was removed with a different kind of metal selective etching solution to obtain a second clad composite material with circuit pattern 11' shown in FIG. 8(d). The bonding surface of this second clad composite material with circuit pattern 11' to a base material was subjected to black oxide treatment as bond enhansing treatment, by means of a known approach.

Step 2-b: in this laminating step, as shown in FIG. 9(e-II), the etched circuit pattern surface of the clad composite material with a second circuit pattern 11' obtained in the clad composite material etching step, on which the temporary circuits 21 were formed, was placed onto a surface of a base material 6 (a FR-4 grade glass-epoxy pre-preg having the thickness of 210 µm) and bonded to one surface of the base material by hot pressing with the order of 180° C.' 60 minutes, to form a metal-clad laminate 7 in which the etched pattern of the temporary circuits 21 was buried in the insulating layer 6, as shown in FIG. 9(f-II).

Step 2-c: in this first copper etching step, as shown in FIG. 9(g-II), an etching resist layer 10 was formed with a dry film on the first copper layer 3 on the outer layer surface of the metal-clad laminate 7, and a circuit pattern for etching was exposed and developed to etch the first copper layer 3 located on the outer layer with a copper selective etching solution (ammonia base alkaline copper etching solution), and then etching resist releasing by swelling with an alkaline solution was performed after removing unnecessary first copper layer 3, form the first circuit 8, and expose the different kind of metal layer 4 on the second circuit, as in FIG. 10(h-II).

Step 2-d: in this different kind of metal etching step, after the first copper etching step was finished, the different kind of metal layer was etched away with a different kind of metal selective etching solution (nickel remover manufactured by MEC Co., Ltd.) to form the first circuit 8 and the second circuit 9, so that the printed wiring board 1c as shown in FIG. 10(i-II) was obtained. In this case, the second circuit 9 is buried in the insulating layer and a part of the first circuit 8 projects form the insulating layer surface, and the thickness of the first circuit is 381 µm and the thickness of the second circuit is 80 µm. In the printed wiring board in which the circuits project with these thicknesses from the substrate surface, the first circuit can be used as a power supply circuit or the like, so that heat accumulation in the insulating layer of the substrate can be prevented and heat can be efficiently spreaded to the surrounding atmosphere, even if heat generation is great.

Example 5

In this example, a double-sided printed wiring board 1d shown in FIG. 15(h) was manufactured. This double-sided printed wiring board comprises a circuit layer in which a first circuit and a second circuit having different thicknesses coexist in a same reference plane, and one circuit is buried in an insulating layer. Each step will be separately described below and FIG. 13 to FIG. 15 are referred to in the description.

Step 2-a: in this clad composite material etching step, the clad composite material with circuit pattern 11 shown in FIG. 13(b) was obtained as is in step 2-a of example 3.

Step 2-b: in this laminating step, two clad composite material with circuit patterns 11 shown in FIG. 13(b) obtained from the clad composite materials 2 shown in FIG. 13(a) were used, and the etched circuit pattern surfaces of the clad composite material with circuit patterns 11, on which the temporary circuits 21 were formed, were placed onto both surfaces of a base material 6 (a FR-4 grade glass-epoxy pre-preg having the thickness of 210 µm) and bonded to both surfaces of the base material by hot pressing with the order of 180° C.' 60 minutes as shown in FIG. 13(c), to form a double-sided metal-clad laminate 7' in which the temporary circuits 21 were buried in the insulating layer 6 as in FIG. 14(d).

Then, in the case of the double-sided metal-clad laminate 7' shown in FIG. 14(d), in order to assure electrical connection between the clad composite material with circuit patterns which are conductor layers on both surfaces, a pierced hole having diameter of 200 µm was formed, and then desmear treatment, catalyzing with palladium catalyst, electroless copper plating, and electro-copper plating were sequentially performed to form plating layers 23, so that a through hole 22 was formed to assure electrical connection between the layers as shown in FIG. 14(e).

Step 2-c: in this first copper etching step, as shown in FIG. 14(f), etching resist layers 10 were formed with dry films on the first copper layers 3 on outer layer surfaces of the metal-clad laminate 7, and circuit pattern for etching was exposed and developed to etch the first copper layers 3 located on the outer layers into desired circuit patterns (temporary circuits 21) with a copper selective etching solution, and then etching resist releasing by swelling with an alkaline solution was performed after removing unnecessary first copper layers 3, form the temporary circuits 21, and expose parts of the different kind of metal layers 4, as in FIG. 15(g).

Step 2-d: in this different kind of metal etching step, after the first copper etching step was finished, the different kind of metal layers were etched away with a different kind of metal selective etching solution to form the first circuits 8 and the second circuits 9, so that the printed wiring board 1d as shown in FIG. 15(h) was obtained. In this case, the second circuits 9 are buried in the insulating layer and parts of the first circuits 8 project from the insulating layer surface, and the thickness of the first circuit is 381 µm and the thickness of the second circuit is 80 µm. In the printed wiring board in which the circuits project with these thicknesses from the substrate surface, the first circuits can be used as circuits for power supply or the like, so that heat accumulation in the insulating layer of the substrate can be prevented and heat can be efficiently spreaded to the surrounding atmosphere, even if heat generation is great.

Example 6

In this example, a single-sided printed wiring board 1c' shown in FIG. 12(e) was manufactured. This single-sided printed wiring board comprises a circuit layer in which a first circuit and a second circuit having different thicknesses coexist in a same reference plane and a part of one circuit is buried in an insulating layer. Each step will be separately described below and FIG. 11 and FIG. 12 are referred to in the description.

Step 3-a: in this clad composite material etching step, a clad composite material 2 shown in FIG. 8(a) was used in which three layers of a first copper layer (300 µm)/a different kind of metal layer (1 µm nickel layer)/a second copper layer (80 µm) were sequentially stacked. In this case, etching resist layers 11 were formed on both surfaces of the clad composite material 2 by laminating dry films, and a circuit pattern for etching for forming temporary circuits 21 was exposed and developed only on the etching resist layer of the second copper layer as shown in FIG. 8(b) to etch the second copper layer 5 located on the outer layer into a desired circuit pattern with a copper selective etching solution, and then etching resist releasing was performed to obtain a first clad composite material with circuit pattern 11 shown in FIG. 8(c). Further, the different kind of metal layer exposed between the temporary circuits 21 was removed with a different kind of metal selective etching solution to obtain a second clad composite material with circuit pattern 11' shown in FIG. 8(d) (=FIG. 11(a)). Furthermore, the bonding surface of this second clad composite material with circuit pattern 11' to a base material was subjected to black oxide treatment as bond enhancing treatment, by means of a known approach.

Step 3-b: in this laminating step, as shown in FIG. 11(b), the etched circuit pattern surface of the clad composite material with a second circuit pattern 11' obtained in the clad composite material etching step, on which the temporary circuits 21 were formed, was placed onto a surface of a base material 6 (a FR-4 grade glass-epoxy pre-preg having the thickness of 210 μm) and bonded to one surface of the base material by hot pressing with the order of 180° C.' 60 minutes, to form a metal-clad laminate 7 in which the etched pattern of the temporary circuits 21 was buried in the insulating layer 6, as shown in FIG. 11(c).

Step 3-c: in this first copper etching step, as shown in FIG. 12(d), an etching resist layer 10 was formed with a dry film on the first copper layer 3 on the outer layer surface of the metal-clad laminate 7, and a circuit pattern for etching was exposed and developed to etch the first copper layer 3 located on the outer layer with a copper selective etching solution (ammonia base alkaline copper etching solution), and then etching resist releasing by swelling with an alkaline solution was performed to simultaneously form the first circuit 8 and the second circuit 9, so that the printed wiring board 1c' as shown in FIG. 12(e) was obtained. In this case, the second circuit 9 projects from the insulating layer and a part of the first circuit 8 is buried in the insulating layer, and the thickness of the first circuit is 381 μm and the thickness of the second circuit is 300 μm. In such a printed wiring board, the first circuit can be used as a power supply circuit or the like, so that heat accumulation in the insulating layer of the substrate can be prevented and heat can be efficiently spreaded to the surrounding atmosphere, even if heat generation is great.

Example 7

In this example, a double-sided printed wiring board 1d shown in FIG. 15(h), which is a lightweight printed wiring board, was manufactured. This double-sided printed wiring board comprises a circuit layer in which a first circuit and a second circuit having different thicknesses coexist in a same reference plane, and one circuit is buried in an insulating layer. Each step will be separately described below and FIG. 13 to FIG. 15 are referred to in the description. However, in this example, a clad composite material 2 having a thick different kind of metal layer 4 is used, and therefore layer thickness of the different kind of metal layer is different from that in schematic cross-sectional views in FIG. 13 to FIG. 15 and the resultant printed wiring board is that as shown in FIG. 1 (1d).

Step 2-a: in this clad composite material etching step, instead of the clad composite material used in example 3, a clad composite material 2 was used in which three layers of a first copper layer (80 μm)/a different kind of metal layer (500 μm aluminum layer)/a second copper layer (80 μm) were sequentially stacked, and a clad composite material with circuit pattern 11 was obtained by the manufacturing flow shown in FIG. 8.

Step 2-b: in this laminating step, as in example 4, two clad composite material with circuit patterns 11 shown in FIG. 13(b) obtained from the clad composite materials 2 shown in FIG. 13(a) were used, and the etched circuit pattern surfaces of the clad composite material with circuit patterns 11, on which the temporary circuits 21 were formed, were placed onto both surfaces of a base material 6 (a FR-4 grade glass-epoxy pre-preg having the thickness of 210 μm) as shown in FIG. 13(c) and bonded to both surfaces of the base material by hot pressing with the order of 180° C.' 60 minutes, to form a double-sided metal-clad laminate 7' in which the temporary circuits 21 were buried in the insulating layer 6 as in FIG. 14(d)

Then, in the case of the double-sided metal-clad laminate 7' shown in FIG. 14(d), in order to assure electrical connection between the clad composite material with circuit patterns which are conductor layers on both surfaces, a pierced hole having diameter of 200 μm was formed, and desmear treatment, catalyzing with palladium catalyst, electroless copper plating, and electro-copper plating were sequentially performed to form plating layers 23, so that a through hole 22 was formed to assure electrical connection between the layers as shown in FIG. 14(e).

Step 2-c: in this first copper etching step, as shown in FIG. 14(f), etching resist layers 10 were formed with dry films on the first copper layers 3 on the outer layer surfaces of the metal-clad laminate 7, and circuit pattern for etching was exposed and developed to etch the first copper layers 3 located on the outer layers into desired circuit patterns (temporary circuits 21) with a copper selective etching solution (acid base copper etching solution), and then etching resist releasing by swelling with an alkaline solution was performed after removing unnecessary first copper layers 3, form the temporary circuits 21, expose parts of the different kind of metal layers 4, as in FIG. 15(g).

Step 2-d: in this different kind of metal etching step, after the first copper etching step was finished, the different kind of metal layers were etched away with a different kind of metal selective etching solution (sodium hydroxide base alkaline etching solution) to form the first circuits 8 and the second circuits 9, so that the printed wiring board 1d as shown in FIG. 15(h) was obtained. In this case, the second circuits 9 are buried in the insulating layer and parts of the first circuits 8 project from the insulating layer surface, and the thickness of the first circuit is 660 μm and the thickness of the second circuit is 80 μm. In the printed wiring board in which the circuits project with these thicknesses from the substrate surface, the first circuits can be used as circuits for power supply or the like, so that heat accumulation in the insulating layer of the substrate can be prevented and heat can be efficiently spreaded to the surrounding atmosphere, even if heat generation is great. Further, in the printed wiring board obtained in this example, weight reduction on the order of 30% was achieved in comparison to the case where the conductor layer is mostly constituted from copper.

Example 8

In this example, a case will be described in which a clad composite material 2 is a start material and a double-sided printed wiring board 1e shown in FIG. 18(i) is manufactured. In this double-sided printed wiring board 1e, a first circuit and a second circuit having different thicknesses coexist only in a same reference plane on one surface side of the printed wiring board. Each step will be separately described below and FIG. 16 to FIG. 18 are referred to in the description.

Step 4-a: in this laminating step, as shown in FIG. 16(a), a clad composite material 2 (a first copper layer (300 μm)/a different kind of metal layer (1 μm nickel layer)/a second copper layer (80 μm)) and a conventional copper foil 12 were placed onto both surfaces of a base material 6 (a FR-4 grade glass-epoxy pre-preg having the thickness of 210 μm) constituting an insulating layer and bonded to respective one surface side by hot pressing with the order of 180° C.' 60 minutes, to form a double-sided metal-clad laminate 7' shown in FIG. 16(b).

Then, in order to assure electrical connection between the clad composite material 2 and the copper foil 12 which are conductor layers on both surfaces of the double-sided metal-clad laminate 7' shown in FIG. 16(b), pierced holes having diameter of 200 μm were formed, and then desmear treatment, catalyzing with palladium catalyst, electroless copper plating, and electro-copper plating were sequentially performed to form plating layers 23, so that through holes 22 were formed to assure electrical connection between the layers as shown in FIG. 16(c).

Step 4-b: in this first copper etching step, as shown in FIG. 17(d), etching resist layers 10 were formed with dry films on the first copper layer 3 of the clad composite material 2 located on one surface side of the insulating layer and on the copper foil layer 12 on the other surface side, and circuit pattern for etching was exposed and developed to etch the first copper layer 3 and the copper foil 12 located on the outer layers into desired circuit patterns (temporary circuits 21) with a copper selective etching solution (ammonia base alkaline copper etching solution), and then etching resist releasing was performed after removing unnecessary first copper layer 3, form the temporary circuits 21, and expose the different kind of metal layer 4 between the temporary circuits 21, and form the copper foil 12 into a desired circuit pattern, as shown in FIG. 17(e).

Step 4-c: in this first different kind of metal etching step, after the first copper etching step was finished, the different kind of metal layer 4 exposed between the temporary circuits 21 formed on the outer layer was etched away with a different kind of metal selective etching solution, as in FIG. 17(f).

Step 4-d: in this second copper etching step, after the first different kind of metal etching step was finished, as shown in FIG. 18(g), the etching resist layers 10 were again formed only on area which is to be the first circuit and on the circuit formed by etching the copper foil layer, and etching is performed with a copper selective etching solution (ammonia base alkaline copper etching solution) to etch away area of the first copper layer where no etching resist layer is present, and then etching resist releasing is performed to form the first circuit 8 and the second circuit 9 still having the different kind of metal layer 4, as shown in FIG. 18(h).

Step 4-e: in this second different kind of metal etching step, only the different kind of metal layer 4 on the surface of the second circuit 9 was removed with a different kind of metal selective etching solution (nickel remover manufactured by MEC Co., Ltd.) to form the shape of the second circuit 9, so that the printed wiring board 1e was obtained as shown in FIG. 18(i). In this case, both the first circuit 8 the and second circuit 9 project from the insulating layer surface and the thickness of the first circuit 8 is 381 μm and the thickness of the second circuit 9 is 80 μm. In the printed wiring board in which the circuits project with these thicknesses from the substrate surface, the first circuit 8 can be used as a power supply circuit or the like, so that heat accumulation in the insulating layer of the substrate can be prevented and heat can be efficiently spreaded to the surrounding atmosphere, even if heat generation is great.

Example 9

In this example, a case will be described in which a clad composite material 2 is a start material and a double-sided printed wiring board 1f shown in FIG. 21(h) is manufactured. In this double-sided printed wiring board 1f, a first circuit and a second circuit having different thicknesses coexist only in a same reference plane on one surface side of the printed wiring board, and one of the first circuit and the second circuit is buried in an insulating layer. Each step will be separately described below and FIG. 19 to FIG. 21 are referred to in the description.

Step 5-a: this clad composite material etching step is a step of manufacturing a clad composite material with circuit pattern 11 shown in FIG. 19(b) by the process shown in FIG. 8, in which a clad composite material 2 (a first copper layer (300 μm)/a different kind of metal layer (1 μm nickel layer)/a second copper layer (80 μm)) shown in FIG. 19(a) is a start material. Therefore, this step is the same as step 2-a in example 3.

Step 5-b: in this laminating step, the clad composite material with circuit pattern 11 and a copper foil 12 were used and laminated to both surfaces of a base material 6 as shown in FIG. 19(c). Then, they were placed onto both surfaces of the base material 6 (a FR-4 grade glass-epoxy pre-preg having the thickness of 210 μm) constituting an insulating layer and bonded to respective one surface side by hot pressing with the order of 180° C.' 60 minutes, to form a double-sided metal-clad laminate 7' shown in FIG. 20(d).

Then, as shown in FIG. 20(e), in order to assure electrical connection between the clad composite material with circuit pattern 11 and the copper foil 12 which are conductor layers on both surfaces of the double-sided metal-clad laminate 7', a pierced hole having diameter of 200 μm was formed, and then desmear treatment, catalyzing with palladium catalyst, electroless copper plating, and electro-copper plating were sequentially performed to form plating layers 23, so that a through hole 22 was formed. This forming method is the same as described above and the description is not repeated here.

Step 5-c: further, in the first copper etching step, etching resist layers 10 are formed with dry films on the first copper layer of the clad composite material located on one surface side of the insulating layer and on the copper foil layer on the other surface side, and circuit pattern for etching was exposed and developed as shown in FIG. 20(f) to etch the first copper layer and copper foil located on the outer layers into desired circuit patterns with a copper selective etching solution (ferric chloride copper etching solution), and then etching resist releasing was performed to expose the different kind of metal layer as shown in FIG. 21(g).

Step 5-d: in this first different kind of metal etching step, after the first copper etching step was finished, the different kind of metal layer 4 exposed between the temporary circuits 21 formed on the outer layer was etched away with a different kind of metal selective etching solution (nickel remover manufactured by MEC Co., Ltd.) to form the first circuit 8, the second circuit 9, and the copper foil circuit 13 as shown in FIG. 21(h), so that the printed wiring board if is obtained. In this case, the second circuit 9 is buried in the insulating layer and a part of the first circuit 8 projects from the insulating layer surface, and the thickness of the first circuit is 381 μm and the thickness of the second circuit is 80 μm. In the printed wiring board in which the circuits project with these thicknesses from the substrate surface, the first circuit can be used as a power supply circuit or the like, so that heat accumulation in the insulating layer of the substrate can be prevented and heat can be efficiently spreaded to the surrounding atmosphere, even if heat generation is great.

Example 10

In this example, a multilayer printed wiring board was manufactured which comprises a circuit layer in which a first circuit and a second circuit having different thicknesses coexist in a same reference plane of an insulating layer located on a surface of an inner layer core material comprising an inner layer circuit. FIG. 22 to FIG. 25 are referred to in the description.

Step 6-a: in this laminating step, as shown in FIG. 22(a), clad composite materials 2 (a first copper layer (300 μm)/a different kind of metal layer (1 μm nickel layer)/a second copper layer (80 μm)) were laminated on surfaces of an inner layer core material 14 via a base material 6 (a FR-4 grade glass-epoxy pre-preg having the thickness of 210 μm) constituting an insulating layer, and hot pressing was performed to form a multilayer metal-clad laminate 7" shown in FIG. 22(b). The inner layer core material 14 used here was a FR-4 grade rigid substrate having the thickness of 150 μm which comprises inner layer circuits 15 and has via holes having diameter of 100 μm.

Then, as shown in FIG. 22(b), in order to assure electrical connection between the clad composite materials 2 and the inner layer circuits 15 which are conductor layers on both surfaces, via holes 22 having diameter of 100 μm were formed and plating treatment was performed in the holes to assure electrical connection between the layers, as shown in FIG. 23(c). This forming method is the same as described above and the description is not repeated here.

Step 6-b: in this first copper etching step, as shown in FIG. 23(d), etching resist layers 10 was formed with dry films on the first copper layers 3 located on the outer layers of the multilayer metal-clad laminate 7", and circuit pattern for etching was exposed and developed to etch the first copper layers located on the outer layers into desired circuit patterns (temporary circuits 21) with a copper selective etching solution (ammonia base alkaline copper etching solution), and then etching resist releasing was performed to form the temporary circuits 21 and expose the different kind of metal layers 4 in area where unnecessary first copper layer is removed, as shown in FIG. 23(e).

Step 6-c: in this first different kind of metal etching step, after the first copper etching step was finished, the different kind of metal layers 4 exposed between the temporary circuits 21 formed on the outer layers were etched away with a different kind of metal selective etching solution (nickel remover manufactured by MEC Co., Ltd.), as in FIG. 24(f).

Step 6-d: in this second copper etching step, after the first different kind of metal etching step was finished, as shown in FIG. 24(g), the etching resist layers 10 were again formed with liquid resists only on area which is to be the first circuit, and etching was performed with a copper selective etching solution to etch away area of the first copper layers where no etching resist layer 10 is present, and then etching resist releasing was performed to form the first circuits 8 and the second circuit still having the different kind of metal layer 4, as shown in FIG. 24(h).

Step 6-e: in this second different kind of metal etching step, only the different kind of metal layer 4 on the surface of the second circuit was removed with a different kind of metal selective etching solution (nickel remover manufactured by MEC Co., Ltd.) to form the pattern of the second circuit 9, so that the multilayer printed wiring board 1g was obtained as shown in FIG. 25(i). In this case, both the first circuits 8 and the second circuit 9 project from the insulating layer surface, and the thickness of the first circuit 8 is 381 μm, and the thickness of the second circuit 9 is 80 μm. In the printed wiring board in which the circuits project with these thicknesses from the substrate surface, the first circuits 8 can be used as circuits for power supply or the like, so that heat accumulation in the insulating layer of the substrate can be prevented and heat can be efficiently spreaded to the surrounding atmosphere, even if heat generation is great.

Example 11

In this example, a multilayer printed wiring board was manufactured in which a first circuit and a second circuit having different thicknesses coexist in a same reference plane of an insulating layer located on a surface of an inner layer core material comprising an inner layer circuit, and one circuit is buried in the insulating layer. Each step will be separately described below and FIG. 26 to FIG. 28 are referred to in the description.

Step 7-a: this clad composite material etching step is a step of manufacturing a clad composite material with circuit pattern 11 shown in FIG. 8(c) by the process shown in FIG. 8, in which a clad composite material 2 (a first copper layer (300 μm)/a different kind of metal layer (1 μm nickel layer)/a second copper layer (80 μm)) shown in FIG. 8(a) is a start material. Therefore, this step is the same as step 2-a in example 3.

Step 7-b: in this laminating step, as shown in FIG. 26(a), the etched circuit pattern surfaces of the clad composite material with circuit patterns 11 were placed onto base material surfaces and laminated on surfaces of the inner layer core material 14 via base materials (FR-4 grade glass-epoxy pre-pregs having the thickness of 210 μm) constituting insulating layers 6, as in FIG. 26(a). Then, hot pressing was performed to form a multilayer metal-clad laminate 7" in which temporary circuits 21 on the etched circuit pattern surfaces of the clad composite material with circuit patterns 11 were buried in the insulating layers 6, as shown in FIG. 26(b). The inner layer core material 14 used here was a FR-4 grade rigid substrate having the thickness of 150 μm which comprises inner layer circuits 15 and has via holes having diameter of 100 μm.

Then, in order to assure electrical connection between the clad composite material with circuit patterns 11 and the inner layer circuits 15 which are conductor layers on both surfaces, via holes 22 having diameter of 100 μm were formed and plating treatment was performed in the holes to assure electrical connection between the layers, as shown in FIG. 27(c). This forming method is the same as described above and the description is not repeated here.

Step 7-c: in this first copper etching step, as shown in FIG. 27(d), etching resist layers 10 were formed with dry films on the first copper layers 3 located on the outer layers of the multilayer metal-clad laminate 7", and circuit pattern for etching was exposed and developed to etch the first copper layers located on the outer layers into desired circuit patterns with a copper selective etching solution, and then etching resist releasing was performed to expose the temporary circuits 21 and the different kind of metal layer 4 in parts where unnecessary first copper layers are removed, as shown in FIG. 28(e).

Step 7-d: in this first different kind of metal etching step, after the first copper etching step was finished, the different kind of metal layers 4 exposed between the temporary circuits 21 formed on the outer layers were etched away with a different kind of metal selective etching solution (nickel remover manufactured by MEC Co., Ltd.) to simultaneously finish the first circuits 8 and the second circuits 9, so that the multilayer printed wiring board 1h as in FIG. 28(f) was obtained. In this case, the second circuits 9 are buried in the insulating layer and parts of the first circuits 8 project from the insulating layer surfaces, and the thickness of the first circuit is 381 µm and the thickness of the second circuit is 80 µm. In the printed wiring board in which the circuits project with these thicknesses from the substrate surface, the first circuits can be used as circuits for power supply or the like, so that heat accumulation in the insulating layer of the substrate can be prevented and heat can be efficiently spreaded to the surrounding atmosphere, even if heat generation is great.

INDUSTRIAL APPLICABILITY

In a printed wiring board according to the present invention, height of some circuits among circuits in a same reference plane can be adjusted and circuit cross-sectional area can be extremely large. Therefore, when the circuit is used as a power supply circuit or the like, the thickness of the conductor for the circuit can be increased for this purpose, instead of increasing circuit width, so that substantial reduction in board area can be achieved. Further, by forming circuits having different circuit thicknesses in the same reference plane, a printed wiring board is obtained in which circuits having different electrical characteristics and applications are formed on the same reference plane. Further, the projecting circuit parts of the printed wiring board can be perform function in the same manner as heat sinks, so as to utilize them as circuits for heat spreader or heat sinks. Therefore, the printed wiring board according to the present invention is small size and superior in heat resistance, and it may assist miniaturizing of the printed wiring board constituting a device equipment. Further, for the purpose of weight reduction, lightweight metal such as aluminum can be used for the above described different kind of metal layer to achieve weight reduction of the printed wiring board, which may assist weight reduction of a device equipment constituted with printed wiring board.

Further, a method for manufacturing the printed wiring board according to the present invention uses a clad composite material including a different kind of metal layer which can be selectively etched against to copper as a different kind of metal layer between two copper layers, so that conventional lamination techniques of the printed wiring board and etching methods and apparatuses can be used and no additional investment on the facility is required. Thus, the manufacturing method is convenient, has high productivity, and allows stable supply of the printed wiring board according to the present invention to the market.

The invention claimed is:

1. A printed wiring board obtained by etching a metal-clad laminate including a conductive layer and an insulating layer, which is characterized in that
a first circuit and a second circuit having different thicknesses formed in a same reference plane coexist and the thicker circuit of the first circuit or the second circuit has a clad-like configuration in which three layers of a first copper layer/a different kind of metal layer/a second copper layer are sequentially stacked and nickel, tin, aluminum, titanium, or an alloy of at least one of nickel, tin, aluminum, or titanium is used for the different kind of metal layer.

2. The printed wiring board according to claim 1, wherein one circuit of the first circuit or the second circuit is disposed from a printed wiring board surface and the other circuit is buried in a surface of the printed wiring board.

3. The printed wiring board according to claim 1, wherein assuming that the thickness of a thicker circuit of the first circuit or the second circuit is $T_1$ mm, thickness $T_2$ of the other circuit is $T_1/100$ to $T_1$ (mm).

4. The printed wiring board according to claim 1, which is characterized in that the thicker circuit of the first circuit or the second circuit is a clad composite material in which three layers of a first copper layer/a different kind of metal layer/a second copper layer are sequentially stacked and aluminum or aluminum alloy having the thickness of 50% to 80% of the total thickness of the clad composite material is used for the different kind of metal layer.

5. The printed wiring board according to claim 1, wherein the bottom of the thicker circuit of the first circuit or the second circuit is buried in the insulating layer and top surfaces of the first circuit and the second circuit are coplanar.

6. The printed wiring board according to claim 1, wherein the bottoms of the first circuit and the second circuit are buried in the insulating layer and the top surface of the thinner circuit of the first circuit or the second circuit is coplanar with a surface of the insulating layer.

7. The printed wiring board according to claim 6, wherein the bottoms of the first circuit and the second circuit are coplanar.

8. The printed wiring board according to claim 1, wherein the bottoms of the first circuit and the second circuit are buried in the insulating layer and the top surface of the thinner circuit of the first circuit or the second circuit is not coplanar with a surface of the insulating layer.

9. The printed wiring board according to claim 8, wherein a distance from the top surface of the thinner circuit to the surface of the insulating layer is equal to the thickness of the different kind of metal layer.

10. The printed wiring board according to claim 9, wherein the bottoms of the first circuit and the second circuit are coplanar.

* * * * *